(12) United States Patent
Wang et al.

(10) Patent No.: US 11,877,044 B2
(45) Date of Patent: Jan. 16, 2024

(54) INTEGRAL PACKAGING PROCESS-BASED CAMERA MODULE, INTEGRAL BASE COMPONENT OF SAME, AND MANUFACTURING METHOD THEREOF

(71) Applicant: NINGBO SUNNY OPOTECH CO., LTD., Zhejiang (CN)

(72) Inventors: Mingzhu Wang, Ningbo (CN); Bojie Zhao, Ningbo (CN); Takehiko Tanaka, Ningbo (CN); Nan Guo, Ningbo (CN); Zhenyu Chen, Ningbo (CN); Zhen Huang, Ningbo (CN); Feifan Chen, Ningbo (CN); Liang Ding, Zhejiang (CN)

(73) Assignee: NINGBO SUNNY OPOTECH CO., LTD., Zhejiang (CN)

( * ) Notice: Subject to any disclaimer, the term of this patent is extended or adjusted under 35 U.S.C. 154(b) by 682 days.

(21) Appl. No.: 15/999,858

(22) PCT Filed: Jul. 28, 2016

(86) PCT No.: PCT/CN2016/092020
§ 371 (c)(1),
(2) Date: Aug. 5, 2021

(87) PCT Pub. No.: WO2017/140092
PCT Pub. Date: Aug. 24, 2017

(65) Prior Publication Data
US 2021/0392251 A1 Dec. 16, 2021

(30) Foreign Application Priority Data

Feb. 18, 2016 (CN) .......................... 201610091489.7
Apr. 1, 2016 (CN) .......................... 201610202500.2
(Continued)

(51) Int. Cl.
*H04N 23/57* (2023.01)
*H04N 23/55* (2023.01)
(Continued)

(52) U.S. Cl.
CPC ............. *H04N 23/57* (2023.01); *H04N 23/55* (2023.01); *G06F 1/1686* (2013.01); *H04N 23/67* (2023.01)

(58) Field of Classification Search
CPC ................. G03B 17/12; G06F 1/1686; H01L 2224/48091; H01L 23/31;
(Continued)

(56) References Cited

U.S. PATENT DOCUMENTS

2002/0006687 A1 1/2002 Lam
2002/0008315 A1 1/2002 Park
(Continued)

FOREIGN PATENT DOCUMENTS

CN 1929103 3/2007
CN 1980325 6/2007
(Continued)

OTHER PUBLICATIONS

International Search Report dated Nov. 9, 2016 in International (PCT) Application No. PCT/CN2016/092020.

*Primary Examiner* — Amy R Hsu
(74) *Attorney, Agent, or Firm* — Wenderoth, Lind & Ponack, L.L.P.

(57) ABSTRACT

A camera module, an integral base component of same, and a manufacturing method therefor are provided. The camera module includes at least one lens, at least one photosensitive chip, at least one filter, and at least one integral base component. The integral base component includes a base part and a circuit board part. The base part is integrally packaged in the circuit board part. The photosensitive chip
(Continued)

is mounted on the circuit board part. The base part forms at least one through hole so as to provide the photosensitive chip with a light path. The lens is arranged on the light path of the photosensitive chip.

18 Claims, 59 Drawing Sheets

(30) Foreign Application Priority Data

| Apr. 1, 2016 | (CN) | 201620269534.9 |
|---|---|---|
| Apr. 21, 2016 | (CN) | 201610250836.6 |
| Apr. 21, 2016 | (CN) | 201620336842.9 |
| May 11, 2016 | (CN) | 201610311232.8 |
| May 11, 2016 | (CN) | 201620422525.9 |

(51) Int. Cl.
  *G06F 1/16* (2006.01)
  *H04N 23/67* (2023.01)

(58) Field of Classification Search
  CPC .......... H01L 2924/00014; H04N 23/52; H04N 23/54; H04N 23/55; H04N 23/57; H04N 23/67
  See application file for complete search history.

(56) References Cited

U.S. PATENT DOCUMENTS

| 2002/0056560 | A1* | 5/2002 | Liu | G02B 26/0841 |
| | | | | 174/50.5 |
| 2002/0119658 | A1 | 8/2002 | Honda et al. | |
| 2004/0056334 | A1* | 3/2004 | Longden | H01L 23/552 |
| | | | | 257/E23.114 |
| 2004/0069998 | A1 | 4/2004 | Harazono | |
| 2005/0035421 | A1* | 2/2005 | Kayanuma | H04N 23/57 |
| | | | | 257/E31.127 |
| 2007/0040932 | A1 | 2/2007 | Chen | |
| 2007/0057148 | A1* | 3/2007 | Webster | H01L 27/14685 |
| | | | | 250/208.1 |
| 2007/0126081 | A1 | 6/2007 | Webster et al. | |
| 2007/0160369 | A1* | 7/2007 | Jane | G03B 17/28 |
| | | | | 396/529 |
| 2007/0278394 | A1 | 12/2007 | Shangguan et al. | |
| 2008/0265134 | A1 | 10/2008 | Kinoshita | |
| 2008/0291316 | A1 | 11/2008 | Cheng | |
| 2010/0321555 | A1 | 12/2010 | Takeshita et al. | |
| 2011/0024861 | A1 | 2/2011 | Tu et al. | |
| 2012/0229701 | A1 | 9/2012 | Pavithran et al. | |
| 2013/0038783 | A1 | 2/2013 | Shimizu et al. | |
| 2014/0071327 | A1 | 3/2014 | Brodie et al. | |
| 2015/0077840 | A1* | 3/2015 | Kim | H02K 41/031 |
| | | | | 359/355 |
| 2015/0138424 | A1* | 5/2015 | Dobashi | H04N 25/00 |
| | | | | 348/340 |
| 2015/0195437 | A1 | 7/2015 | Barringer | |
| 2016/0006908 | A1 | 1/2016 | Pan et al. | |
| 2016/0173744 | A1 | 6/2016 | Kim | |
| 2016/0190411 | A1 | 6/2016 | Oh et al. | |
| 2016/0191767 | A1* | 6/2016 | Otani | H04N 23/54 |
| | | | | 29/832 |
| 2017/0244872 | A1 | 8/2017 | Wang et al. | |

FOREIGN PATENT DOCUMENTS

| CN | 101312182 | 11/2008 |
|---|---|---|
| CN | 101989555 | 3/2011 |
| CN | 102782574 | 11/2012 |
| CN | 103246038 | 8/2013 |
| CN | 103700634 | 4/2014 |
| CN | 103903991 | 7/2014 |
| CN | 203722701 | 7/2014 |
| CN | 104811589 | 7/2015 |
| CN | 105324710 | 2/2016 |
| CN | 105611134 | 5/2016 |
| CN | 105704354 | 6/2016 |
| CN | 105721754 | 6/2016 |
| CN | 105744130 | 7/2016 |
| CN | 105898120 | 8/2016 |
| CN | 205792878 | 12/2016 |
| EP | 1 699 082 | 9/2006 |
| EP | 2 124 432 | 11/2009 |
| EP | 2 863 248 | 4/2015 |
| JP | 3-83456 | 4/1991 |
| JP | 3-155671 | 7/1991 |
| JP | 11-354769 | 12/1999 |
| JP | 2002-118207 | 4/2002 |
| JP | 2003-189195 | 7/2003 |
| JP | 2006-148473 | 6/2006 |
| JP | 2006-245246 | 9/2006 |
| JP | 2007-523568 | 8/2007 |
| JP | 2007-336591 | 12/2007 |
| JP | 2008-275939 | 11/2008 |
| JP | 2010-16744 | 1/2010 |
| JP | 2010-219696 | 9/2010 |
| JP | 2011-35458 | 2/2011 |
| JP | 2012-199844 | 10/2012 |
| JP | 2013-38628 | 2/2013 |
| JP | 2014-2256 | 1/2014 |
| JP | 2015-99262 | 5/2015 |
| KR | 10-0815325 | 3/2008 |
| WO | 2005/081853 | 9/2005 |
| WO | 2008/102575 | 8/2008 |
| WO | 2011/084900 | 7/2011 |
| WO | 2015/023099 | 2/2015 |
| WO | 2015/025742 | 2/2015 |

* cited by examiner

INTEGRAL PACKAGING PROCESS-BASED CAMERA MODULE, INTEGRAL BASE COMPONENT OF SAME, AND MANUFACTURING METHOD THEREOF

BACKGROUND OF THE PRESENT INVENTION

Field of Invention

The present invention relates to the field of camera module, and more particularly, to an integral packaging process based camera module, integral base component of same, and manufacturing method therefor.

Description of Related Arts

Chip on Board (COB) technique is a very important technological process in camera module assembling and manufacturing processes. Structure of camera module based on conventional COB technical process is composed of parts including circuit board, photosensitive chip, lens holder, motor drive, and lens.

Referring to FIG. 1, it is a perspective view of a camera module manufactured with conventional COB technical process. The camera module includes a circuit board 1P, a photosensitive chip 2P, a frame 3P, a filter 4P, a motor 5P, and a lens 6P. The photosensitive chip 2P is mounted on the circuit board 1P. The filter 4P is mounted on the frame 3P. The lens 6P is mounted on the motor 5P. The motor 5P is mounted on the frame 3P. Therefore, the lens 6P is mounted above the photosensitive chip 2P.

It is worth mentioning that there are usually various circuit components 11P, such as resistors and capacitors, provided in the circuit board 1P. These circuit components 11P are protruded on the surface of the circuit board 1P, while the frame 3P also has to be mounted on the surface of the circuit board 1P with these circuit components 11P protruded thereon. Therefore, in the conventional COB technology, there are disadvantages in assembling and cooperating work among the circuit board 1P, the circuit components 11P, and the frame 3P, that also, to a certain extent, restricts the development of camera module from being lighter and thinner.

Specifically, first of all, the circuit components 11P are directly exposed on the surface of the circuit board 1P, so they can avoid influences from the subsequent assembling process, such as the processes of affixing the frame 3P and soldering the motor 5P. Solder resist in the soldering, dusts, and so on can easily adhere on the circuit components 11P. Besides, the circuit components 11P and the photosensitive chip 2P are in a mutually connected space, so the dusts and pollutants can easily affect the photosensitive chip 2P. Such influence may cause the assembled camera module to have undesirable appearances, like dark spot, and decrease the product yield rate.

Next, the frame 3P is at the outside of the circuit components 11P, so when installing the lens holder and the circuit board 1P, it is necessary to reserve a certain a safe distance between the frame 3P and the circuit component 11P and the a safe distance has to be reserve in both horizontal direction and upward direction, which increase the requirement for the thickness of the camera module to a certain extent.

Thirdly, in the COB assembling process, the frame 3P is affixed on the circuit board 1P with pasting material, like glue. When affixing, normally an AA (Active Arrangement) technique has to be applied, which is to adjust the central axis lines of the frame 3P, the circuit board 1P, and the motor 5P, so as to make then consist in both horizontal direction and perpendicular direction. Therefore, in order to satisfy the AA technique, more glue has to be preset in between the frame 3P and the circuit board 1P and between the lens holder and the motor 5P, so as to reserve adjustment room among them. However, this requirement not only further increases the thickness demand of the camera module to a certain extent and make the thickness thereof hard to be reduced, but also causes tilt discrepancy of the assembling very easily during the multiple processes of affixing and assembling. Moreover, it also requires higher evenness of the lens holder 3P, the circuit board 1P, and the motor 5P.

In addition, in conventional COB technology, the circuit board 1P provides the most fundamental securing and supporting vehicle, so there is a certain requirement of the structural strength of the circuit board 1P itself. Such requirement makes the circuit board 1P to have a larger thickness, which reserves and increases the thickness demand of the camera module from another aspect.

Along with the development of various electronic products and smart devices, camera modules further and further evolve toward high performance, lighter, and thinner. However, when facing all kinds of the developing demand in high performance aspect, including higher resolution and higher image quality, electronic components in the circuit become more and more, size of the chip becomes bigger and bigger, and passive components like driving resistors and capacitors relatively increase, which makes the scale of the electronic device become larger and larger, makes the assembling difficulty continually increase, and makes the overall size of the camera module become bigger and bigger. To sum up, conventional assembling method of the lens holder, circuit board, and circuit elements is also a huge limitation to a certain extent for the development of reducing the size and weight of the camera module.

SUMMARY OF THE PRESENT INVENTION

An object of the present invention is to provide a molding process based camera module and molded circuit unit and manufacturing method thereof, wherein the circuit unit includes a molding portion and a circuit board part, wherein the molding portion is moldingly formed on the circuit board part.

An object of the present invention is to provide a molding process based camera module and molded circuit unit and manufacturing method thereof, wherein the molding circuit unit includes at least a circuit element, wherein the circuit element is wrapped up in the circuit unit without direct exposure to the external environment.

An object of the present invention is to provide a molding process based camera module and molded circuit unit and manufacturing method thereof, wherein the circuit element is integrally wrapped up in the molded circuit unit through molding.

An object of the present invention is to provide a molding process based camera module and molded circuit unit and manufacturing method thereof, wherein the molding circuit unit includes a molding portion and a circuit board part, wherein the molding portion is molded on the circuit board part and moldingly wraps up the circuit element installed on the circuit board part.

An object of the present invention is to provide a molding process based camera module and molded circuit unit and manufacturing method thereof, wherein the circuit board part includes a main circuit board and a photosensitive chip, wherein the photosensitive chip is set on the inner surface of the circuit board, wherein the molding portion surrounds the outer side of the photosensitive chip.

An object of the present invention is to provide a molding process based camera module and molded circuit unit and manufacturing method thereof, wherein the main circuit board has an inner ring groove, wherein the photosensitive chip is set in the inner ring groove, so as to lower the required height of the molding portion.

An object of the present invention is to provide a molding process based camera module and molded circuit unit and manufacturing method thereof, wherein the main circuit board has a chip channel that is adaptable for the photosensitive chip to be installed from the back of the main circuit board with the photosensitive area of the photosensitive chip facing toward the front, which provides an easier installation method by invert installing the photosensitive chip.

An object of the present invention is to provide a molding process based camera module and molded circuit unit and manufacturing method thereof, wherein a filter is installed on the inner opening of the chip channel of the main circuit board, so provide extra site for installing the filter is not required.

An object of the present invention is to provide a molding process based camera module and molded circuit unit and manufacturing method thereof, wherein the main circuit board has at least a reinforcing hold, wherein the molding portion is extended into the reinforcing hold, so as to enhance the cohesion between the molding portion and the circuit board part as well as to increase the structural strength of the main circuit board with the molding portion.

An object of the present invention is to provide a molding process based camera module and molded circuit unit and manufacturing method thereof, wherein the molding portion includes a susceptor that is adaptable for supporting the filter, so as to provide installation site for the filter.

An object of the present invention is to provide a molding process based camera module and molded circuit unit and manufacturing method thereof, wherein one of the molding portion is adaptable to have a motor unit or a lens installed thereon, which can be a conventional frame to provide supported fixed position for the motor unit or the lens.

An object of the present invention is to provide a molding process based camera module and molded circuit unit and manufacturing method thereof, wherein the molding portion substitutes conventional frame, so the affixing and assembling process for the frame and circuit board is not required when assembling, which increases the accuracy of the technique.

An object of the present invention is to provide a molding process based camera module and molded circuit unit and manufacturing method thereof, wherein the camera module is assembled of the molded circuit unit, so camera module with better performance and smaller thickness can be achieved.

An object of the present invention is to provide a molding process based camera module and molded circuit unit and manufacturing method thereof, wherein the camera module is assembled and manufactured by molding, so as to change the COB technology for conventional camera module.

An object of the present invention is to provide a molding process based camera module and molded circuit unit and manufacturing method thereof, wherein the camera module includes a support, mounted on the molding portion, wherein the filter is mounted on the support.

An object of the present invention is to provide a molding process based camera module and molded circuit unit and manufacturing method thereof, wherein the lens comprises a lens cone, wherein the filter is installed on the lens cone, such that it does not require extra part for installing the filter.

An object of the present invention is to provide a molding process based camera module and molded circuit unit and manufacturing method thereof, wherein the filter is mounted on the upper end of the chip passage, so as decrease the back focal length for the camera module.

An object of the present invention is to provide a molding process based camera module and molded circuit unit and manufacturing method thereof, wherein the molding portion can achieve the structural strength requirement with thinner thickness, which allow the longitudinal size of the camera module to be reduced.

An object of the present invention is to provide a molding process based camera module and molded circuit unit and manufacturing method thereof, wherein a plurality of the camera modules are integrally packaged on a complete plate alignment at the same time when manufacturing, so as to achieve the plate alignment process of the camera module and to enhance the production efficiency thereof.

An object of the present invention is to provide a molding process based camera module and molded circuit unit and manufacturing method thereof, wherein the main circuit board includes a reinforced layer, overlappingly arranged on the bottom of the main circuit board, so as to strengthen the structural strength and heat dispersion of the main circuit board.

An object of the present invention is to provide a molding process based camera module and molded circuit unit and manufacturing method thereof, wherein the molding portion includes a lens mounting section that is adaptable for mounting a lens of the camera module, so as to provide a stable installation site for the lens.

An object of the present invention is to provide a molding process based camera module and molded circuit unit and manufacturing method thereof, wherein the molding portion molds the side and bottom surface of the main circuit board, so as to strengthen the structural strength of the camera module.

An object of the present invention is to provide a molding process based camera module and a molded circuit unit thereof.

The present invention, in one aspect, provides a camera module, comprising:
    at least a lens;
    at least a photosensitive chip;
    at least a filter;
    at least an integral base component; and
    at least a support;
    wherein the integral base component comprises a base part and a circuit board part, wherein the base part is integrally packaged in the circuit board part, wherein the photosensitive chip is mounted on the circuit board part, wherein the base part has at least a through hole formed thereon to provide a light path for the photosensitive chip, wherein the lens is arranged along the light path of the photosensitive chip, wherein the support is mounted on the base part, wherein the filter is mounted on the support and along the light path of the photosensitive chip.

According to an embodiment, the support has a first support groove arranged on the top side thereof, wherein the first support groove is communicated with the through hole, wherein the filter is mounted on the first support groove.

According to an embodiment, the support has a second support groove arranged on the bottom side thereof, for coupling with the top of the base part.

According to an embodiment, the base part has a mounting groove arranged thereon, wherein the mounting groove is communicated with the through hole, wherein the support is mounted on the mounting groove.

According to an embodiment, the base part has a mounting groove arranged thereon, wherein the mounting groove is communicated with the through hole.

According to an embodiment, the base part forms a platform, wherein the support is mounted on the platform.

According to an embodiment, the mounting groove has at least a gap, communicated with the through hole and the outside, wherein the support comprises at least an extending rim, adapted for lapping on the gap.

According to an embodiment, the mounting groove has at least a gap, forming a U-shape structure, wherein the support comprises at least an extending rim, filling the opening of the U-shape structure.

According to an embodiment, the integral base component comprises at least a circuit element, wrapped and covered by the base part.

According to an embodiment, the lens is, at least partially, mounted on the support.

According to an embodiment, the camera module includes at least a motor, wherein the lens is installed on the motor, wherein the motor is, at least partially, installed on the support.

According to an embodiment, the lens is mounted on the base part.

According to an embodiment, the camera module includes at least a motor, wherein the lens is installed on the motor, wherein the motor is installed on the base part or the support.

According to an embodiment, the method of integrally packaging is the method of moldingly integrally packaging.

According to an embodiment, the integral base component comprises a ring-shaped barrier component, arranged on the circuit board part, wherein the barrier component is, at least partially, integrally packaged by the base part.

According to an embodiment, the base part has at least a first inner side integrally extended from the circuit board part to surroundingly form at least part of the through hole, wherein the first inner side extends upward in an inclining manner.

According to an embodiment, the first inner side and the optic axis of the camera module comprises a inclination α therebetween, wherein the range of the inclination α is 3°~85°.

According to an embodiment, the first inner side surroundingly forms the lower end of the through hole, wherein the inside diameter of the lower end of the through hole is increasing bottom-up gradually.

According to an embodiment, the base part has a second inner side provided thereon foldingly extended from the first inner side, wherein the second inner side surroundingly forms the upper end of the through hole, wherein the second inner side extends upward in an inclining manner.

According to an embodiment, the second inner side and the optic axis of the camera module comprises a inclination β therebetween, wherein the range of the inclination β is 3°~45°.

According to an embodiment, the base part has an outer side, formed by aslope upward integrally extending the circuit board part, wherein the outer side and the optic axis of the camera module comprises an inclination γ therebetween, wherein the range of the inclination γ is 3°~45°.

According to another aspect of the present invention, the present invention provides a camera module, comprising:
at least a lens;
at least a photosensitive chip; and
at least an integral base component;
wherein the integral base component comprises a base part and a circuit board part, wherein the base part is integrally connected with the circuit board part, wherein the photosensitive chip is mounted on the circuit board part, wherein the base part has at least a through hole formed thereon to provide a light path for the photosensitive chip, wherein the lens is arranged along the light path of the photosensitive chip, wherein the base part has at least a first inner side, surroundingly forming at least part of the through hole, wherein the first inner side extends upwardly in an inclining manner.

According to another aspect of the present invention, the present invention provides a camera module, comprising:
at least a lens;
at least a photosensitive chip; and
at least an integral base component;
wherein the integral base component comprises a base part and a circuit board part, wherein the base part is molded on the circuit board part, wherein the base comprises at least a through hole formed thereon, for providing a light path for the photosensitive chip and the lens.

According to an embodiment, the base part has a flat extended top surface.

According to an embodiment, the base part has a mounting groove arranged thereon, wherein the mounting groove is communicated with the through hole, wherein the base part comprises at least a protruding step, forming the mounting groove.

According to an embodiment, the circuit board part comprises at least a side, wherein the base part wraps and covers the at least one the side of the circuit board part.

According to an embodiment, the base part further wraps and covers the bottom of the circuit board part.

According to an embodiment, the base part has two mounting groove arranged thereon along the direction of the optic axes of the camera module, wherein each of the mounting grooves is communicated with the through hole, so as to form a step structure inside of the base part.

According to an embodiment, the camera module further comprises at least a filter, arranged on the top surface, such that the filter is evenly mounted.

According to an embodiment, the lens is mounted on the top surface.

According to an embodiment, the camera module includes at least a motor, wherein the lens is installed on the motor, wherein the motor is installed on the top surface of the base part.

According to an embodiment, the camera module further comprises at least a filter, arranged in the mounting groove.

According to an embodiment, the lens is mounted on the protruding step.

According to an embodiment, the camera module includes at least a motor, wherein the lens is installed on the motor, wherein the motor is installed on the protruding step.

According to an embodiment, the camera module further comprises a filter, arranged in the mounting groove that is lower.

According to an embodiment, the lens is mounted on the higher mounting groove.

According to an embodiment, the base part further comprises a lens inner wall formed thereon through integrally extending upward from the mounting groove of the higher position.

According to an embodiment, the surface of the lens inner wall is smooth and adapted for mounting a threadless lens.

According to an embodiment, the camera module further comprises at least a lens frame, mounted on the base part, wherein the lens frame is adapted for mounting the lens.

According to an embodiment, the camera module further comprises at least a support and at least a filter, wherein the support is i mounted on the mounting groove, wherein the filter is mounted on the support.

According to an embodiment, the circuit board part has a inner groove arranged thereon, communicating to the through hole, wherein the photosensitive chip is accommodated in the inner groove.

According to an embodiment, the lens comprises a lens cone and at least an optic, mounted in the lens cone, wherein the filter is mounted in the lens cone below the optic.

According to an embodiment, the camera module further comprises at least a motor and at least a filter, mounted in the motor, wherein the lens is mounted in the motor above the filter.

According to an embodiment, the integral base component comprises at least a circuit element, wrapped and covered by the base part.

According to an embodiment, the circuit element is selected from the group consisting of: resistor, capacitor, diode, triode, potentiometer, electric relay, driver, processor, and memory.

According to an embodiment, the circuit board part has at least a passage, communicating the two sides of the circuit board part, wherein the photosensitive chip is mounted on the passage.

According to an embodiment, the circuit board part has a reinforcing hold, wherein the base part extends into the reinforcing hold.

According to an embodiment, the circuit board part comprises a reinforced layer, overlappingly arranged on the bottom of the circuit board part.

According to an embodiment, the circuit board part comprises a shielding layer, wrapping and covering on the outside of the camera module.

According to an embodiment, the circuit board part comprises a shielding layer, surroundingly provided on the inner side of the base part.

According to an embodiment, the circuit board part comprises a main circuit board, wherein the material of the main circuit board is selected from the group consisting of rigid-flex board, ceramic substrate, and rigid PCB.

According to an embodiment, material of the base part is selected from the group consisting of: nylon, LCP, PP, and resin.

According to an embodiment, the molding technique to the molding portion is insert molding or mold pressing.

According to an embodiment, the photosensitive chip is electrically connected with the circuit board part through at least a connecting wire.

According to another aspect of the present invention, the present invention provides a camera module, comprising:
at least a lens;
at least a photosensitive chip;
at least an integral base component; and
at least a motor;
wherein the integral base component comprises a base part and a circuit board part, wherein the base part is integrally packaged in the circuit board part, wherein the photosensitive chip is mounted on the circuit board part, wherein the lens is arranged along the path of photoreception of the photosensitive chip, wherein the base part comprises a through hole formed thereon, for providing a light path for the photosensitive chip, wherein the integral base component comprises at least a motor connection member, preinstalled on the base part to allow the motor to be electrically connected with the circuit board part therethrough, wherein the lens is mounted on the motor, so as to allow the lens to be adjusted through the motor.

According to an embodiment, the circuit board part comprises a main circuit board, wherein the base part is moldingly integrally formed on the main circuit board.

According to an embodiment, the motor connection member comprises at least a lead wire and at least a pin slot, wherein the lead wire is provided on the base part and electrically connected with the main circuit board, wherein the pin slot is provided on the upper end of the base part, wherein the lead wire has motor connecting end, exposed on the groove bottom wall, to allow at least a motor pin of the motor to be electrically connected with the motor connecting end when plugged into the pin slot.

According to an embodiment, the motor connection member comprises at least a pin slot and at least a circuit junction, electrically connected with the main circuit board, wherein the pin slot is provided on the base part, wherein the main circuit board is extended to the top of the base part, wherein the circuit junction is exposed in the pin slot, so as to allow at least a motor pin of the motor to be electrically connected with the circuit junction when plugged into the pin slot.

According to an embodiment, the motor connection member comprises at least an engraving circuit, arranged on the base part and electrically connected with the main circuit board, so as for being electrically connected with a motor pin.

According to an embodiment, the range of the thickness of the base part is 0.3~1.2 mm.

According to an embodiment, the range of the size of the cross section of the camera module is 5~20 mm.

According to an embodiment, the range of the height of the camera module is 3~6 mm.

According to an embodiment, the range of the thickness of the circuit board part is 0.15~0.5 mm.

According to an embodiment, the base part adjacently surrounds around the outer side of the photosensitive chip, so as to expand the thickness of the base part and reinforce the reliability of the connection between the base part and the circuit board part.

According to another aspect of the present invention, the present invention provides an integral base component for a camera module, comprising:
a base part; and
a circuit board part;
wherein the base part is integrally packaged in the circuit board part, wherein a photosensitive chip of the camera module is adaptable for being mounted on the circuit board part, wherein the base part has at least a through hole formed thereon to provide a light path for the photosensitive chip, wherein the lens is arranged along the light path of the photosensitive chip.

According to an embodiment, the integral base component comprises at least a circuit element, wrapped and covered by the base part.

According to an embodiment, the integral base component comprises at least a circuit element, arranged on the inner side of the base part, wherein the circuit element is not covered by the base part.

Still further objects and advantages will become apparent from a consideration of the ensuing description and drawings.

These and other objectives, features, and advantages of the present invention will become apparent from the following detailed description, the accompanying drawings, and the appended claims.

DETAILED DESCRIPTION OF THE PREFERRED EMBODIMENT

Figure 1:
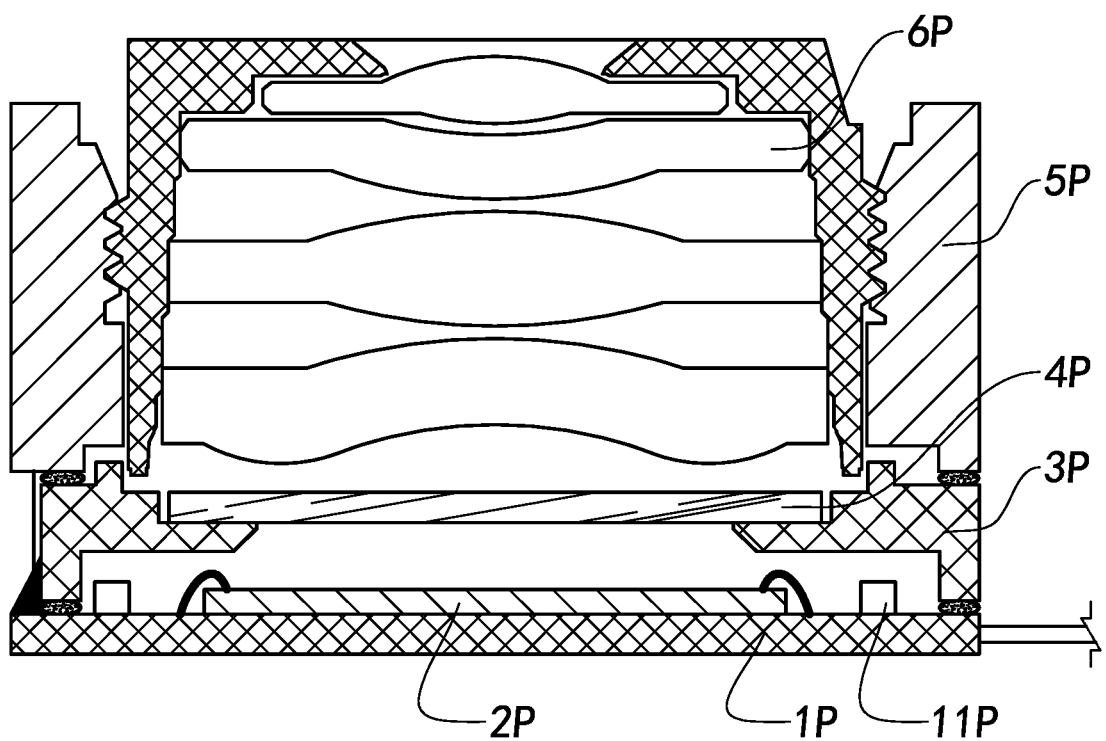
FIG. 1 is a sectional view of a camera module of conventional COB packaging technique.
Figure 2:
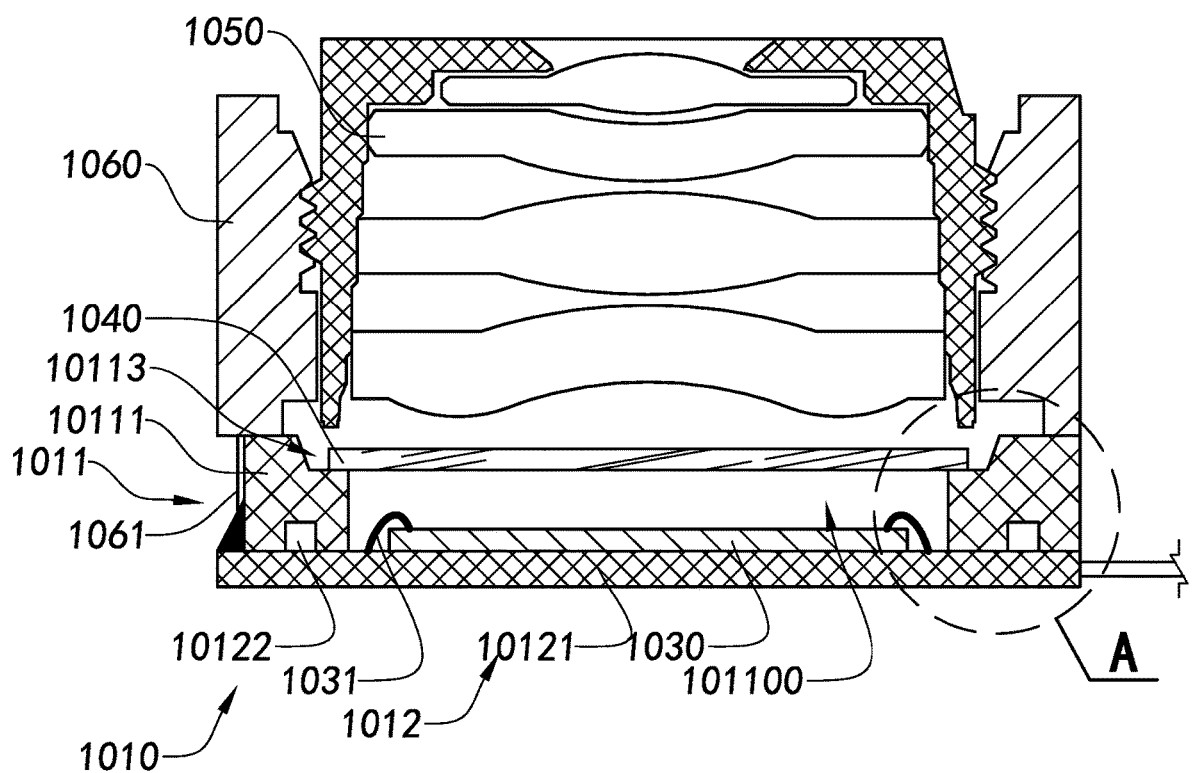
FIG. 2 is a sectional perspective view of a camera module according to a first preferred embodiment of the present invention.
Figure 3:
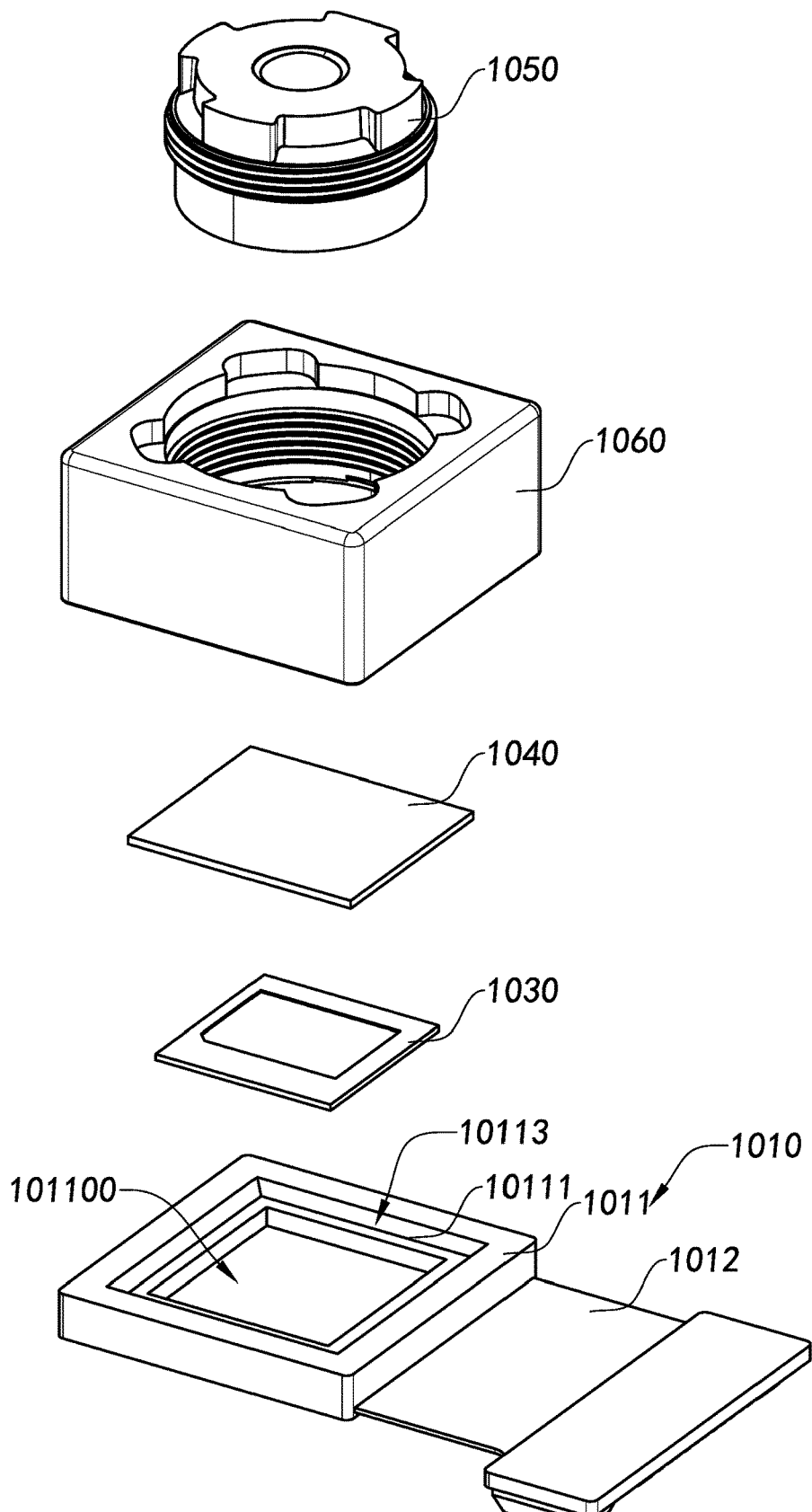
FIG. 3 is an explosive perspective view of a camera module according to the above first preferred embodiment of the present invention.
Figure 4:
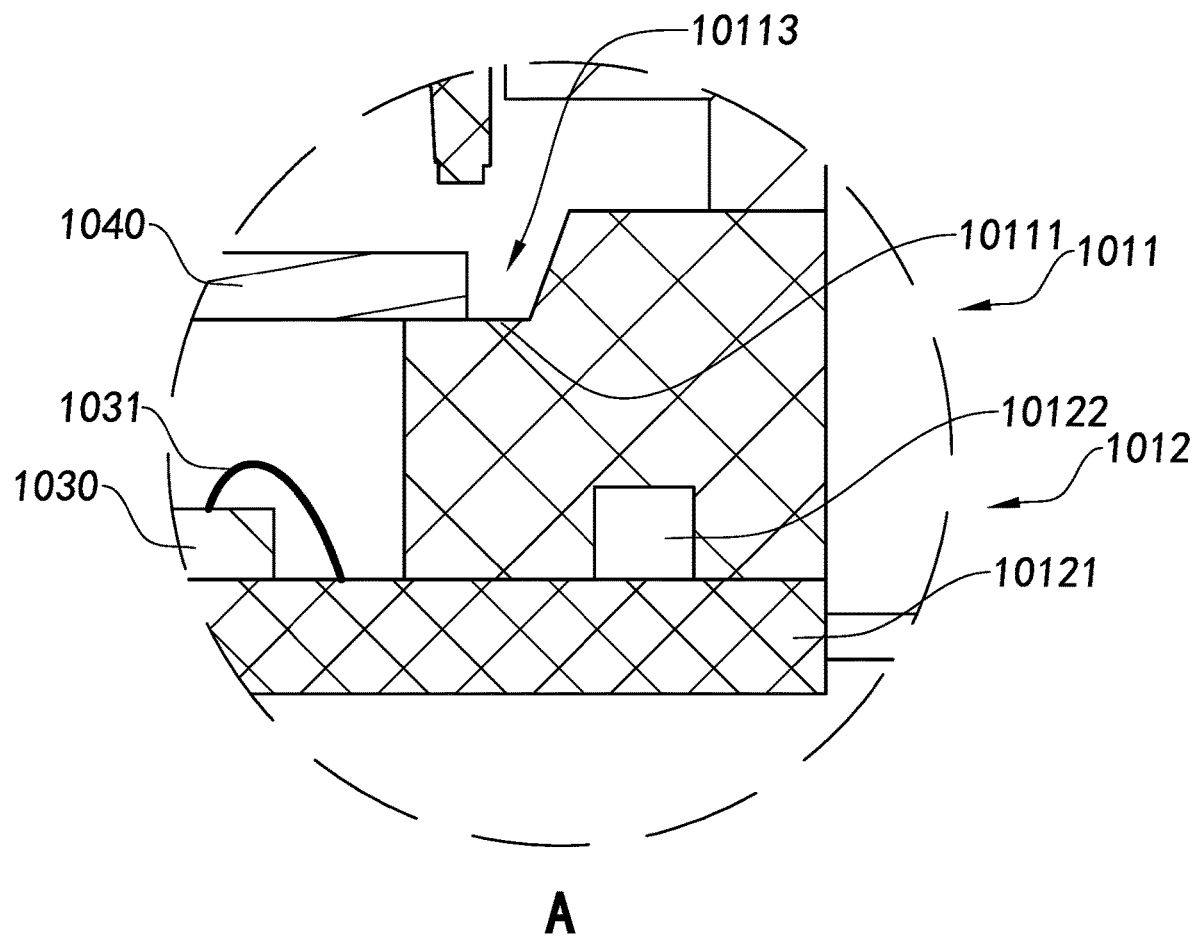
FIG. 4 is a partially enlarged perspective view of a camera module according to the above first preferred embodiment of the present invention.
Figure 5:
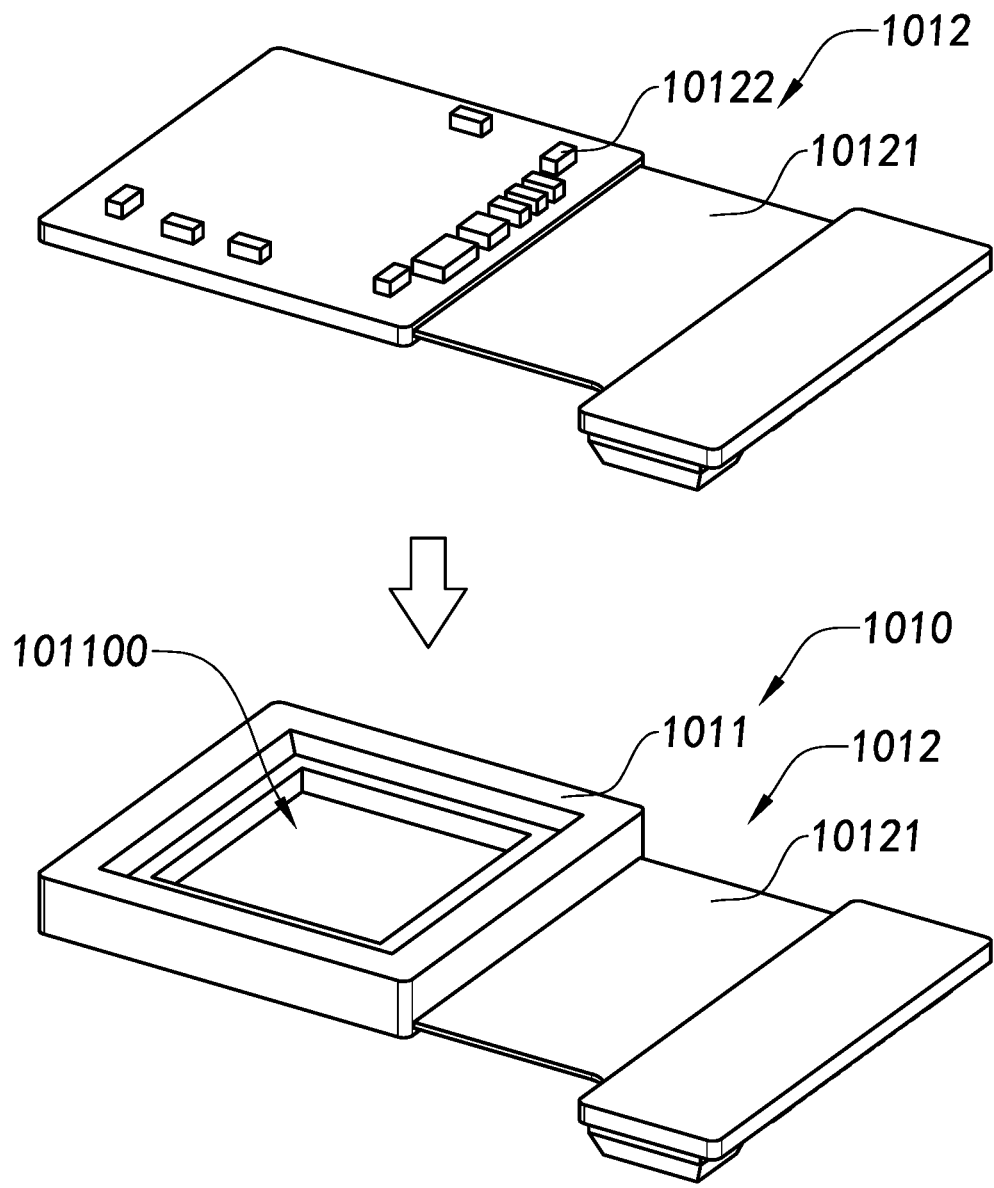
FIG. 5 is a perspective view of a forming process of molding circuit unit of the camera module according to a first preferred embodiment of the present invention.

The following is disclosed in order that those skilled in the art can implement the present invention. Preferred embodiments in the following descriptions are to give examples only. Those skilled in the art can think of other obvious modifications. The basic notions of the present invention defined in the following descriptions can apply to other implementations, modifications, improvements, equivalences, and other technical solutions that do not deviate the scope or spirit of the present invention.

Those skilled in the art should understand that, in the disclosure of the present invention, terminologies of "longitudinal," "lateral," "upper," "front," "back," "left," "right," "perpendicular," "horizontal," "top," "bottom," "inner," "outer," and more that indicate relations of direction or position are based on the relations of direction or position shown in the appended drawings, which is only for ease of describing the present invention and simplifying the description, rather than to indicate or imply that the referred device or element has to apply specific direction or to be operated or structured in specific direction. Therefore the above mentioned terminologies shall not be interpreted as confine to the present invention.

It is appreciated that the terms "one", "a", and "an" in the following description refer to "at least one" or "one or more" in the embodiment. In particular, the term "a" in one embodiment may refer to "one" while in another embodiment may refer to "more than one". Therefore, the above terms should not be an actual numerical limitation of the elements of the present invention.

FIGS. 2-5 illustrate a molding process based camera module according to a first preferred embodiment of the present invention. The camera module can be utilized on various electronic devices, to support photographic activities therethrough. For example, the camera module can be utilized to take photo or video of an object or character. Preferably, the camera module can be utilized on various electronic devices, for example but not limited to cellphone, tablet, TV, smart vehicle, smart monitoring device, and etc.

Referring to FIGS. 2-5, a camera module according to a first preferred embodiment of the present invention is illustrated. The camera module can be a zoom lens camera module, which includes a molded circuit unit 1010, a lens 1050, a motor 1060, and a photosensitive chip 1030. Certainly, it is understandable that the camera module can be alternatively embodied as a fixed focus camera module without the motor for this embodiment and alternative modes of the following embodiments that include a driver (motor). The lens can be mounted on a lens frame and then mounted on the molded circuit unit.

The motor 1060 is installed on the molded circuit unit 1010, wherein the lens 1050 is installed on the motor 1060, so as to have the lens 1050 be supported above the molded circuit unit 1010.

Further, the molded circuit unit 1010 includes a molding portion 1011 and a circuit board part 1012, wherein the molding portion 1011 moldingly connects the circuit board part 1012.

The circuit board part 1012 includes a main circuit board 10121, wherein the photosensitive chip 1030 is set on the main circuit board 10121 and in the inner side of the molding portion 1011.

Specifically, the motor 1060 is installed on the molding portion 1011 of the molded circuit unit 1010 and electrically connected to the circuit board part 1012, wherein the lens 1050 is installed on the motor 1060 and the lens 1050 is adapted to autofocus by the motor 1060. The lens 1050 is along the path of photoreception of the photosensitive chip 1030, so that when the camera module is capturing image of an object, light reflected from the object can be firstly processed by the lens 1050 and then received by the photosensitive chip 1030 to be adaptable for photoelectric conversion.

Further, the circuit board part 1012 includes a photosensitive circuit and at least one circuit element 10122. The photosensitive circuit is preinstalled in the main circuit board 10121, wherein the circuit element 10122 is electrically connected to the photosensitive circuit and the photosensitive chip 1030 to provide for the process of photosensitive work of the photosensitive chip 1030. The circuit element 10122 can be, for example but not limited to, a resistor, a capacitor, a diode, a triode, a potentiometer, an electric relay, driver, processor, memory . . . etc.

Particularly, in an embodiment of the present invention, when the camera module is being assembled, the motor 1060 is electrically connected to the photosensitive circuit through at least a motor pin 1061, and the motor pin 1061 is soldered on the main circuit board 10121.

It is worth mentioning that the molding portion 1011 can wrap up the circuit element 10122 in the inside, so that the circuit element 10122 will not be directly exposed in the space, which more specifically, will not be exposed in the enclosed environment that communicates with the photosensitive chip 1030. This differs from the presenting way of the circuit element of conventional camera module, like resistance-capacitance components, so as to prevent the dust and sundries from staying on the circuit element and polluting the photosensitive chip. The molding portion 1011 forms a through hole 101100 to make the molding portion 1011 surround in the outer side of the photosensitive chip 1030 and provide a light path for the lens 1050 and the photosensitive chip 1030. In other words, the molding portion forms an optical window for the photosensitive chip. Light passed through the lens 1050 can further pass through the optical window to reach the photosensitive chip in the camera module.

It is worth mentioning that the way that the molding portion 1011 wraps up the circuit element 10122 has an advantage in protecting the circuit element 10122, but those skilled in the art should understand that the molding portion 1011 is not limited in wrapping up the circuit element 10122. In other words, in other embodiments of the present invention, the molding portion 1011 can be directly molded on a circuit board that has no protruding circuit element 10122, or be molded at different positions including the outer side and the periphery of the circuit element 10122, or be embedded in the inside of the main circuit board 10121.

It is worth mentioning that, in an embodiment of the present invention, the molding portion 1011 protrudingly surrounds the outer side of the photosensitive chip 1030. Particularly, the molding portion 1011 is integrally closingly connected, so as to have a nice sealing quality, so that when the motor 1060 is installed on the molding portion 1011, the photosensitive chip 1030 is sealed in the inside, forming a sealed inner space.

Specifically, when manufacturing the molded circuit unit, a conventional circuit board can be used as the main circuit board 10121 and molding is conducted on the surface of the main circuit board 10121. For example, a circuit board that has been treated by Surface Mount Technology (SMT), can be molded to form the molding portion 1011 by insert molding technique with an injection molding machine, or to form the molding portion 1011 by mold pressing technique that is commonly used in semiconductor packaging. The main circuit board 10121 can alternatively be, for example but not limited to, a rigid-flex board, a ceramic substrate (without flexible board), or a rigid PCB (without flexible board). The way to form the molding portion 1011 can possibly be, for example but not limited to, injection molding technique or mold pressing technique. Possible material of the molding portion 1011 are, for example but not limited to, nylon, LCP (Liquid Crystal Polymer), or PP (Polypropylene) for injection molding, and resin for mold pressing. Those skilled in the art should understand that the above possible manufacturing methods and optional materials are just to give examples to illustrate implementations of the present invention, rather than confine of the present invention.

It is also worth mentioning that the motor 1060 is installed on the molding portion 1011 of the circuit unit 1010, so that the molding portion 1011 serves the function of the frame of a conventional camera module to support and affix the motor 1060, but with a different assembly from the process of conventional COB technology. Frame of camera module of conventional COB technology uses pasting method to be affixed on circuit board. However, the molding portion 1011 is attached on the main circuit board 10121 with molding technique that does not require the process of pasting and fixing. The molding way has better connection stability and controllability of technological process than the pasting and fixing. Also, the glue space reserved for AA adjustment between the molding portion 1011 and the main circuit board 10121 is not required, the lead room for AA adjustment of conventional camera module is reduced, such that the thickness of camera module can be reduced. Meanwhile, the molding portion 1011 wraps up the circuit element 10122 to allow the traditional functions of frame and the circuit element to be spatially overlappingly set, rather than reserving a safe distance around the circuit components, like conventional camera module. Therefore, the height of the molding portion 1011 that has frame functions can be set in a smaller range, so as to further provide room to reduce the thickness of camera module. Besides, the molding portion 1011 substitutes traditional frame, which avoids tilt error caused in the affixing and assembling of frame, and reduces accumulated tolerance of the assembling of camera module.

Further, the molding portion 1011 includes a susceptor 10111, wherein the susceptor 10111 is adaptable for installing a filter 1040, so that the filter 1040 will be above the photosensitive chip 1030. In other words, light entered the lens 1050 reaches the photosensitive chip 1040 after it was processed by the optical filter 1030. The filter 1040 can be implemented as, for example but not limited to, a IR-Cut Filter (IRCF).

The susceptor 10111 of the molding portion 1011 forms an inner ring groove 10113 to provide the filter 1040 enough installation space. It is worth mentioning that the molding portion 1011 substitutes traditional frame to connect the motor 1060 to the filter 1040 and to provide installation spot for the filter 1040, so as to sensibly arrange the molding portion 1011, the filter 1040 and the circuit element 10122, which fully uses the free space outside of the photosensitive area of the photosensitive chip 1030 to minimize the camera module. Meanwhile, the benefit of molding technique allows the molding portion 1011 to provide the susceptor 10111 in a level and smooth matter, so that the filter 1040 can be evenly installed, which ensures the consistency of light way.

More specifically, the vertical section of the inner ring groove 10113 is L-ring shape and is communicated to the through hole 101100 of the molding portion 1011, so that the filter 1040 is supported and installed along the path of photoreception of the photosensitive chip 1030.

According to this embodiment of the present invention, the photosensitive chip 1030 is connected to the main circuit board 10121 through a series of lead wire 1031, and electrically connected to the photosensitive circuit. The lead wire 1031 can be implemented as, for example but not limited to, a gold wire, a copper wire, an aluminum wire, or a silver wire. Particularly, the photosensitive chip 1030 and the series of lead wire 1031 can connect to the main circuit board 10121 by conventional COB method, for example but not limited to, welding. In other words, the connection between the photosensitive chip 1030 and the main circuit board 10121 can completely use existing mature technique of connection to lower the cost of technology improvement, to make full use of conventional technique and equipment, and to avoid the waste of resources. Without doubt, those skilled in the art should be able to understand that the connection between the photosensitive chip 1030 and the main circuit board 10121 may also be implemented through any other way of connection that is able to achieve the object of the present invention, wherein the present invention is not confined in this regard.

It is worth mentioning that in this embodiment of the present invention, the photosensitive chip 1030 is arranged on the upper surface of the main circuit board 10121 (e.g. attached thereon), wherein the molding portion 1011 surrounds the outer side of the photosensitive chip 1030. When manufacturing the molded circuit unit 1010, there are various possible manufacturing orders, for example but not limited to that, in a implementation, the photosensitive chip 1030 can be firstly installed on the main circuit board 10121, and then the molding portion 1011 is formed in the outer side of the photosensitive chip 1030 and in the marginal place of the main circuit board 10121 and wraps up the circuit elements 10122 protruded from the main circuit board 10121 in the inside thereof. Besides in another implementation of the present invention, the marginal place of the main circuit board 10121 can be first molded to form the molding portion 1011 and to wrap up the circuit elements 10122 protruded from the main circuit board 10121 in the inside thereof. Then the photosensitive chip 1030 can be installed on the main circuit board 10121 to be located in the inner side of the molding portion 1011.

Figure 6A:
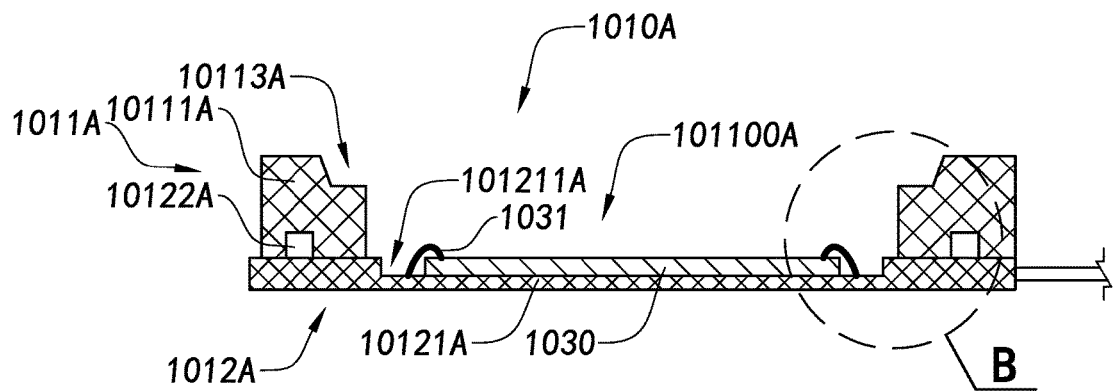
FIG. 6A is a sectional perspective view of a first alternative embodiment of a molded circuit unit of the camera module according to a first preferred embodiment of the present invention.
Figure 6B:
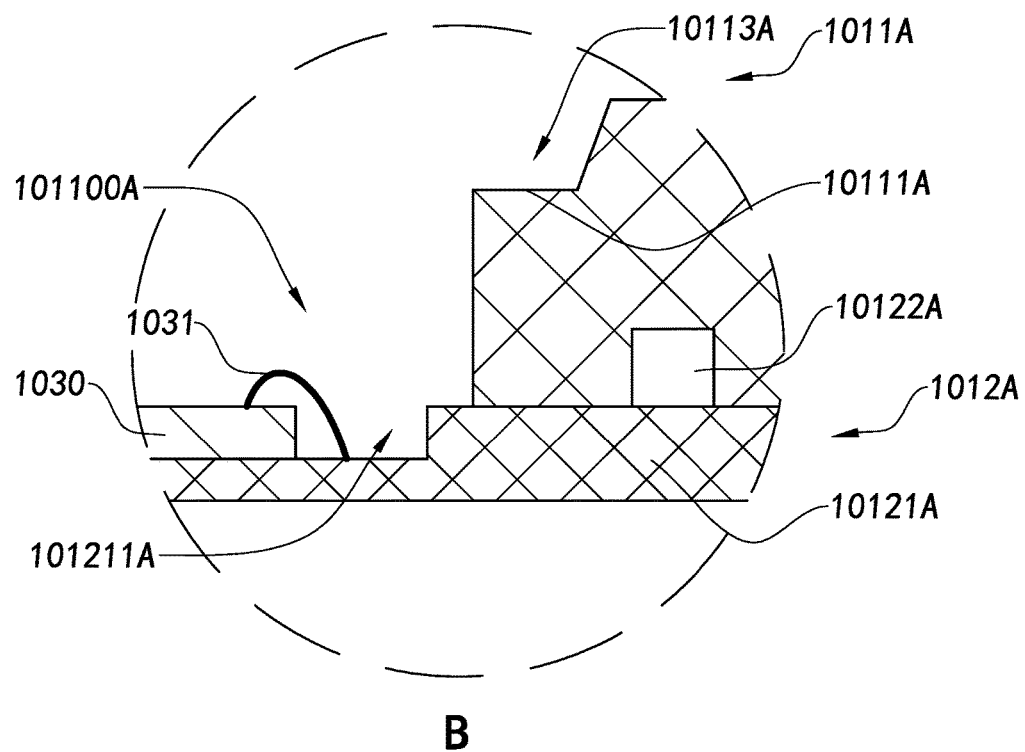
FIG. 6B is a partially enlarged perspective view of a first alternative embodiment of a molded circuit unit of the camera module according to the above first preferred embodiment of the present invention.

FIGS. 6A and 6B illustrate a first alternative embodiment of a molded circuit unit of the camera module according to a first preferred embodiment of the present invention. The molded circuit unit 1010A includes a molding portion 1011A and a circuit board part 1012A, wherein the molding portion 1011A moldingly connects the circuit board part 1012A.

The circuit board part 1012A includes a main circuit board 10121A, wherein the photosensitive chip 1030 is set on the main circuit board 10121A and in the inner side of the molding portion 1011A.

Specifically, the motor 1060 is installed on the molding portion 1011A of the circuit unit 10A and electrically connected to the circuit board part 1012A, wherein the lens 1050 is installed on the motor 1060 and the lens 1050 can be adjusted by the motor 1060 for autofocusing. The lens 1050 is along the path of photoreception of the photosensitive chip 1030, so that when the camera module is capturing image of an object, light reflected from the object can be firstly processed by the lens 1050 and then received by the photosensitive chip 1030 to be adaptable for photoelectric conversion.

Further, the circuit board part 1012A includes a photosensitive circuit and at least one circuit element 10122A. The photosensitive circuit is preinstalled in the main circuit board 10121A, wherein the circuit element 10122A is electrically connected to the photosensitive circuit and the photosensitive chip 1030 to provide for the process of photosensitive work of the photosensitive chip 1030. The circuit element 10122A can be, specifically but not limited to, a resistor, a capacitor, a diode, a triode, a potentiometer, an electric relay, driver, processor, memory . . . etc.

Particularly, in an embodiment of the present invention, when the camera module is being assembled, the motor 1060 is electrically connected to the photosensitive circuit through at least a motor pin 1061A, and the motor pin 1061A is soldered on the main circuit board 10121.

It is worth mentioning that the molding portion 1011A wraps up the circuit element 10122A in the inside, so that the circuit element 10122A will not be directly exposed in the space, which more specifically, will not exposed in the enclosed environment that communicates with the photosensitive chip 1030. This differs from the presenting way of the circuit element of conventional camera module, like resistance-capacitance components, so as to prevent the dust and sundries from staying on the circuit element and polluting the photosensitive chip. The molding portion 1011A forms a through hole 101100A to make the molding portion surround in the outer side of the photosensitive chip 1030 and provide a light path for the lens 1050 and the photosensitive chip 1030.

Further, the main circuit board 10121A includes an inner groove 101211A, wherein the photosensitive chip 1030 is set in the inside of the inner groove 101211A. Unlike the molded circuit unit of the above embodiment, the main circuit board 10121A has the inner groove 101211A set inside thereof and accommodating the photosensitive chip 1030 in the inside thereof, so that the photosensitive chip 1030 will not significantly protrude from the upper surface of the main circuit board 10121A, can which lower the height of the photosensitive chip 1030 relatively to the molding portion 1011A, so as to reduce the height limit of the molding portion 1011A from the photosensitive chip 1030, and to provide potential of further decrease of the height.

Specifically, when manufacturing the molded circuit unit 1010, a conventional circuit board can be used as the main circuit board 10121A and molding is conducted on the surface of the main circuit board 10121A. For example, a circuit board that has been treated by Surface Mount Technology (SMT), can be molded to form the molding portion 1011A by insert molding technique with an injection molding machine, or to form the molding portion 1011A by mold pressing technique that is commonly used in semiconductor packaging. Particularly, in an embodiment, the inner groove 12110A should firstly be made on the main circuit board 10121A. In other words, the inner groove 101211A is made on a conventional main circuit board to be adaptable for accommodating and installing the photosensitive chip 1030. The main circuit board 10121A can alternatively be, for example but not limited to, a rigid-flex board, a ceramic substrate (without flexible board), or a rigid PCB (without flexible board). The way to form the molding portion 1011A can possibly be, for example but not limited to, injection molding technique or mold pressing technique. Possible materials of the molding portion 1011A are, for example but not limited to, nylon, LCP (Liquid Crystal Polymer), or PP (Polypropylene) for injection molding, and resin for mold pressing. Those skilled in the art should understand that the above possible manufacturing methods and optional materials are just to give examples to illustrate implementations of the present invention, rather than confine of the present invention.

It is also worth mentioning that the motor 1060 is installed on the molding portion 1011A of the circuit unit 1010A, so that the molding portion 1011A serves the function of the frame of a conventional camera module to support and affix the motor 1060, but with a different assembly from the process of conventional COB technology. Frame of camera module of conventional COB technology uses pasting method to be affixed on circuit board. However, the molding portion 1011A is attached on the main circuit board 10121A with molding technique that does not require the process of pasting and fixing. The molding way has better connection stability and controllability of technological process than the pasting and fixing. Also, the glue space reserved for AA adjustment between the molding portion 1011A and the main circuit board is not required, the lead room for AA adjustment of conventional camera module is reduced, such that the thickness of camera module can be reduced. Meanwhile, the molding portion 1011A wraps up the circuit element 10122A to allow the traditional functions of frame and the circuit element to be spatially overlappingly set, rather than reserving a safe distance around the circuit components, like conventional camera module. Therefore, the height of the molding portion 1011A that has frame functions can be set in a smaller range, so as and further provide room to reduce the thickness of camera module. Besides, the molding portion 1011A substitutes traditional frame, which avoids tilt error caused in the affixing and assembling of frame, and reduces accumulated tolerance of the assembling of camera module.

Further, the molding portion 1011A includes a susceptor 10111A, wherein the susceptor 10111A is adaptable for installing the filter 1040, so that the filter 1040 will be above the photosensitive chip 1030. In other words, light entered the lens 1050 reaches the photosensitive chip 1040 after it was processed by the optical filter 1030. The filter 1040 can be implemented as, for example but not limited to, a IR-Cut Filter (IRCF).

The susceptor 10111A of the molding portion 1011A forms an inner ring groove 10113A to provide the filter 1040 enough installation space. It is worth mentioning that the molding portion 1011 substitutes traditional frame to connect the motor 1060 to the filter 1040 and to provide installation spot for the filter 1040, so as to sensibly arrange the molding portion 1011A, the filter 1040 and the circuit element 10122A, which fully uses the free space outside of the photosensitive area of the photosensitive chip 1030 to minimize the camera module. Meanwhile, the benefit of molding technique allows the molding portion 1011A to provide the susceptor 10111A in a level and smooth matter, so that the filter 1040 can be evenly installed, which ensures the consistency of light way.

More specifically, the cross section of the inner ring groove 10113A is L-ring shape and is communicated to the through hole 101100A of the molding portion 1011A, so that the filter 1040 can be supported and installed along the path of photoreception of the photosensitive chip 1030.

According to this embodiment of the present invention, the photosensitive chip 1030 is connected to the main circuit board 10121A through a series of lead wire 1031A, and electrically connected to the photosensitive circuit. The lead wire 51A can be implemented as, for example but not limited to, a gold wire, a copper wire, an aluminum wire, or a silver wire. Particularly, the photosensitive chip 1030 and the series of lead wire 1031A can be connected to the main circuit board 10121A by conventional COB method, for example but not limited to, welding. In other words, the connection between the photosensitive chip 1030 and the main circuit board 10121A can completely use existing mature technique of connection to lower the cost of technology improvement, to make full use of conventional technique and equipment, and to avoid the waste of resources. Without doubt, those skilled in the art should be able to understand that the connection between the photosensitive chip 1030 and the main circuit board 10121A may also be implemented through any other way of connection that is able to achieve the object of the present invention, wherein the present invention is not confined in this regard.

It is worth mentioning that in this embodiment of the present invention, the photosensitive chip 1030 is set in the inner groove 101211A of the main circuit board 10121A, wherein the molding portion 1011A surrounds the outer side of the photosensitive chip 1030. When manufacturing the molded circuit unit, there are various possible manufacturing orders, for example but not limited to that, in an implementation, the inner groove 101211A can be firstly made on the main circuit board 10121A, so that the photosensitive chip 1030 can be installed in the inner groove 12110A of the main circuit board 10121A, and then the molding portion 1011A is formed in the outer side of the photosensitive chip 1030 and in the marginal place of the main circuit board 10121A and wraps up the circuit elements 10122A protruded from the main circuit board 121A in the inside thereof. Besides, in another embodiment of the present invention, the inner groove 101211A can be firstly made on the main circuit board 10121A, and then the marginal place of the main circuit board 10121A can be molded to form the molding portion 1011A to wrap up the circuit elements 10122A protruded from the main circuit board 10121A in the inside thereof. Then the photosensitive chip 1030 can be installed in the inner groove 101211A of the main circuit board 10121A to be located in the inner side of the molding portion 1011A.

Figure 7A:
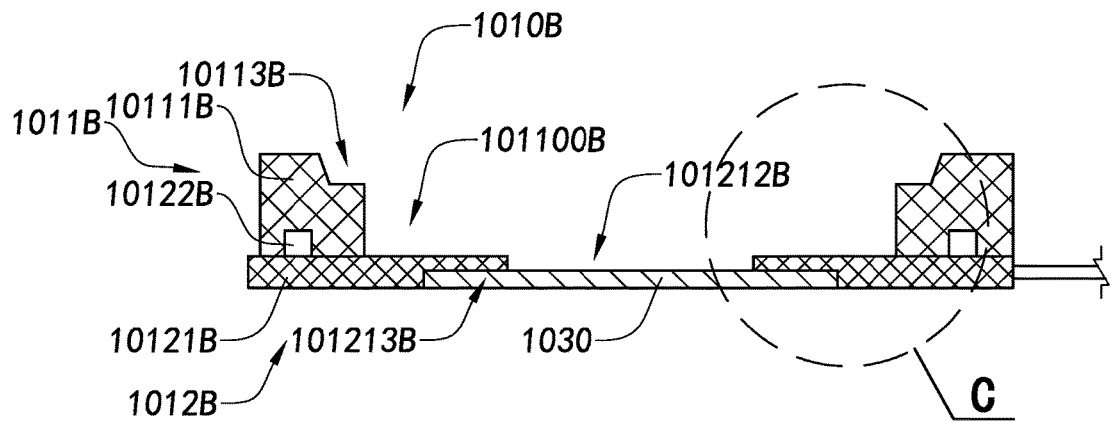
FIG. 7A is a sectional perspective view of a second alternative embodiment of a molded circuit unit of the camera module according to the above first preferred embodiment of the present invention.
Figure 7B:
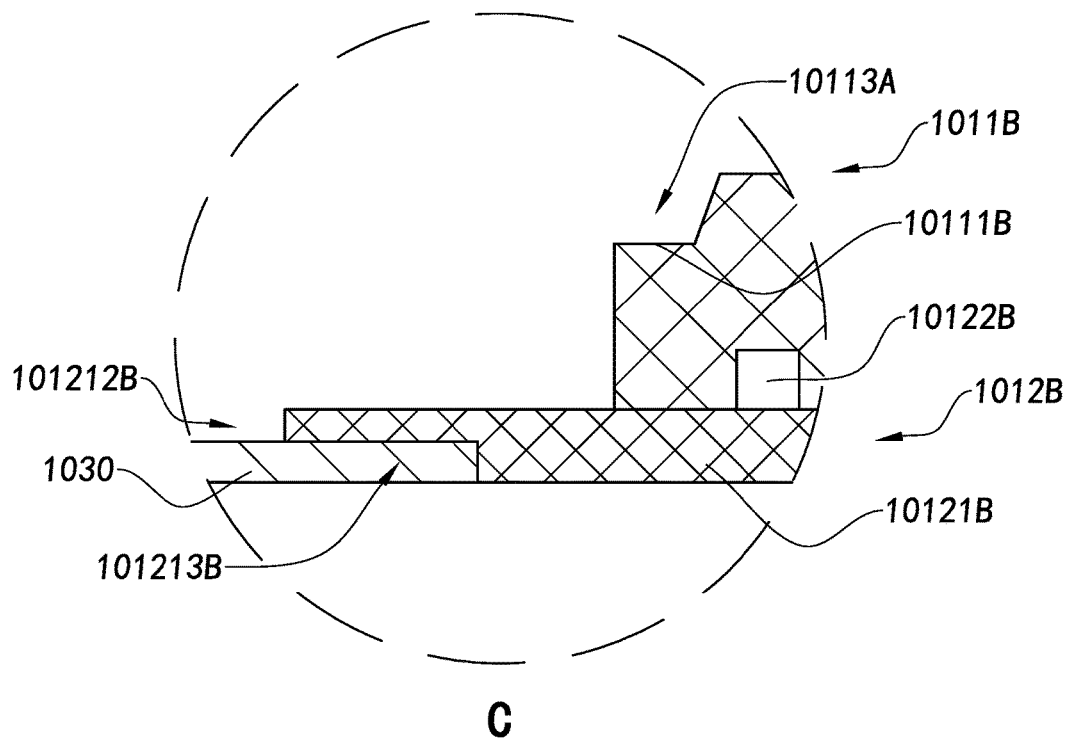
FIG. 7B is a partially enlarged perspective view of a second alternative embodiment of a circuit unit of the camera module according to the above first preferred embodiment of the present invention.

FIGS. 7A and 7B illustrate a second alternative embodiment of a molded circuit unit of the camera module according to the above first preferred embodiment of the present invention. The molded circuit unit 1010B includes a molding portion 1011B and a circuit board part 1012B, wherein the molding portion 1011B moldingly connects the circuit board part 1012B.

The circuit board part 1012B includes a main circuit board 10121B, wherein the photosensitive chip 1030 is set on the main circuit board 10121B and in the inner side of the molding portion 1011B.

Specifically, the motor 1060 is installed on the molding portion 1011B of the circuit unit 10B and electrically connected to the circuit board part 1012B, wherein the lens 1050 is installed on the motor 1060 and the lens 1050 is adapted to autofocus by the motor 1060. The lens 1050 is along the path of photoreception of the photosensitive chip 1030, so that when the camera module is capturing image of an object, light reflected from the object can be firstly processed by the lens 1050 and then received by the photosensitive chip 1030 to be adaptable for photoelectric conversion.

Further, the circuit board part 1012B includes a photosensitive circuit (not shown on the figures) and at least one circuit element 10122B. The photosensitive circuit is pre-installed in the main circuit board 10121B, wherein the circuit element 10122B is electrically connected to the photosensitive circuit and the photosensitive chip 1030 to provide for the process of photosensitive work of the photosensitive chip 1030. The circuit element 10122B can be, for example but not limited to, a resistor, a capacitor, a diode, a triode, a potentiometer, an electric relay, driver, processor, memory, and etc.

Particularly, in an embodiment of the present invention, when the camera module is being assembled, the motor 1060 is electrically connected to the photosensitive circuit through at least a motor pin 1061, and the wire is soldered on the main circuit board 10121B.

It is worth mentioning that the molding portion 1011B wraps up the circuit element 10122B in the inside, so that the circuit element 10122B will not be directly exposed in the space, which more specifically, will not exposed in the enclosed environment that communicates with the photosensitive chip 1030. This differs from the presenting way of the circuit element of conventional camera module, like resistance-capacitance components, so as to prevent the dust and sundries from staying on the circuit element and polluting the photosensitive chip. The molding portion 1011B forms a through hole 101100B to make the molding portion surround in the outer side of the photosensitive chip 1030 and provide a light path for the lens 1050 and the photosensitive chip 1030.

Further, the main circuit board 10121B has a passage 101212B, wherein the lower part of the passage 101212B is adaptable for installation of the photosensitive chip 1030. The passage 101212B communicates the upper and lower sides of the main circuit board 10121B, so that when the photosensitive chip 1030 is installed on the main circuit board 10121B from the back of the main circuit board 10121B and with the photosensitive area facing up, the photosensitive area of the photosensitive chip 1030 can still receive incoming light from the lens 1050.

Further, the passage 101212B has an outer ring groove 101213B on the bottom side thereof to provide installation site for the photosensitive chip 1030. Particularly, when the photosensitive chip 1030 is installed in the outer ring groove 101213 of the bottom side, the bottom surface of the photosensitive chip 1030 is consistent with the surface of the main circuit board 10121B, which are on the same plane. Alternatively, the bottom surface of the photosensitive chip 1030 may sink relatively to the surface of the main circuit board 10121B. Namely, the bottom surface of the photosensitive chip 1030 can be kept from protruding from the bottom surface of the main circuit board 10121B, so as to ensure the evenness of the surface of the molded circuit unit 1010B.

In this embodiment of the present invention, the passage 101212B is step shape, which makes it easy for the installation of the photosensitive chip 1030 and provides a stable installation site for the photosensitive chip 1030, which also makes the photosensitive area thereof present in the inner space.

It is worth mentioning that this embodiment of the present invention provides a kind of chip installation way that differs from convention, which is the flip chip (FC) method. The photosensitive chip 1030 is installed on the main circuit board 10121B from the reverse direction of the main circuit board 10121B, which is different from the above embodiment that requires installation on the main circuit board 10121 from the front side of the main circuit board 10121, which means from the upper side of the main circuit board 10121 with the photosensitive area of the photosensitive chip 1030 upwardly. This kind of structure and way of installation allows the photosensitive chip 1030 and the molding portion 1011B to be relatively independent. Installation of the photosensitive chip 1030 will not be affected by the molding portion 1011B. Molding of the molding portion 1011B also makes less impact to the photosensitive chip 1030. Besides, the photosensitive chip 1030 is embedded in the outer side of the main circuit board 10121B without protruding to the inner side of the main circuit board 10121B, so as to leave a larger space in the inner side of the main circuit board 10121B, so that the height of the molding portion 1011B will not be limited by the height of the photosensitive chip 1030, which allows the molding portion 1011B to achieve a smaller height.

Specifically, when manufacturing the molded circuit unit, a conventional circuit board can be used as the main circuit board 10121B and molding is conducted on the surface of the main circuit board 10121B. For example, a circuit board that has been treated by Surface Mount Technology (SMT), can be molded to form the molding portion 1011B by insert molding technique with an injection molding machine, or to form the molding portion 1011B by mold pressing technique that is commonly used in semiconductor packaging, as well as to make the passage 101212B on the main circuit board

10121B. The main circuit board 10121B can alternatively be, for example but not limited to, a rigid-flex board, a ceramic substrate (without flexible board), or a rigid PCB (without flexible board). The way to form the molding portion 1011B can possibly be, for example but not limited to, injection molding technique or mold pressing technique. Possible materials of the molding portion 1011B are, for example but not limited to, nylon, LCP (Liquid Crystal Polymer), or PP (Polypropylene) for injection molding, and resin for mold pressing. Those skilled in the art should understand that the above possible manufacturing methods and optional materials are just to give examples to illustrate implementations of the present invention, rather than confine of the present invention.

It is also worth mentioning that the motor 1060 is installed on the molding portion 1011B of the circuit unit 1010B, so that the molding portion 1011B serves the function of the frame of a conventional camera module to support and affix the motor 1060, but with a different assembly from the process of conventional COB technology. Frame of camera module of conventional COB technology uses pasting method to be affixed on circuit board. However, the molding portion 1011 is attached on the main circuit board 10121B with molding technique that does not require the process of pasting and fixing. The molding way has better connection stability and controllability of technological process than the pasting and fixing. Also, the glue space reserved for AA adjustment between the molding portion 1011 and the main circuit board is not required, the lead room for AA adjustment of conventional camera module is reduced, such that the thickness of camera module can be reduced. Meanwhile, the molding portion 1011B wraps up the circuit element 10122B to allow the traditional functions of frame and the circuit element to be spatially overlappingly set, rather than reserving a safe distance around the circuit components, like conventional camera module. Therefore, the height of the molding portion 1011B that has frame functions can be set in a smaller range, so as to further provide room to reduce the thickness of camera module. Besides, the molding portion 1011B substitutes traditional frame, which avoids tilt error caused in the affixing and assembling of frame, and reduces accumulated tolerance of the assembling of camera module.

Further, the molding portion 1011B includes a susceptor 10111B, wherein the susceptor 10111B is adaptable for installing the filter 1040, so that the filter 1040 will be above the photosensitive chip 1030. In other words, light entered the lens 1050 reaches the photosensitive chip 1040 after it was processed by the optical filter 40. The filter 1040 can be implemented as, for example but not limited to, an IR-Cut Filter (IRCF).

The susceptor 10111B of the molding portion 1011B forms an inner ring groove 10113B to provide the filter 1040 enough installation space. It is worth mentioning that the molding portion 1011B substitutes traditional frame to connect the motor 1060 to the filter 1040 and to provide installation spot for the filter 1040, so as to sensibly arrange the molding portion 1011B, the filter 1040 and the circuit element 10122B, which fully uses the free space outside of the photosensitive area of the photosensitive chip 1030 to minimize the camera module. Meanwhile, the benefit of molding technique allows the molding portion 1011B to provide the susceptor 10111B in a level and smooth matter, so that the filter 1040 can be evenly installed, which ensures the consistency of light way.

More specifically, the vertical section of the inner ring groove 10113B is L-ring shape and is communicated to the through hole 101100B of the molding portion 1011B, so that the filter 1040 is supported and installed along the path of photoreception of the photosensitive chip 1030.

It is worth mentioning that in this embodiment of the present invention, the photosensitive chip 1030 is set on the lower surface of the main circuit board 10121B, wherein the molding portion 1011B surrounds the external rim of the main circuit board 10121B. When manufacturing the molded circuit unit 1010B, there are various possible manufacturing orders, for example but not limited to that, in an implementation, the passage 101212B can be firstly made on the main circuit board 10121B, so that the photosensitive chip 1030 can be invert installed on the passage 101212B of the main circuit board 10121, and then the molding portion 1011B is formed in the outer side of the photosensitive chip 1030 and in the marginal place of the main circuit board 10121B and wraps up the circuit elements 10122B protruded from the main circuit board 10121B in the inside thereof. Besides, in another embodiment of the present invention, the passage 101212B can be firstly made on the main circuit board 10121B, and then the marginal place of the main circuit board 10121B can be molded to form the molding portion 1011B to wrap up the circuit elements 10122B protruded from the main circuit board 10121B in the inside thereof. Then the photosensitive chip 1030 can be installed on the main circuit board 10121B to be located in the outer ring groove 101213B of the molding portion 10121B. In another embodiment of the present invention, the marginal place of the main circuit board 10121B can be first molded to form the molding portion 1011B to wrap up the circuit elements 10122B protruded from the main circuit board 10121B in the inside thereof. Then the passage 101212B can be made on the main circuit board 10121B, so the photosensitive chip 1030 can be invert installed on the passage 101212B of the main circuit board 10121B.

Figure 8A:
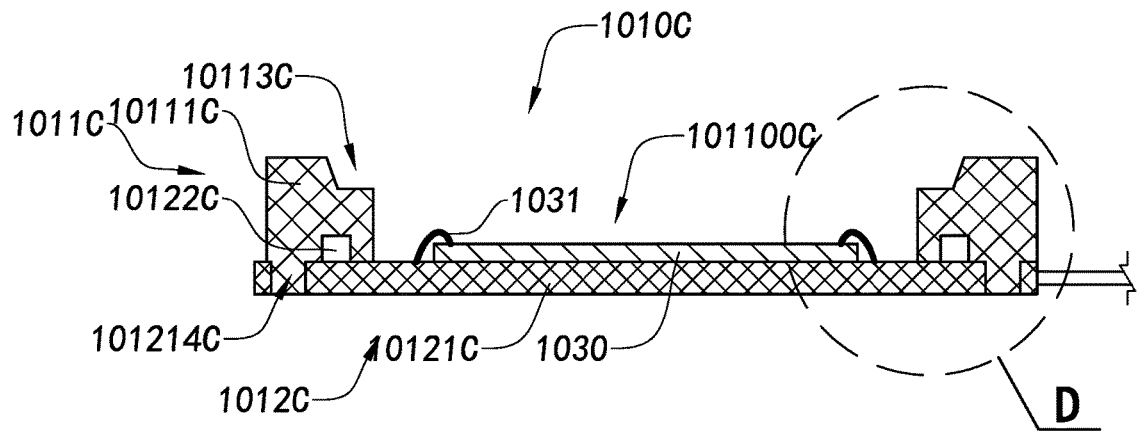
FIG. 8A is a sectional perspective view of a third alternative embodiment of a circuit unit of the camera module according to the above first preferred embodiment of the present invention.
Figure 8B:
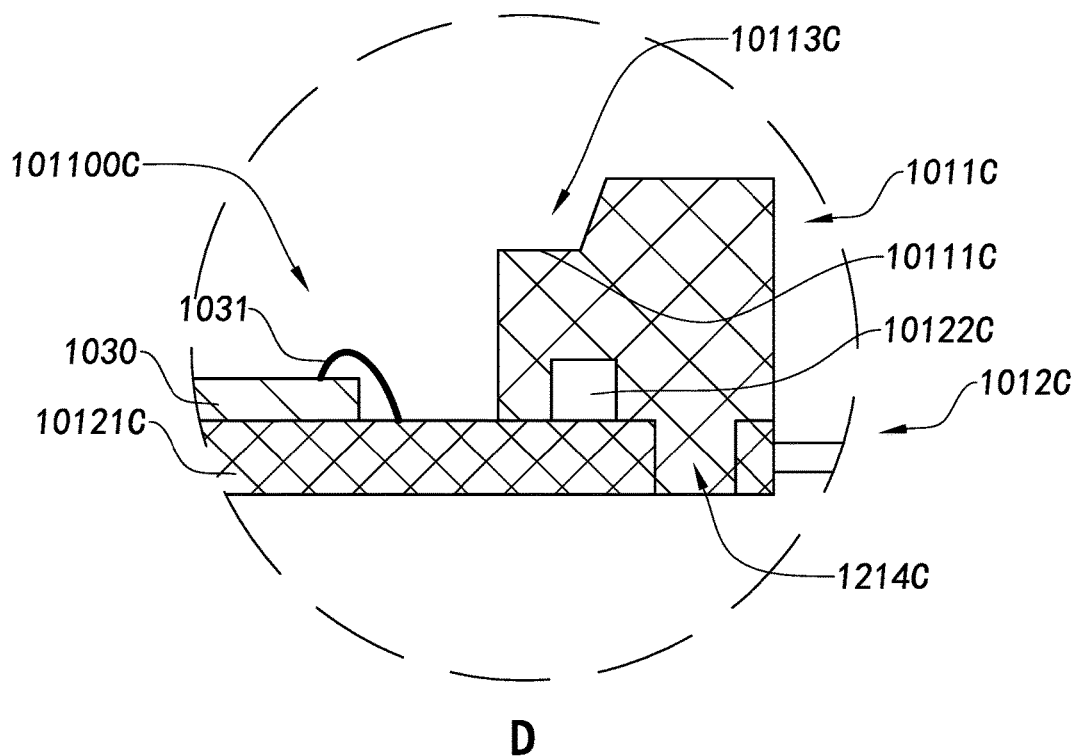
FIG. 8B is a partially enlarged perspective view of a third alternative embodiment of a circuit unit of the camera module according to the above first preferred embodiment of the present invention.

FIGS. 8A and 8B illustrate a third alternative embodiment of a molded circuit unit of the camera module according to the above first preferred embodiment of the present invention. The molded circuit unit 1010C includes a molding portion 1011C and a circuit board part 1012C, wherein the molding portion 1011C moldingly connects the circuit board part 1012C.

The circuit board part 1012C includes a main circuit board 10121C, wherein the photosensitive chip 1030 is set on the main circuit board 10121C and in the inner side of the molding portion 1011C.

Specifically, the motor 1060 is installed on the molding portion 1011C of the circuit unit 10C and electrically connected to the circuit board part 1012C, wherein the lens 1050 is installed on the motor 1060 and the lens 1050 is adapted to autofocus by the motor 50. The lens 1050 is along the path of photoreception of the photosensitive chip 1030, so that when the camera module is capturing image of an object, light reflected from the object can be firstly processed by the lens 1050 and then received by the photosensitive chip 1030 to be adaptable for photoelectric conversion.

Further, the circuit board part 1012C includes a photosensitive circuit (not shown on the figures) and at least one circuit element 10122C. The photosensitive circuit is preinstalled in the main circuit board 10121C, wherein the circuit element 10122C is electrically connected to the photosensitive circuit and the photosensitive chip 1030 to provide for the process of photosensitive work of the photosensitive chip 1030. The circuit element 10122C can be, for example but not limited to, a resistor, a capacitor, a diode, a triode, a potentiometer, an electric relay, driver, processor, memory, and etc.

Particularly, in an embodiment of the present invention, when the camera module is being assembled, the motor 1060 is electrically connected to the photosensitive circuit through a motor pin 1061, and the motor pin 1061 is soldered on the main circuit board 10121C.

It is worth mentioning that the molding portion 1011C wraps up the circuit element 10122C in the inside, so that the circuit element 10122C will not be directly exposed in the space, which more specifically, will not exposed in the enclosed environment that communicates with the photosensitive chip 1030. This differs from the presenting way of the circuit element of conventional camera module, like resistance-capacitance components, so as to prevent the dust and sundries from staying on the circuit element and polluting the photosensitive chip. The molding portion 1011C forms a through hole 101100C to make the molding portion surround in the outer side of the photosensitive chip 1030 and provide a light path for the lens 1050 and the photosensitive chip 1030.

Further, the main circuit board 10121C has at least one via 101214C, wherein the molding portion 11C immerges into the via 101214C. Each via 101214C is set in the molding area of the main circuit board and arranged coordinately with the circuit elements 10122C. It is worth mentioning that the setting of the via 101214C allows the molding portion 1011C to immerge into the main circuit board 10121C when moldingly forming, which enhances the cohesion between the molding portion 1011C and the main circuit board 10121C, so that the molding portion 11C will not detach from the main circuit board easily and the structural strength of the main circuit board 10121C is also increased, so that the main circuit board 10121C can then have a smaller thickness. Position and quantity of the via 101214C can be arranged based on the needs. Therefore, those skilled in the art should understand that position and quantity of the via 101214C is not a confine of the present invention.

It is worth mentioning that in other embodiment of the present invention, the main circuit board 10121C can also have the inner groove 101211A or the passage 101212B set, so as to allow the molded circuit unit 1010C to have various advantages, including smaller thickness and higher structural strength.

It is worth mentioning that setting the via 101214C on the main circuit board 10121C of the embodiment can bring some benefits, including enhancing the molding cohesion between the main circuit board 10121C and the molding portion 1011C and increasing the structural strength of the main circuit board 10121C. Those skilled in the art should certainly understand that the setting of the via 101214C on the circuit board 10121C is not a confine of the present invention. In other words, other embodiment of the present invention may not set the via 101214C or set the via 12130C in different arrangement or different quantity based on the needs.

Specifically, when manufacturing the molded circuit unit, a conventional circuit board can be used as the main circuit board 10121C and molding is conducted on the surface of the main circuit board 10121C. For example, a circuit board that has been treated by Surface Mount Technology (SMT), can be molded to form the molding portion 1011C by insert molding technique with an injection molding machine, or to form the molding portion 1011C by mold pressing technique that is commonly used in semiconductor packaging. The main circuit board 10121C can alternatively be, for example but not limited to, a rigid-flex board, a ceramic substrate (without flexible board), or a rigid PCB (without flexible board). The way to form the molding portion 1011C can possibly be, for example but not limited to, injection molding technique or mold pressing technique. Possible material of the molding portion 1011C are, for example but not limited to, nylon, LCP (Liquid Crystal Polymer), or PP (Polypropylene) for injection molding, and resin for mold pressing. Those skilled in the art should understand that the above possible manufacturing methods and optional materials are just to give examples to illustrate implementations of the present invention, rather than confine of the present invention.

It is also worth mentioning that the motor 1060 is installed on the molding portion 1011C of the circuit unit 1010C, so that the molding portion 1011C serves the function of the frame of a conventional camera module to support and affix the motor 1060, but with a different assembly from the process of conventional COB technology. Frame of camera module of conventional COB technology uses pasting method to be affixed on circuit board. However, the molding portion 1011C is attached on the main circuit board 10121C with molding technique that does not require the process of pasting and fixing. The molding way has better connection stability and controllability of technological process than the pasting and fixing. Also, the glue space reserved for AA adjustment between the molding portion 1011C and the main circuit board is not required, the lead room for AA adjustment of conventional camera module is reduced, such that the thickness of camera module can be reduced. Meanwhile, the molding portion 1011C wraps up the circuit element 10122C to allow the traditional functions of frame and the circuit element to be spatially overlappingly set, rather than reserving a safe distance around the circuit components, like conventional camera module. Therefore, the height of the molding portion 1011C that has frame functions can be set in a smaller range, so as to further provide room to reduce the thickness of camera module. Besides, the molding portion 1011C substitutes traditional frame, which avoids tilt error caused in the affixing and assembling of frame, and reduces accumulated tolerance of the assembling of camera module.

Further, the molding portion 1011C includes a susceptor 10111C, wherein the susceptor 10111C is adaptable for installing the filter 1040, so that the filter 1040 will be above the photosensitive chip 1030. In other words, light entered the lens 1050 reaches the photosensitive chip 1040 after it was processed by the optical filter 40. The filter 1040 can be implemented as, for example but not limited to, a IR-Cut Filter (IRCF).

The susceptor 10111C of the molding portion 1011C forms an inner ring groove 10113C to provide the filter 1040 enough installation space. It is worth mentioning that the molding portion 1011C substitutes traditional frame to connect the motor 1060 to the filter 1040 and to provide installation spot for the filter 1040, so as to sensibly arrange the molding portion 1011C, the filter 1040 and the circuit element 10122C, which fully uses the free space outside of the photosensitive area of the photosensitive chip 1030 to minimize the camera module. Meanwhile, the benefit of molding technique allows the molding portion 1011C to provide the susceptor 10111C in a level and smooth matter, so that the filter 1040 can be evenly installed, which ensures the consistency of light way.

More specifically, the section of the inner ring groove 10113C is L-ring shape and is communicated to the through hole 101100C of the molding portion 1011C, so that the filter 1040 is supported and installed along the path of photoreception of the photosensitive chip 1030.

According to this embodiment of the present invention, the photosensitive chip 1030 is connected to the main circuit board 10121C through a series of lead wire 1031, and electrically connected to the photosensitive circuit. The lead wire 1031 can be implemented as, for example but not limited to, a gold wire, a copper wire, an aluminum wire, or a silver wire. Particularly, the photosensitive chip 1030 and the series of lead wire 1031 can be connected to the main circuit board 10121C by conventional COB method, for example but not limited to, welding. In other words, the connection between the photosensitive chip 1030 and the main circuit board 10121C can completely use existing mature technique of connection to lower the cost of technology improvement, to make full use of conventional technique and equipment, and to avoid the waste of resources. Without doubt, those skilled in the art should be able to understand that the connection between the photosensitive chip 1030 and the main circuit board 10121C may also be implemented through any other way of connection that is able to achieve the object of the present invention, wherein the present invention is not confined in this regard.

It is worth mentioning that in this embodiment of the present invention, the photosensitive chip 1030 is set on the upper surface of the main circuit board 10121C, wherein the molding portion 1011C surrounds the outer side of the photosensitive chip. When manufacturing the molded circuit unit, there are various possible manufacturing orders, for example but not limited to that, in a implementation, the photosensitive chip 1030 can be firstly installed on the main circuit board 10121C, and then the molding portion 1011C is formed in the outer side of the photosensitive chip 1030 and in the marginal place of the main circuit board 10121C and wraps up the circuit elements 10122C protruded from the main circuit board 10121C in the inside thereof. Besides in another embodiment of the present invention, the marginal place of the main circuit board 10121C can be first molded to form the molding portion 1011C and to wrap up the circuit elements 10122C protruded from the main circuit board 10121C in the inside thereof. Then the photosensitive chip 1030 can be installed on the main circuit board 10121C to be located in the inner side of the molding portion 1011C.

Figure 9:
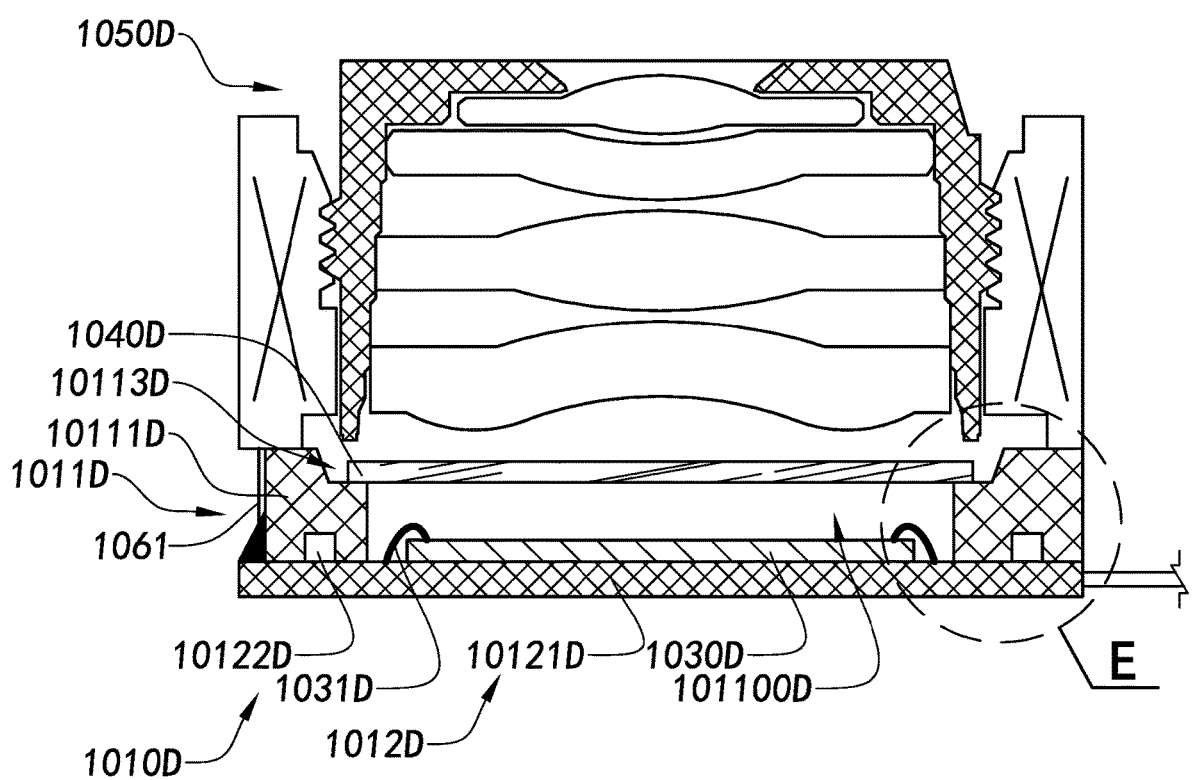
FIG. 9 is a sectional perspective view of a camera module according to a second preferred embodiment of the present invention.
Figure 10:
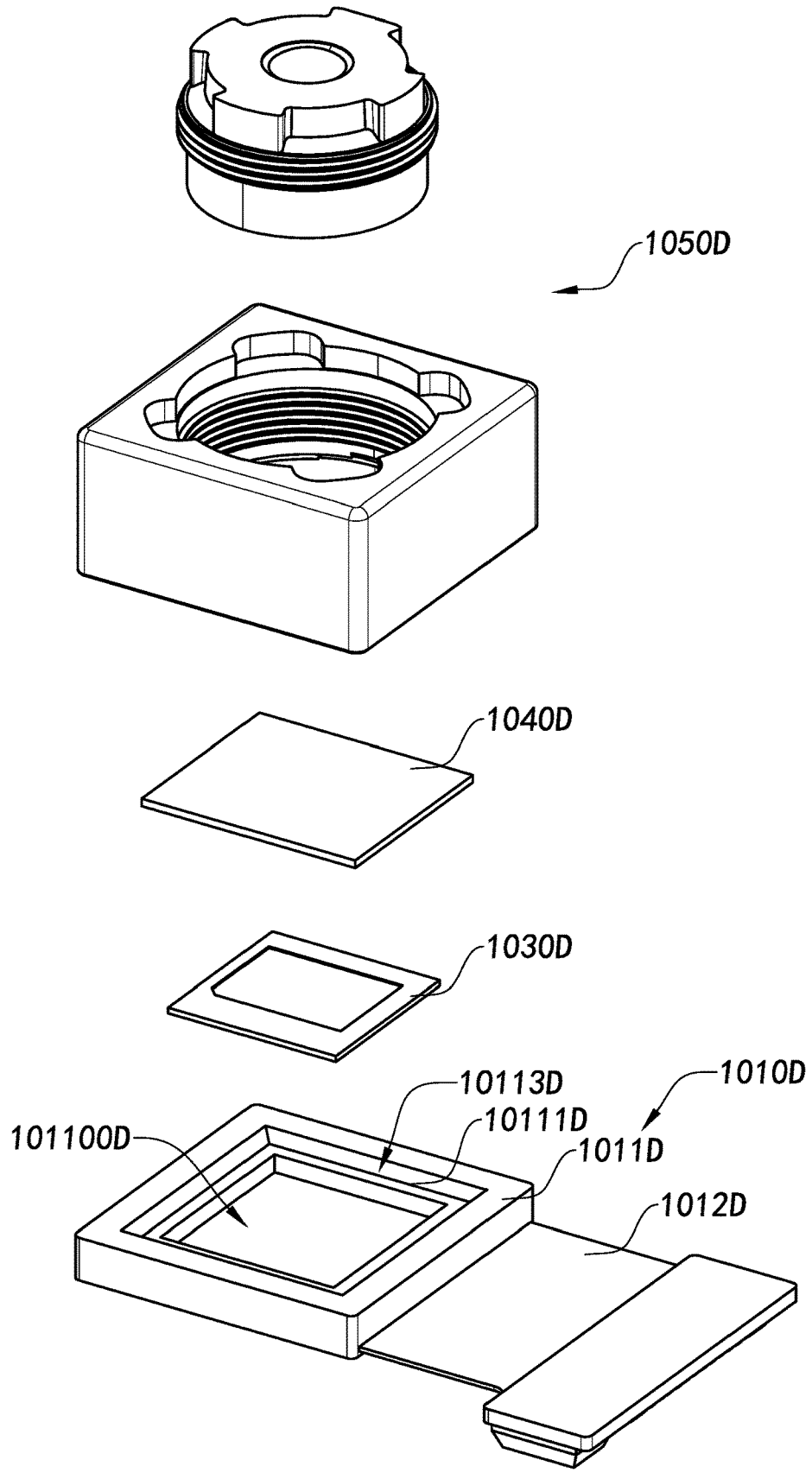
FIG. 10 is an explosive perspective view of a camera module according to the above second preferred embodiment of the present invention.
Figure 11:
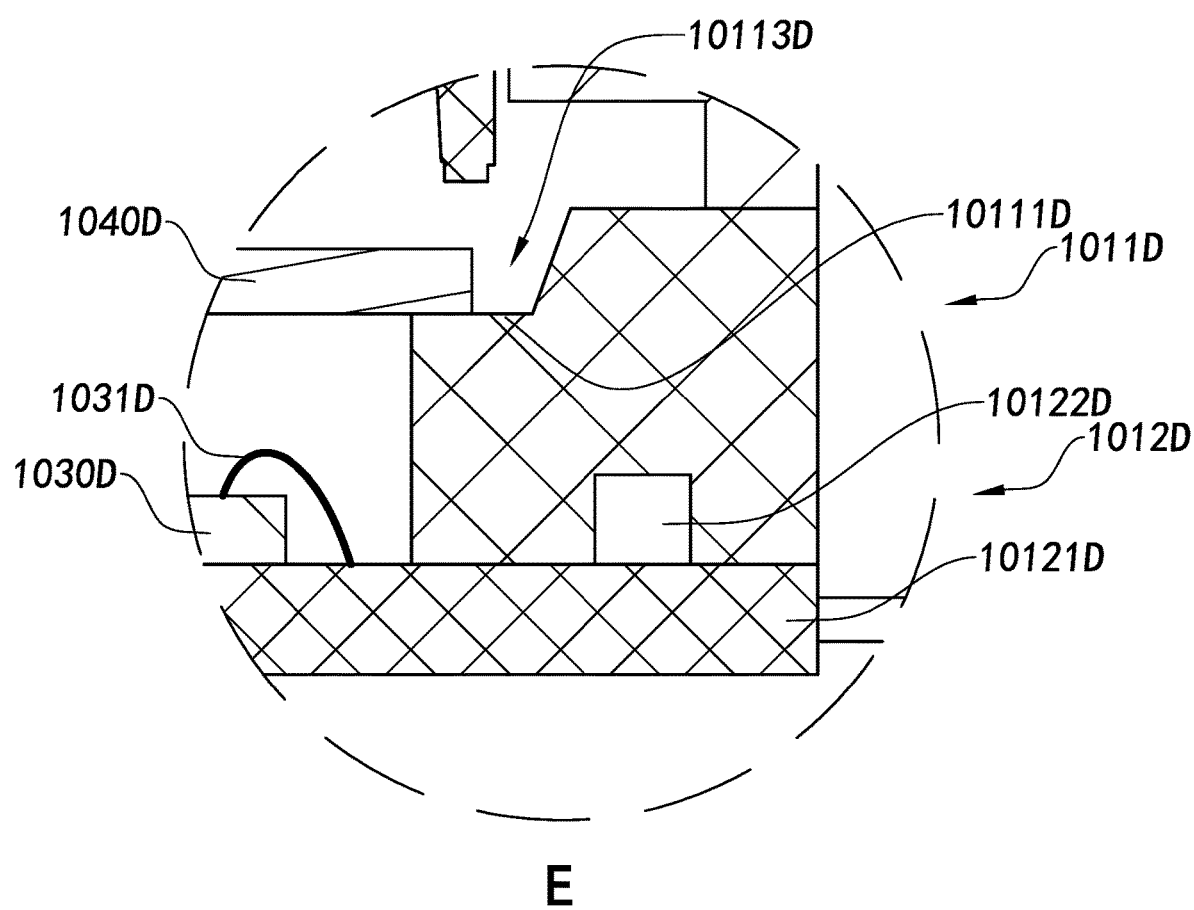
FIG. 11 is a partially enlarged perspective view of a camera module according to the above second preferred embodiment of the present invention.

FIGS. 9-11 illustrate a camera module according to a second preferred embodiment of the present invention. The camera module is a fixed focus camera module. The camera module includes a molded circuit unit 1010D, a lens 1050D, and a photosensitive chip 1030D.

The lens 1050D is installed above the molded circuit unit 1010D. Further, the molded circuit unit 1010D includes a molding portion 1011D and a circuit board part 1012D, wherein the molding portion 1011D moldingly connects the circuit board part 1012D.

The circuit board part 1012D includes a main circuit board 10121D, wherein the photosensitive chip 1030D is set on the main circuit board 10121D and in the inner side of the molding portion 1011D.

Specifically, the lens 1050D is along the path of photo-reception of the photosensitive chip 1030D, so that when the camera module is capturing image of an object, light reflected from the object can be firstly processed by the lens 1050D and then received by the photosensitive chip 1030D to be adaptable for photoelectric conversion.

Further, the circuit board part 1012D includes a photosensitive circuit and at least one circuit element 10122. The photosensitive circuit is preinstalled in the main circuit board 10121D, wherein the circuit element 10122D is electrically connected to the photosensitive circuit and the photosensitive chip 1030D to provide for the process of photosensitive work of the photosensitive chip 1030D. The circuit element 10122D can be, for example but not limited to, a resistor, a capacitor, a diode, a triode, a potentiometer, an electric relay, driver, processor, memory, and etc.

It is worth mentioning that the molding portion 1011D wraps up the circuit element 10122D in the inside, so that the circuit element 10122D will not be directly exposed in the space, which more specifically, will not be exposed in the enclosed environment that communicates with the photosensitive chip 1030D. This differs from the presenting way of the circuit element of conventional camera module, like resistance-capacitance components, so as to prevent the dust and sundries from staying on the circuit element 10122D and polluting the photosensitive chip 1030D. The molding portion 1011D forms a through hole 101100D to make the molding portion 1011D surround in the outer side of the photosensitive chip 1030D and provide a light path for the lens 1050D and the photosensitive chip 1030D.

Specifically, when manufacturing the molded circuit unit, a conventional circuit board can be used as the main circuit board 10121D and molding is conducted on the surface of the main circuit board 10121D. For example, a circuit board that has been treated by Surface Mount Technology (SMT), can be molded to form the molding portion 1011D by insert molding technique with an injection molding machine, or to form the molding portion 1011D by mold pressing technique that is commonly used in semiconductor packaging. The main circuit board 10121D can alternatively be, for example but not limited to, a rigid-flex board, a ceramic substrate (without flexible board), or a rigid PCB (without flexible board). The way to form the molding portion 1011D can possibly be, for example but not limited to, injection moulding technique or mold pressing technique. Possible material of the molding portion 1011D are, for example but not limited to, nylon, LCP (Liquid Crystal Polymer), or PP (Polypropylene) for injection moulding, and resin for mold pressing. Those skilled in the art should understand that the above possible manufacturing methods and optional materials are just to give examples to illustrate implementations of the present invention, rather than confine of the present invention.

It is also worth mentioning that the lens 1050D is installed on the molding portion 1011D of the circuit unit 1010D, so that the molding portion 1011D serves the function of the frame of a conventional camera module to support and affix the lens 1050D, but with a different assembly from the process of conventional COB technology. Frame of camera module of conventional COB technology uses pasting method to be affixed on circuit board. However, the molding portion 1011D is attached on the main circuit board 10121D with molding technique that does not require the process of pasting and affixing. The molding way has better connection stability and controllability of technological process than the pasting and fixing. Also, the glue space reserved for AA adjustment between the molding portion 1011D and the main circuit board is not required, the lead room for AA adjustment of conventional camera module is reduced, such that the thickness of camera module can be reduced. Meanwhile, the molding portion 1011D wraps up the circuit element 10122D to allow the traditional functions of frame and the circuit element to be spatially overlappingly set, rather than reserving a safe distance around the circuit components, like conventional camera module. Therefore, the height of the molding portion 1011D that has frame functions can be set in a smaller range, so as to further provide room to reduce the thickness of camera module to obtain a fixed focus camera module with smaller thickness.

Besides, the molding portion 1011D substitutes traditional frame, which avoids tilt error caused in the affixing and assembling of frame, and reduces accumulated tolerance of the assembling of camera module.

Further, the molding portion 1011D includes a susceptor 10111D, wherein the susceptor 10111D is adaptable for installing a filter 1040D, so that the filter 1040D will be above the photosensitive chip 1030D. In other words, light entered the lens 1050D reaches the photosensitive chip 1040D after it was processed by the filter 40D. The filter 1040D can be implemented as, for example but not limited to, a IR-Cut Filter (IRCF).

The susceptor 10111D of the molding portion 1011D forms an inner ring groove 10113D to provide the filter 1040D enough installation space. It is worth mentioning that the molding portion 1011D substitutes traditional frame to connect the lens 1050D to the circuit board part 1012D and to provide installation spot for the filter 1040D, so as to sensibly arrange the molding portion 1011D, the filter 1040D and the circuit element 10122D, which fully uses the free space outside of the photosensitive area of the photosensitive chip 1030D to minimize the camera module. Meanwhile, the benefit of molding technique allows the molding portion 1011D to provide the susceptor 10111D in a level and smooth matter, so that the filter 1040D can be evenly installed, which ensures the consistency of light way.

More specifically, the inner ring groove 10113D is L-ring shape and communicated to the through hole 101100D of the molding portion 1011D, so that the filter 1040D can be supported and installed along the path of photoreception of the photosensitive chip 1030D.

According to this embodiment of the present invention, the photosensitive chip 1030D is connected to the main circuit board 10121D through a series of lead wire 1031D, and electrically connected to the photosensitive circuit. The lead wire 51D can be implemented as, for example but not limited to, a gold wire, a copper wire, an aluminum wire, or a silver wire. Particularly, the photosensitive chip 1030D and the series of lead wire 1031D can be connected to the main circuit board 10121D by conventional COB method, for example but not limited to, welding. In other words, the connection between the photosensitive chip 1030D and the main circuit board 10121D can completely use existing mature technique of connection to lower the cost of technology improvement, to make full use of conventional technique and equipment, and to avoid the waste of resources. Without doubt, those skilled in the art should be able to understand that the connection between the photosensitive chip 1030D and the main circuit board 10121D may also be implemented through any other way of connection that is able to achieve the object of the present invention, wherein the present invention is not confined in this regard.

It is worth mentioning that in a conventional manufacturing process, circuit board firstly has the resistance-capacitance components attached thereon through SMT, then goes through conventional COB packaging, then has the chip attached thereon, has gold wires put thereon, and finally has the plastic frame or motor affixed thereon with glue. However, in a manufacturing method of the present invention, after the SMT, the molding portion 1011D is formed on the surface of the circuit board through molding technique, and then there are the process of chip attachment and gold wire putting.

It is worth mentioning that in this embodiment of the present invention, the photosensitive chip 121D is set on the upper surface of the main circuit board 10121D, wherein the molding portion 1011D surrounds the outer side of the photosensitive chip. When manufacturing the molded circuit unit, there are various possible manufacturing orders, for example but not limited to that, in a implementation, the photosensitive chip 1030D can be firstly installed on the main circuit board 10121D, and then the molding portion 1011D is formed in the outer side of the photosensitive chip 1030D and in the marginal place of the main circuit board 10121D and wraps up the circuit elements 10122D protruded from the main circuit board 10121D in the inside thereof. Besides in another embodiment of the present invention, the marginal place of the main circuit board 10121D can be first molded to form the molding portion 1011D and to wrap up the circuit elements 10122D protruded from the main circuit board 10121D in the inside thereof. Then the photosensitive chip 1030D can be installed on the main circuit board 10121D to be located in the inner side of the molding portion 1011D.

It is worth mentioning that the lens 1050D can also be assembled to the molded circuit unit of different embodiments of the above preferred embodiments, which makes fixed focus camera module with different structures. That is to say, the lens 1050D can respectively be assembled to the molded circuit unit 1010A, the molded circuit unit 1010B, and the molded circuit unit 1010C, to compose various fixed focus camera modules. Structures of the molded circuit units are referred to the above preferred embodiments, but repeated herein.

Figure 12:
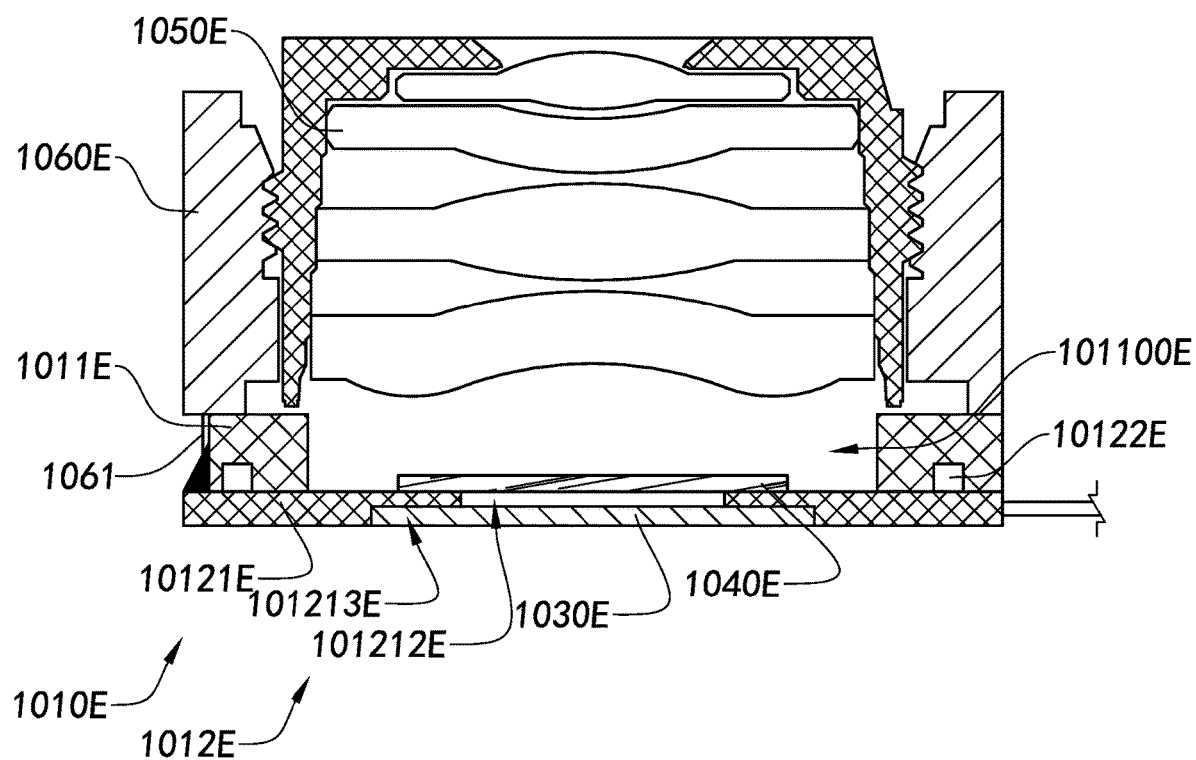
FIG. 12 is a sectional perspective view of a camera module according to a third preferred embodiment of the present invention.
Figure 13:
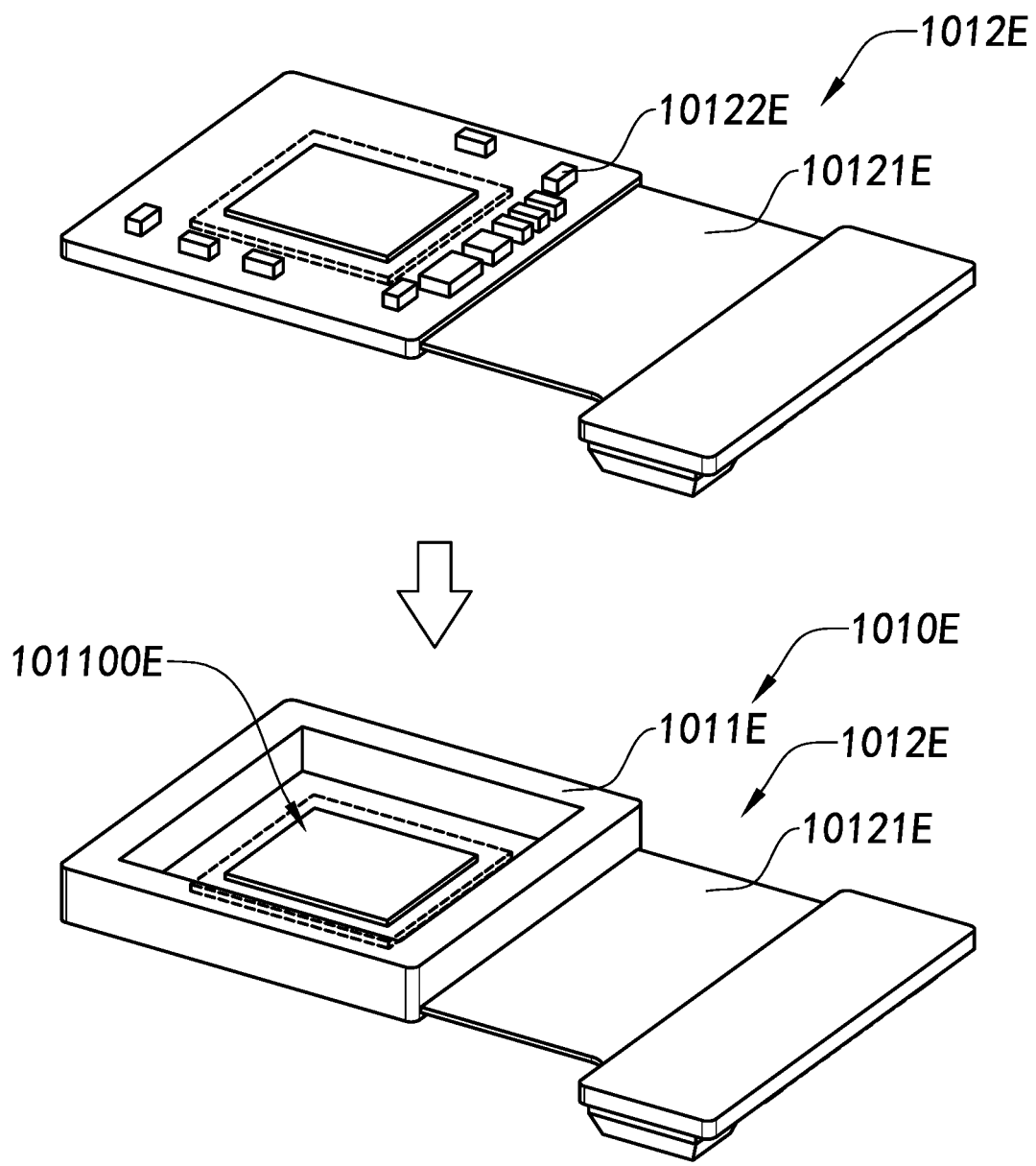
FIG. 13 is a perspective view of a forming process of molding circuit unit of the camera module according to a third preferred embodiment of the present invention.

FIGS. 12 and 13 illustrate a camera module according to a third preferred embodiment of the present invention. The camera module is a zoom lens camera module, which includes a molded circuit unit 1010E, a lens 1050E, and a motor 1060E.

The motor 1060E is installed on the molded circuit unit 1010E, wherein the lens 1050E is installed on the motor 1060E, so as to have the lens 1050E be supported above the molded circuit unit 1010E.

The molded circuit unit 1010E includes a molding portion 1011E and a circuit board part 1012E, wherein the molding portion 1011E moldingly connects the circuit board part 1012E.

The circuit board part 1012E includes a main circuit board 10121E and a photosensitive chip 1030E, wherein the photosensitive chip 1030E is set on the main circuit board 10121E and in the inner side of the molding portion 1011E.

Specifically, the motor 1060E is installed on the molding portion 1011E of the circuit unit 10E and electrically connected to the circuit board part 1012E, wherein the lens 1050E is installed on the motor 1060E and the lens 1050 is adapted to autofocus by the motor 1060E. The lens 1050 is along the path of photoreception of the photosensitive chip 1030E, so that when the camera module is capturing image of an object, light reflected from the object can be firstly processed by the lens 1050E and then received by the photosensitive chip 1030E to be adaptable for photoelectric conversion.

Further, the circuit board part 1012E includes a photosensitive circuit and at least one circuit element 10122E. The photosensitive circuit is preinstalled in the main circuit board 10121E, wherein the circuit element 10122E is electrically connected to the photosensitive circuit and the photosensitive chip 1030E to provide for the process of photosensitive work of the photosensitive chip 1030E. The circuit element 10122E can be, for example but not limited to, a resistor, a capacitor, a diode, a triode, a potentiometer, an electric relay, driver, processor, memory, and etc.

Particularly, in an embodiment of the present invention, when the camera module is being assembled, the motor 1060E is electrically connected to the photosensitive circuit through a motor pin 1061E, and the wire is soldered on the main circuit board 10121E.

It is worth mentioning that the molding portion 1011E wraps up the circuit element 10122E in the inside, so that the circuit element 10122E will not be directly exposed in the space, which more specifically, will not exposed in the enclosed environment that communicates with the photosensitive chip 1030E. This differs from the presenting way of the circuit element of conventional camera module, like resistance-capacitance components, so as to prevent the dust and sundries from staying on the circuit element and polluting the photosensitive chip. The molding portion 1011E forms a through hole 101100E to make the molding portion surround in the outer side of the photosensitive chip 1030E and provide a light path for the lens 1050E and the photosensitive chip 1030E.

Further, the main circuit board 10121E has a passage 101212E, wherein the lower part of the passage 101212E is adaptable for installation of the photosensitive chip 1030E. The passage 101212E communicates the upper and lower sides of the main circuit board 10121E, so that when the photosensitive chip 1030E is installed on the main circuit board 10121E from the back of the main circuit board 10121E and with the photosensitive area facing up, the photosensitive area of the photosensitive chip 1030E can still receive incoming light from the lens 1050E.

Further, the passage 101212E has an outer ring groove 101213E to provide installation site for the photosensitive chip 1030E. Particularly, as the photosensitive chip 1030E being installed in the outer ring groove 101213, the outer surface of the photosensitive chip 1030E is consistent with the surface of the main circuit board 10121E, which are on the same surface, so as to ensure evenness of the surface of the molded circuit unit 1010E.

In this embodiment of the present invention, the passage 101212E is step shape, which makes it easy for the installation of the photosensitive chip 1030E and provides a stable installation site for the photosensitive chip 1030E, which also makes the photosensitive area thereof present in the inner space.

It is worth mentioning that this embodiment of the present invention provides a kind of chip installation way that differs from convention, which is the flip chip method. The photosensitive chip 1030E is installed on the main circuit board 10121E from the reverse direction of the main circuit board 10121E, which is different from the above embodiment that requires installation on the main circuit board 10121 from the front side of the main circuit board 10121, which means from the upper side of the main circuit board 10121 with the photosensitive area of the photosensitive chip 1030 upwardly. This kind of structure and way of installation allows the photosensitive chip 1030E and the molding portion 1011E to be relatively independent. Installation of the photosensitive chip 1030E will not be affected by the molding portion 1011E. Molding of the molding portion 1011E also makes less impact to the photosensitive chip 1030E. Besides, the photosensitive chip 1030E is embedded in the outer side of the main circuit board 10121E without protruding to the inner side of the main circuit board 10121E, so as to leave a larger space in the inner side of the main circuit board 10121E, so that the height of the molding portion 1011E will not be limited by the height of the photosensitive chip 1030E, which allows the molding portion 1011E to achieve a smaller height.

Specifically, when manufacturing the molded circuit unit, a conventional circuit board can be used as the main circuit board 10121E and molding is conducted on the surface of the main circuit board 10121E. For example, a circuit board that has been treated by Surface Mount Technology (SMT), can be molded to form the molding portion 1011E by insert molding technique with an injection molding machine, or to form the molding portion 1011E by mold pressing technique that is commonly used in semiconductor packaging, as well as to make the passage 101212E on the main circuit board 10121E. The main circuit board 10121E can alternatively be, for example but not limited to, a rigid-flex board, a ceramic substrate (without flexible board), or a rigid PCB (without flexible board). The way to form the molding portion 1011E can possibly be, for example but not limited to, injection moulding technique or mold pressing technique. Possible materials of the molding portion 1011E are, for example but not limited to, nylon, LCP (Liquid Crystal Polymer), or PP (Polypropylene) for injection moulding, and resin for mold pressing. Those skilled in the art should understand that the above possible manufacturing methods and optional materials are just to give examples to illustrate implementations of the present invention, rather than confine of the present invention.

It is also worth mentioning that the motor 1060E is installed on the molding portion 1011E of the circuit unit 10E, so that the molding portion 1011E serves the function of the frame of a conventional camera module to support and affix the motor 1060E, but with a different assembly from the process of conventional COB technology. Frame of camera module of conventional COB technology uses pasting method to be affixed on circuit board. However, the molding portion 1011E is attached on the main circuit board 10121E with molding technique that does not require the process of pasting and fixing. The molding way has better connection stability and controllability of technological process than the pasting and fixing. Also, the glue space reserved for AA adjustment between the molding portion 1011E and the main circuit board is not required, the lead room for AA adjustment of conventional camera module is reduced, such that the thickness of camera module can be reduced. Meanwhile, the molding portion 1011E wraps up the circuit element 10122E to allow the traditional functions of frame and the circuit element to be spatially overlappingly set, rather than reserving a safe distance around the circuit components, like conventional camera module. Therefore, the height of the molding portion 1011E that has frame functions can be set in a smaller range, so as to further provide room to reduce the thickness of camera module. Besides, the molding portion 1011E substitutes traditional frame, which avoids tilt error caused in the affixing and assembling of frame, and reduces accumulated tolerance of the assembling of camera module.

It is worth mentioning that unlike the above preferred embodiment, the camera module includes a filter 1040E, wherein the filter 1040E is installed on the main circuit board 10121E and located above the photosensitive chip 1030E, which, namely, is at the upper opening of the passage 101212E of the main circuit board 10121E, so that light that entered from the lens 1050E will be firstly processed by the filter 1040E when passing through the passage 101212E. Unlike the above embodiment, the molding portion 1011E is not required to provide installation site for the filter 1040E and is not required to have the susceptor 10111. Rather, the main circuit board 11E provide installation site for the filter 1040E, which reduces distance between the filter 1040E and the photosensitive chip 1030E, so that the height of the molding portion 1011E can further be decreased.

The filter 1040E can be implemented as, for example but not limited to, a IR-Cut Filter (IRCF).

It is worth mentioning that in this embodiment of the present invention, by the way of the FC (Flip Chip) setting in the passage 101212E, the filter 1040E can be installed on the main circuit board 10121E, so as to make the circuit unit 10E and the camera module assembled of the circuit unit 10E have the advantages brought by the installation way of FC and the installation way of the filter 1040E, which includes convenience in assembling and reduced thickness. However, those skilled in the art should understand that the installation position of the filter 1040E is not a confine of the present invention, wherein, in other embodiment of the present invention, the filter 1040E can also be installed at different position, for example but not limited to, the molding portion 1011, frame, and motor.

It is worth mentioning that the molding portion 1011E substitutes traditional frame to connect the motor 1060E to the circuit board part 1012E and to provide installation spot for the filter 1040E, so as to sensibly arrange the molding portion 1011E, the filter 1040E, and the circuit element 10122E, which fully uses the free space outside of the photosensitive area of the photosensitive chip 1030E to minimize the camera module. Meanwhile, the benefit of molding technique allows the molding portion 1011E to provide the fixed position in a level and smooth matter allowing the motor 1060E to be evenly installed, which ensures the consistency of light way.

It is worth mentioning that in this embodiment of the present invention, the photosensitive chip 1030E is set on the lower surface of the main circuit board 10121E, wherein the molding portion 1011E surrounds the external rim of the main circuit board 10121E. When manufacturing the molded circuit unit 1010E, there are various possible manufacturing orders, for example but not limited to that, in an implementation, the passage 101212E can be firstly made on the main circuit board 10121E, so that the photosensitive chip 1030E can be invertly installed on the passage 101212E of the main circuit board 10121, and then the molding portion 1011E is formed in the outer side of the photosensitive chip 1030E and in the marginal place of the main circuit board 10121E and wraps up the circuit elements 10122E protruded from the main circuit board 10121E in the inside thereof. Besides, in another embodiment of the present invention, the passage 101212E can be firstly made on the main circuit board 10121E, and then the marginal place of the main circuit board 10121E can be molded to form the molding portion 1011E to wrap up the circuit elements 10122E protruded from the main circuit board 10121E in the inside thereof. Then the photosensitive chip 1030E can be installed on the main circuit board 10121E to be located in the outer ring groove 101213E of the molding portion 10121E. In another embodiment of the present invention, the marginal place of the main circuit board 10121E can be first molded to form the molding portion 1011E to wrap up the circuit elements 10122E protruded from the main circuit board 10121E in the inside thereof. Then the passage 101212E can be made on the main circuit board 10121E, so the photosensitive chip 1030E can be invert installed on the passage 101212E of the main circuit board 10121E.

It is worth mentioning that the installation way of the molded circuit unit 1010E and the filter 1040E can also be applied to fixed focus camera module.

Figure 14:
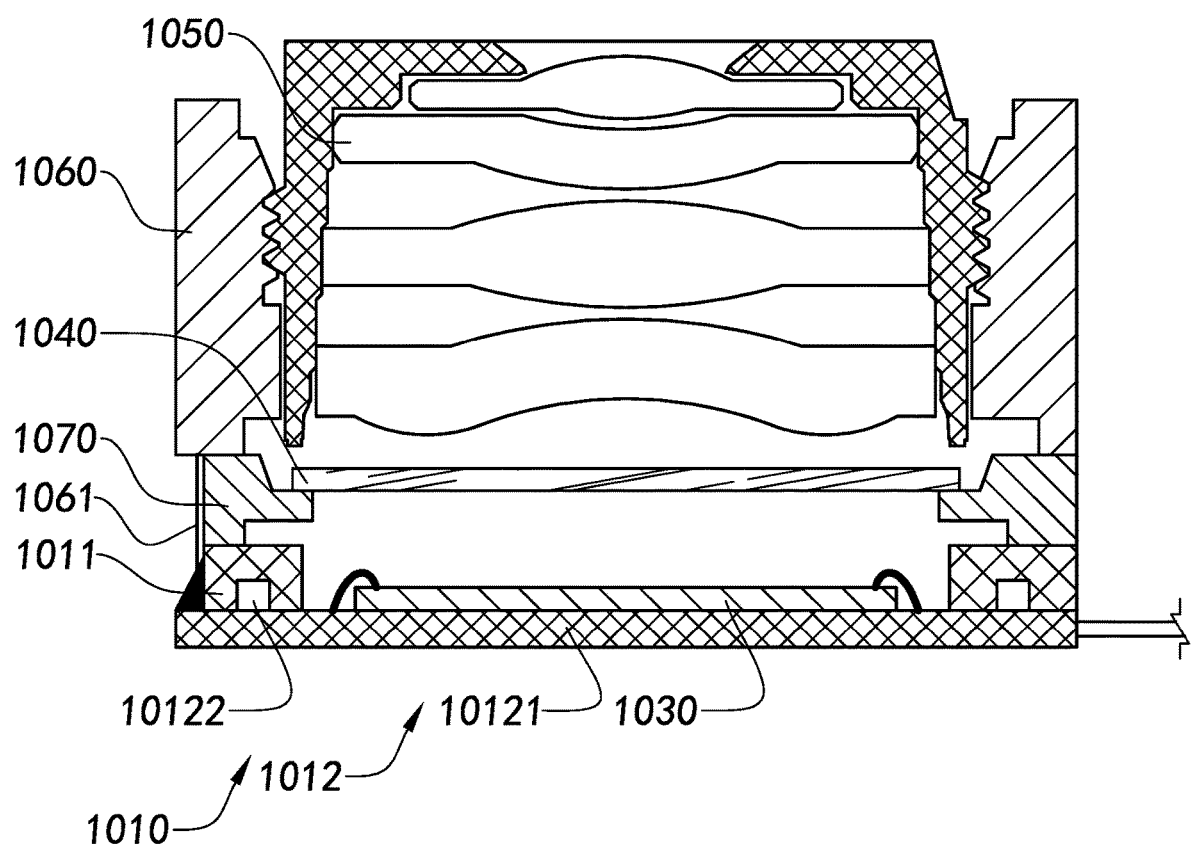
FIG. 14 is a sectional perspective view of a camera module according to a fourth preferred embodiment of the present invention.
Figure 15:
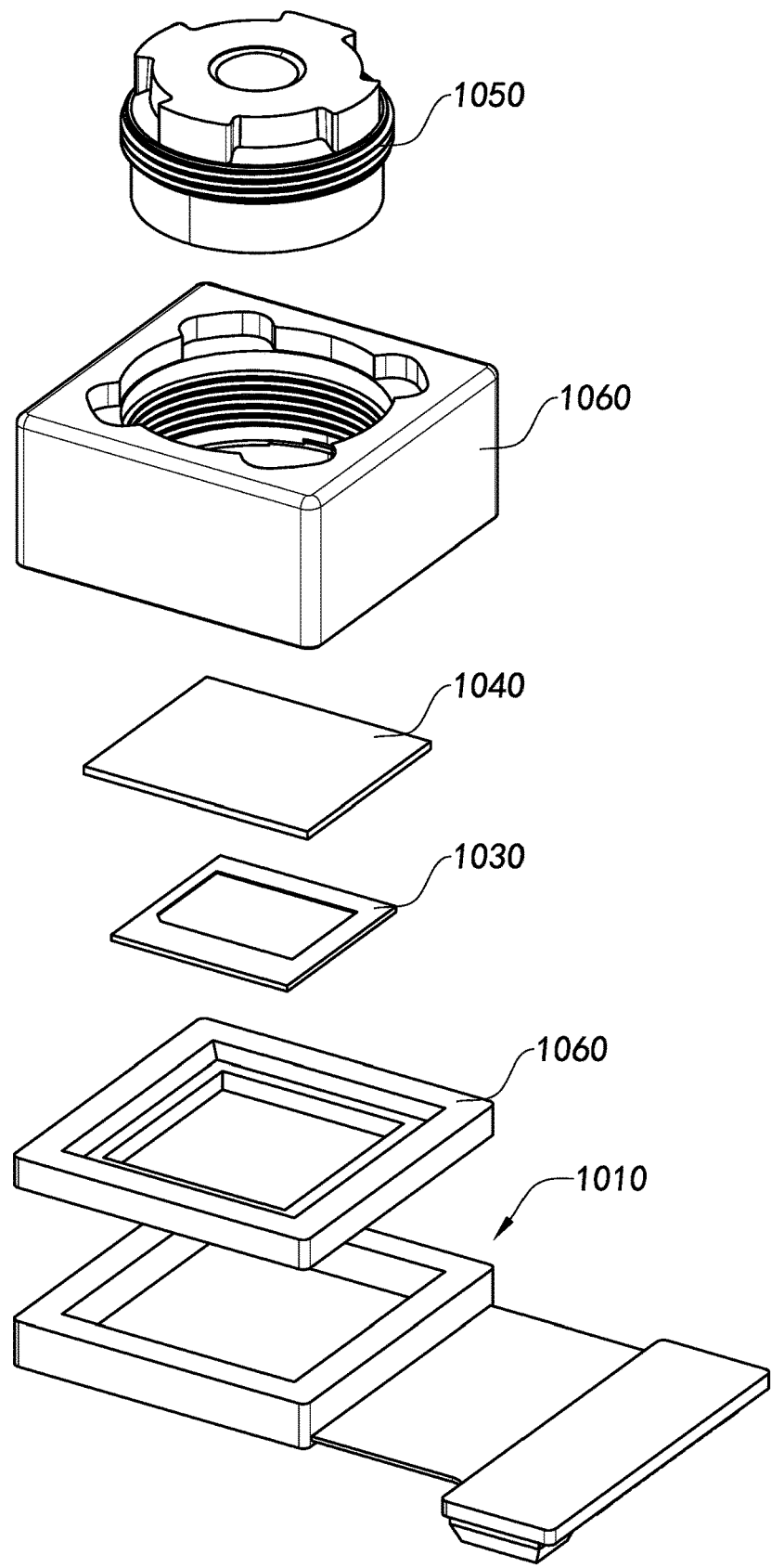
FIG. 15 is an explosive view of a camera module according to the above fourth preferred embodiment of the present invention.
Figure 16:
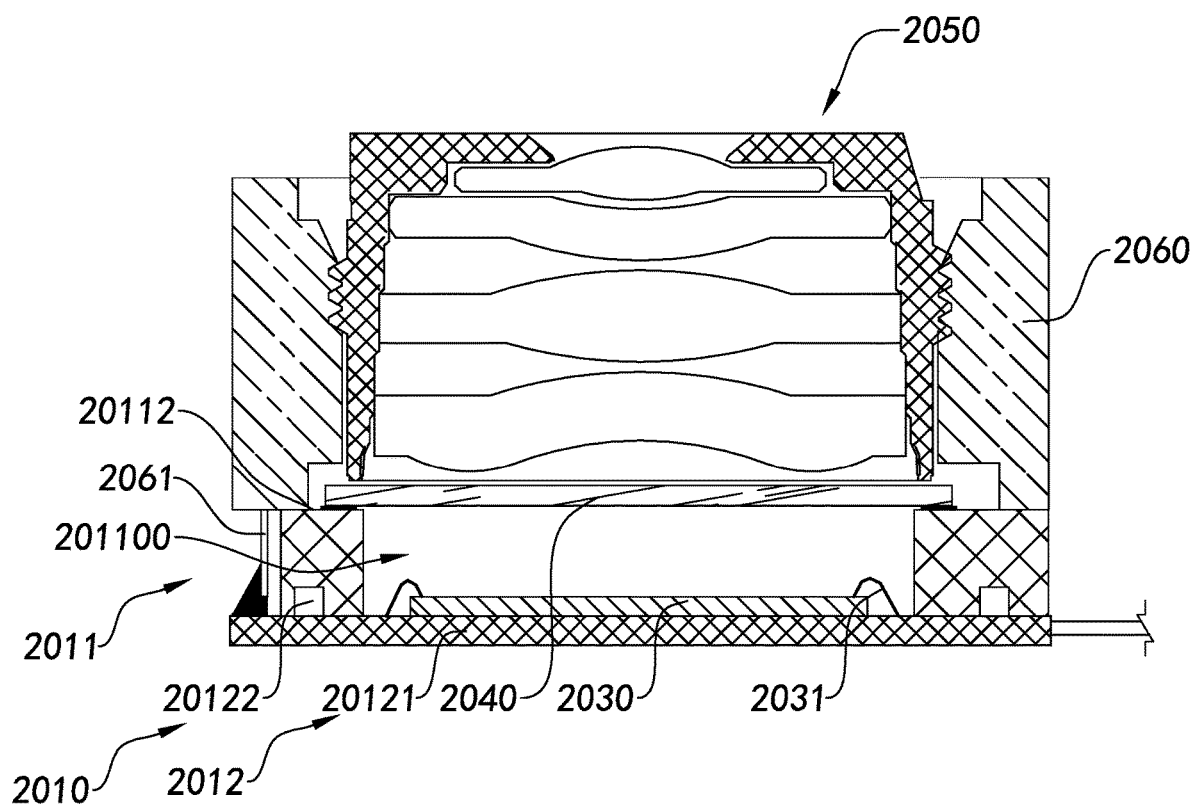
FIG. 16 is a sectional perspective view of a molding process based camera module according to a fifth preferred embodiment of the present invention.
Figure 17:
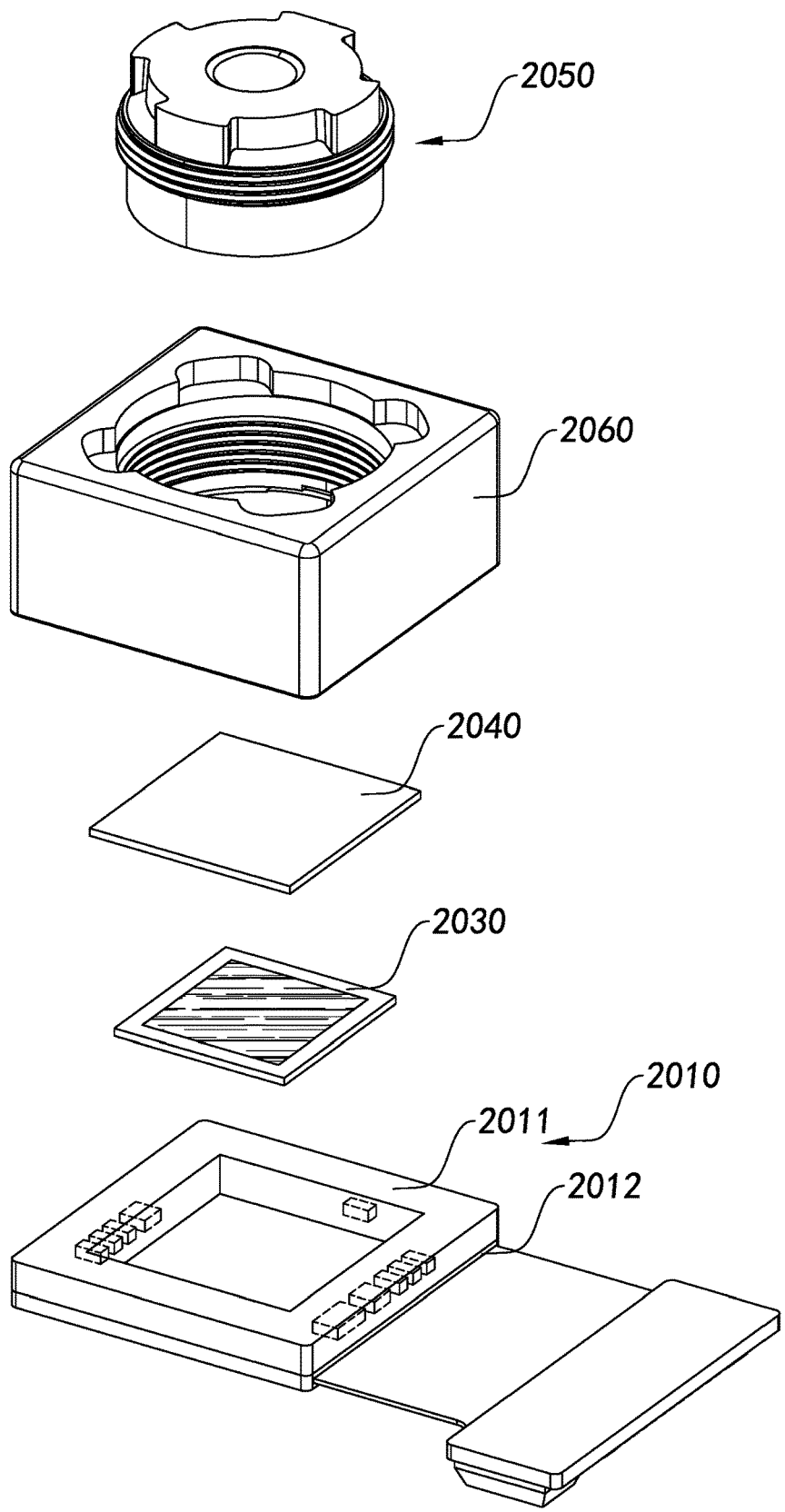
FIG. 17 is an exploded view of a molding process based camera module according to a fifth preferred embodiment of the present invention.

FIGS. 14 and 15 illustrate a camera module according to a fourth preferred embodiment of the present invention. Unlike the above first preferred embodiment, the camera module also includes a frame 1070, wherein the frame 1070 is installed on the molded circuit unit 1010, wherein the motor 1060 is installed on the molded circuit unit 1010, wherein the lens 1050 is installed on the motor 1060, so as to support and affix the lens 1050 above the molded circuit unit 1010. In other words, the molded circuit unit 1010, 1010A, 1010B, 1010C can be assembled with a conventional frame, to make different types of camera module, such as zoom lens camera module and fixed focus camera module. The filter 1040 can optionally be installed on the frame 1070, the molding portion 1011, or the motor 1060.

It can be seen from the above preferred embodiments that the application of molding technique to camera module increases product competitiveness in the market, particularly for high-end products. The camera module mainly has the following advantages:

1. Being able to reduce the size with length and width of the module. The molding part and the resistance-capacitance part can spatially overlap.

Frame with conventional solution has to be at the outer side of the capacitor and must leave a certain safe distance, while the molding manufacturing method of the present invention can directly use the capacitor room, to directly fill plastic to form a frame around the capacitor.

2. Reducing module tilt. The molding part can substitute the design of current plastic frame to decrease the accumulated tolerance.

3. The molding enhances structural strength of the circuit board. Because the molding part can act to support and therefore increase the strength, if the same final structural strength is to be achieved, the circuit board can be made thinner to lower the height of the module.

4. For altitude space, conventional solution need to reserve assembling safety space for the capacitor and frame, but molding technique does not need to reserve that, which can reduce the height of the module.

Conventional solution need to reserve a safety gap from the top of the capacitors to the frame, so as to avoid interference. However, the present invention allows filling plastic directly around the circuit elements, such as capacitors, and does not require reserving spatial gap.

5. Components like resistors and capacitors can be moldingly wrapped up, which avoids the area of these resistance-capacitance component be affected and damaged by solder resist, dust, and so on, so as to increase product yield rate.

6. Being suitable for high efficient and large scale mass production. What FIGS. 14-18C illustrate is a camera module according to a fifth preferred embodiment the present invention. The camera module includes a circuit unit 2010, a photosensitive chip 2030, and a lens 2050.

Further, the photosensitive chip 2030 is mounted on the circuit unit 2010. The lens 2050 is provided above the circuit unit 2010 and the lens 2050 is positioned in the path of photoreception of the photosensitive chip 2030. The circuit unit 2010 can be coupled with the electronic device, so as to be utilized with the electronic device. Those skilled in the art should understand that the lens 2050 and the chip can coordinate with each other to take image. Specifically, after the light reflected from the shooting subject, such as an object or person, passes through the lens 2050, it will be received by the photosensitive chip 2030 for photoelectric conversion. In other words, the photosensitive chip 2030 can convert optical signal into electrical signal and the electrical signal can be transmitted to the electronic device, so as to generate image corresponding to the shooting subject on the electronic device through the circuit unit 2010.

The circuit unit 2010 includes a packaging part 2011 and a circuit board part 2012, wherein the packaging part 2011 is integrally packagingly connected with the circuit board part 2012, such as being moldingly connected with the circuit board part 2012. More specifically, the packaging part 2011 is moldingly connected with the circuit board part through the molding on board (MOB) technology, wherein the molding technique may be injection molding, mold pressing, and etc.

The circuit board part 2012 comprises a main circuit board 20121, wherein the packaging part 2011 is integrally connected with the main circuit board 20121. The packaging part 2011 forms a through hole 201100 to make the packaging part 2011 surround in the outer side of the photosensitive chip 2030 and provide a light path for the lens 2050 and the photosensitive chip 2030. The photosensitive chip 2030 is arranged on the main circuit board 20121 at the position corresponding to the through hole 201100.

The circuit board part 2012 comprises a connecting circuit 2031 and at least a circuit element 20122, wherein the connecting circuit 2031 is preinstalled in the main circuit board 20121, wherein the circuit element 20122 is electrically connected to the connecting circuit for the process of photosensitive work of the photosensitive chip 2030. The circuit element 20122 can be, for example but not limited to, a resistor, a capacitor, a diode, a triode, a potentiometer, an electric relay, driver, processor, memory, and etc.

It is worth mentioning that the packaging part 2011 can wrap and cover the circuit element 20122 in the inside thereof, so as to keep the circuit element 20122 from being directly exposed in the space, more specifically, from being exposed in the enclosed environment that communicates with the photosensitive chip 2030. It is not like the arrangement of the circuit component in the conventional camera module, such as having the resistance-capacitance components protrude from the circuit board, such that it can prevent dust and sundries from staying on the circuit element 20122 or polluting the photosensitive chip 2030. In this embodiment of the present invention, the circuit element 20122 is protruded from the main circuit board 20121 in the exemplar, while in other embodiment of the present invention, the circuit element 20122 is embedded in the main circuit board 20121 without protruding from the main circuit board 20121. Hence, those skilled in the art should understand that the structure, type, and mounting position of the circuit element 20122 shall not be limits of the present invention. It is understandable that, in conventional camera module, circuit component protrudes from the circuit board and the base can only be installed on the outer side of the circuit element 20122, so both the circuit component and the base require certain spaces. As a result, it will demand more on the lateral dimensions of the circuit board. For the molding process based camera module of the present invention, the packaging part 2011 is integrally packaged on the main circuit board 20121 and wraps and covers the circuit element 20122, such that the spaces of the packaging part 2011 and the circuit element 20122 are overlapped, which provides extra space for arranging the packaging part 2011 inward and reduces the demand of extending the main circuit board 20121 outward. Therefore, the lateral dimensions of the camera module can be decreased, so as to satisfy more compact devices.

It is worth mentioning that the way that the packaging part 2011 wraps and covers the circuit element 20122 has an advantage in protecting the circuit element 20122 from being polluted or bumped accidentally, which is also advantageous for the corresponding camera module. However, those skilled in the art should understand that the packaging part 2011 shall not be limited in wrapping or covering the circuit element 20122. In other words, in other embodiments of the present invention, the packaging part 2011 can be directly molded on the main circuit board 20121 that has no protruding circuit element 122, or be molded at different positions including the outer side and the periphery of the circuit element 20122.

According to this embodiment of the present invention, the packaging part 2011 protrudingly surrounds around the outer side of the photosensitive chip 2030. Particularly, the packaging part 2011 is integrally closingly connected, so as to have a nice sealing quality, so that when the lens 2050 is installed along the path of photoreception of the photosensitive chip 2030, the photosensitive chip 2030 will be sealed in the inside, thereby forming a corresponding sealed inner space.

Specifically, when manufacturing the circuit unit 2010, one may utilize a conventional circuit board to be the main circuit board 20121 and then conduct molding on the surface of the main circuit board 20121. For instance, according to an embodiment, it may utilize an injection molding machine to integrally package (e.g. moldingly package) the circuit board that has been processed through SMT, through insert molding technology, so as to form the packaging part 2011. Alternatively, it may utilize the mold pressing technology that is commonly seen in semiconductor packaging to form the packaging part 2011. Further, the photosensitive chips 2030 are respectively attached on the main circuit board 20121. Then the photosensitive chips 2030 are respectively electrically connected with the main circuit board 20121, through, for example, wire bonding. The main circuit board 20121 can alternatively be, for example but not limited to, a rigid-flex board, a ceramic substrate (without flexible board), or a rigid PCB (without flexible board). The way to form the packaging part 2011 can possibly be, for example but not limited to, injection moulding technique or mold pressing technique. Possible materials of the packaging part 2011 are, for example but not limited to, nylon, LCP (Liquid Crystal Polymer), or PP (Polypropylene) for injection moulding, and epoxy resin for mold pressing. Those skilled in the art should understand that the above possible manufacturing methods and optional materials are just to give examples to illustrate implementations of the present invention, rather than confine of the present invention.

In some other embodiments of the present invention, the process to manufacture the circuit unit 2010 may also include: conducting SMT to the main circuit board 20121, attaching the photosensitive chip 2030 on the main circuit board 20121, electrically connecting the photosensitive chip 2030 to the main circuit board 20121, for example, by wire bonding, integrally packaging the main circuit board 20121, for example, through molding packaging that forms the packaging part 2011 through insert molding or through mold pressing, which is a common technology in semiconductor packaging. Those skilled in the art should understand that the specific manufacturing order of the circuit unit 2010 shall not limit the present invention.

The camera module further comprises a filter 2040, arranged on the packaging part 2011, so as to provide a stable and smooth installation condition for the filter 2040.

More specifically, according to an embodiment of the present invention, the filter 2040 is embodied as a Infra-Red Cut Filter (IR-Cut Filter, IRCF), wherein the IR-Cut Filter is an optical filter made by alternately plating a high refractive index optical film on an optical substrate with precision optics coating technology, which has high transparency for visible light (400-630 nm) and blockage for near-infrared (700-1100 nm). It can prevent the infrared light from influencing the imaging of the photosensitive chip 2030, such as CCD, CMOS, and etc. By putting in the IR-Cut Filter into the imaging system of the camera module to block part of the infrared light that influence the imaging quality of the imaging system, the image formed by the camera module can achieve a better feeling for human eye.

It is worth mentioning that the photosensitive chip 2030, such as CCD, CMOS, and etc., senses light differently from human eye. Human eye can only see visible light within the wave band of 380-780 nm, while photosensitive chip 2030 can sense a broader wave band, which includes infrared light and ultraviolet light. Especially, it is very sensitive to infrared light. Therefore, it is necessary to control the infrared light in the camera module, while remains high transparency to visible light, so as to make the sensing of the photosensitive chip 2030 closer to human eye and make the shot image of the camera module conform to the sensing of human eye. Hence, the IR-Cut Filter is indispensable for the camera module.

Particularly, according to this embodiment of the present invention, the filter 2040 can be selected from the group consisting of: wafer level IR-Cut Filter, narrow-band filter, blue glass IRCF. Those skilled in the art should understand that the type of the filter 2040 shall not limit the present invention.

In a camera module assembled with conventional COB technology, the filter is usually mounted on the plastic base that is commonly glued on the circuit board. Although the plastic base and its corresponding installation mode are not likely to cause deviation or tilt, the evenness and smoothness of the surface of the plastic frame are poor, which cannot provide an ideal installation condition for the filter 2040. According to this preferred embodiment of the present invention, the filter 2040 is mounted on the packaging part 2011 through molding process, so as to achieve a great evenness and smoothness of the surface to provide an ideal installation condition for the filter 2040. Besides, the integral molding mode can also avoid deviation or tilt of the packaging part 2011, which reduces the accumulated tolerance of the installation of the filter 2040.

According to this embodiment of the present invention, the top surface 20112 of the packaging part 2011 is integrally flat extended. The filter 2040 is mounted on the top surface 20112 of the packaging part 2011. Particularly, the filter 2040 can be connected with the top surface 20112 of the packaging part 2011 through gluing.

According to this embodiment of the present invention, the camera module comprises a motor 2060, which may be embodied as a voice coil motor, piezoelectric motor, and etc. The lens 2050 is mounted on the motor 2060, such that the lens 2050 can be driven by the motor 2060 to move, so as for adjusting the focal length of the camera module. That is to say, the camera module is a zoom lens module or an automatic focus module (AFM). Of course, the camera module may also be without any driver, namely, without the motor 2060, so as to become a fixed focus camera module.

The motor 2060 is mounted on the packaging part 2011 of the circuit unit 2010. Further, the motor 2060 is mounted on the top surface 20112 of the packaging part 2011. Namely, the filter 2040 and the motor 2060 coordinately occupy the top surface 20112 of the packaging part 2011. The motor 2060 is electrically connected with the main circuit board 20121 through at least a motor pin 2061.

The lens 2050 is mounted in the motor 2060. The motor 2060 and the filter 2040 are mounted in the packaging part 2011. Therefore, the packaging part 2011 serves the function of the base of a conventional camera module to support and affix the motor 2060 and the filter 2040 with a different manufacturing and assembling mode from the conventional COB technology. The base of camera module of conventional COB technology is attached on the circuit board by means of gluing. However, the packaging part 2011 is attached on the main circuit board 20121 through molding that does not require the process of pasting and affixing. The molding method has better connection stability and controllability of technological process than the pasting and affixing and better evenness, which creates better installation condition for the motor 2060 and the filter 2040. Also, the glue space reserved for AA adjustment of the packaging part 2011 and the main circuit board 20121 will be gone, which saves the lead room for AA adjustment of conventional camera module, such that the thickness of the camera module can be reduced. Besides, the packaging part 2011 wraps and covers the circuit element 20122 to allow the space of the conventional base and the installation space of the circuit element 20122 to be spatially overlapped, rather than reserving a safe distance around the circuit components like conventional camera module. Therefore, the packaging part 2011 that also severs as a base can be provided in a smaller size, so as to allow further reduction to the thickness of the camera module. Besides, the packaging part 2011 substitutes the traditional base, which avoids tilt error caused in the affixing and assembling of base, and reduces accumulated tolerance of the assembling of the camera module.

It is also worth mentioning that the shape of the packaging part 2011 can be determined based on the needs. For instance, it is extended inward at the position of the circuit element 20122, so as to form a protruding portion to increase the corresponding width of the packaging part 2011, wherein the packaging part 2011 extends consistently at the attire without the circuit element 20122, so as to form a more regular shape with a smaller width. Those skilled in the art should understand that the specific shape of the packaging part 2011 shall not limit the present invention.

According to this embodiment of the present invention, the photosensitive chip 2030 is electrically connected to the main circuit board 20121 through at least a connecting wire 2031, and electrically connected to the connecting circuit. The connecting wire 2031 can be implemented as, for example but not limited to, a gold wire, a copper wire, an aluminum wire, or a silver wire. Particularly, the photosensitive chip 2030 and the connecting wire 2031 can be connected to the main circuit board 20121 by conventional COB method, for example but not limited to, welding. In other words, the connection between the photosensitive chip 2030 and the main circuit board 20121 can completely use existing mature technique of connection to lower the cost of technology improvement, to make full use of conventional technique and equipment, and to avoid the waste of resources. Without doubt, those skilled in the art should be able to understand that the connection between the photosensitive chip 2030 and the main circuit board 20121 may also be implemented through any other way of connection that is able to achieve the object of the present invention, wherein the present invention is not confined in this regard.

It is worth mentioning that in this embodiment of the present invention, each the photosensitive chip 2030 is set on the upper surface of the main circuit board 20121, wherein the packaging part 2011 surrounds around the outer side of the photosensitive chip 2030. When manufacturing the circuit unit 2010, there are various possible manufacturing orders, for example but not limited to that, in an implementation, the photosensitive chip 2030 can be firstly mounted on the main circuit board 20121, and then the packaging part 2011 is molded and formed in the outer side of the photosensitive chip 2030 on the main circuit board 20121 to wrap and cover and cover the circuit elements 20122 protruded from the main circuit board 121A in the inside thereof. Besides in another implementation of the present invention, the main circuit board 20121 can be first molded to form the packaging part 2011 and to wrap and cover the circuit elements 20122 protruded from the main circuit board 20121 in the inside thereof. Then the photosensitive chip 2030 is installed on the main circuit board 20121 to be located in the inner side of the packaging part 2011.

Figure 18A:
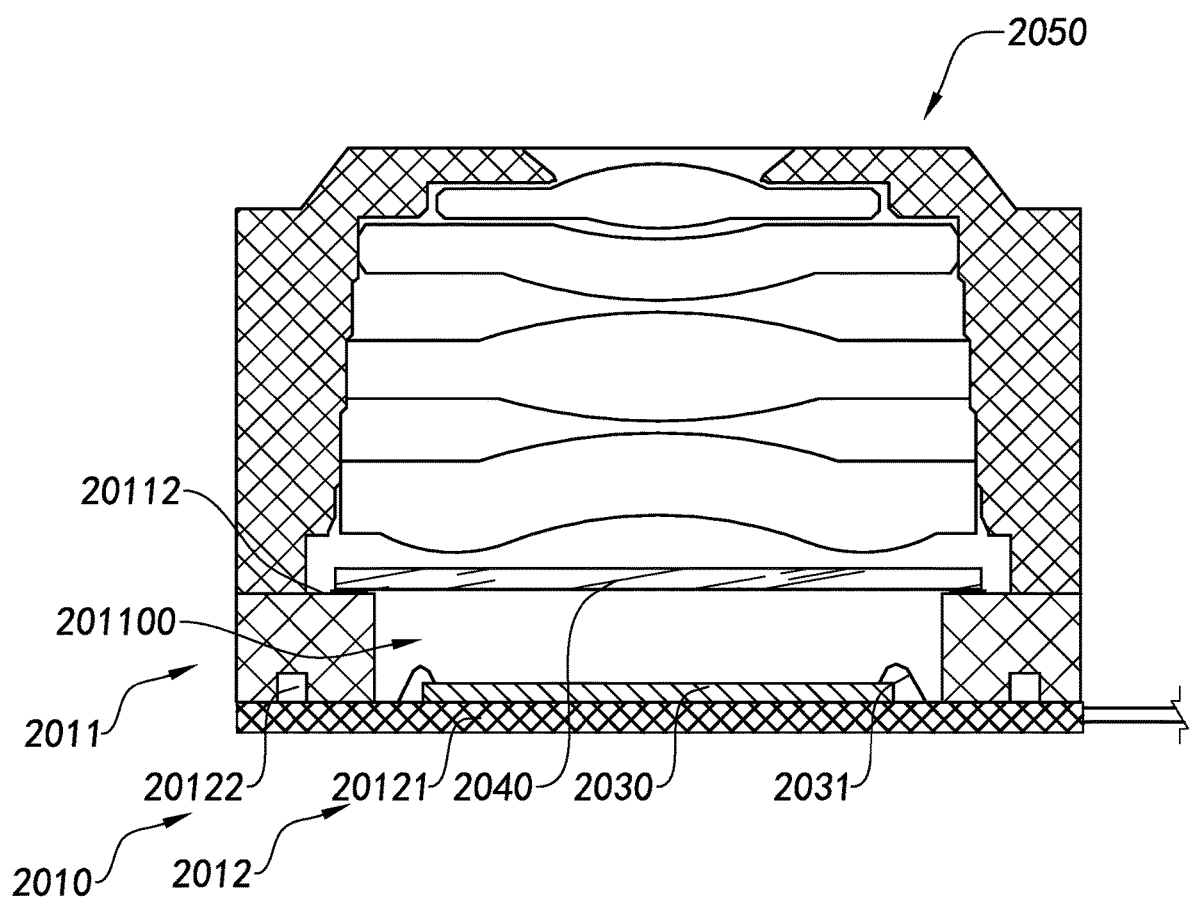
FIG. 18A illustrates a molding process based camera module according to another implementation of the above fifth preferred embodiment of the present invention.

FIG. 18A refers to the camera module according to another implementation of the above fifth preferred embodiment of the present invention, wherein the camera module can be a fixed focus module (FFM). In this camera module, the lens 2050 is mounted on the top surface 20112 of the packaging part 2011, which indicates that the focal length of the camera module cannot be adjusted freely. The lens 2050 and the filter 2040 are arranged coordinately on the top surface 20112 of the packaging part 2011. Those skilled in the art should understand that the type of the camera module shall not limit the present invention.

It is worth mentioning that, according to this preferred embodiment of the present invention, the packaging part 2011 can be utilized for supporting and mounting the filter 2040 and the lens 2050, which can serve the functions of a conventional base. However, based on the advantages of molding, the packaging part 2011 can further have its evenness and consistency controlled through the mold, so as to provide a smooth and consistent mounting setting for the filter and the lens 2050 of the camera module, which can ensure the consistency among the optic axes of the lens 2050, the filter 2040, and the photosensitive chip 2030 much more easily than conventional camera module.

Figure 18B:
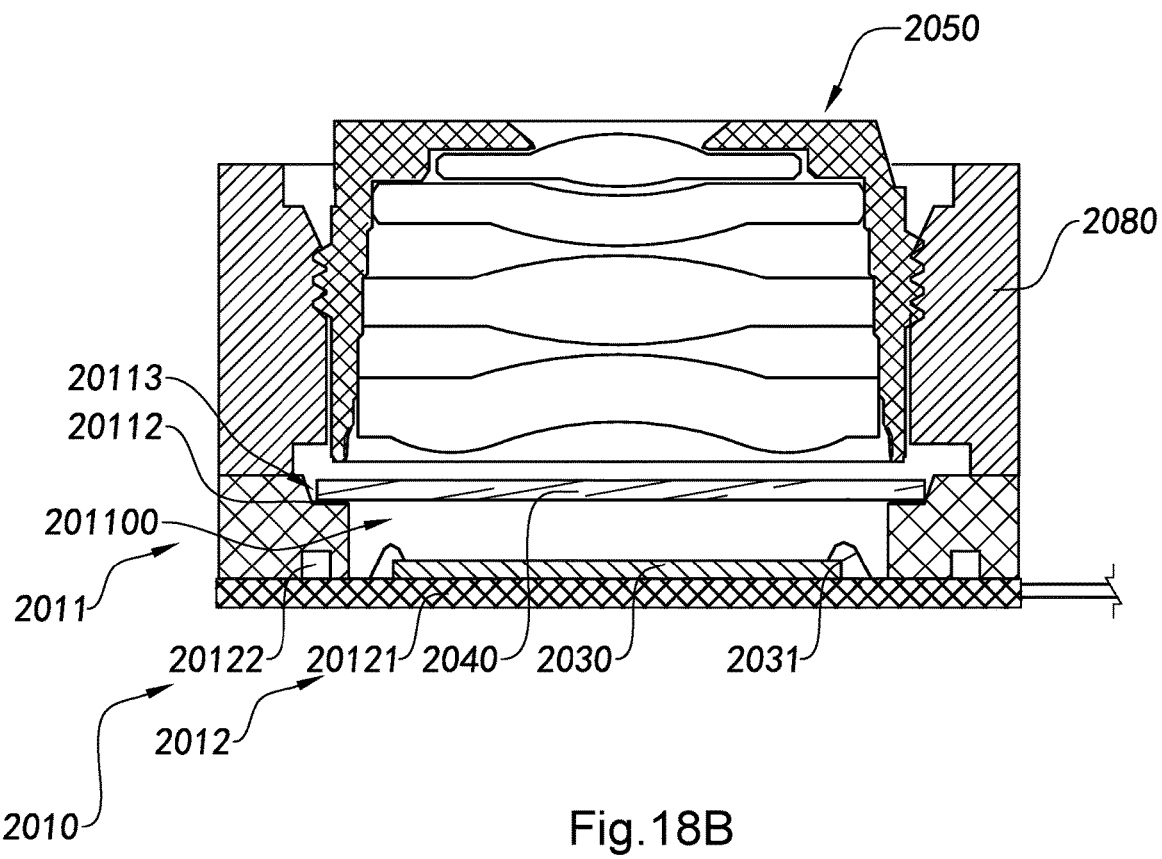
FIG. 18B illustrates a molding process based camera module according to another implementation of the above fifth preferred embodiment of the present invention.

FIG. 18B refers to the camera module according to another implementation of the above fifth preferred embodiment of the present invention, wherein the camera module can be a fixed focus module (FFM). In this camera module, the lens 2050 is mounted on a lens frame 2080 and the lens frame 2080 is mounted on the top surface 20112 of the packaging part 2011, which indicates that the focal length of the camera module cannot be adjusted freely. It is understandable that the lens frame 2080 can be a frame with thread on the inner wall thereof or a frame without thread.

Figure 18C:
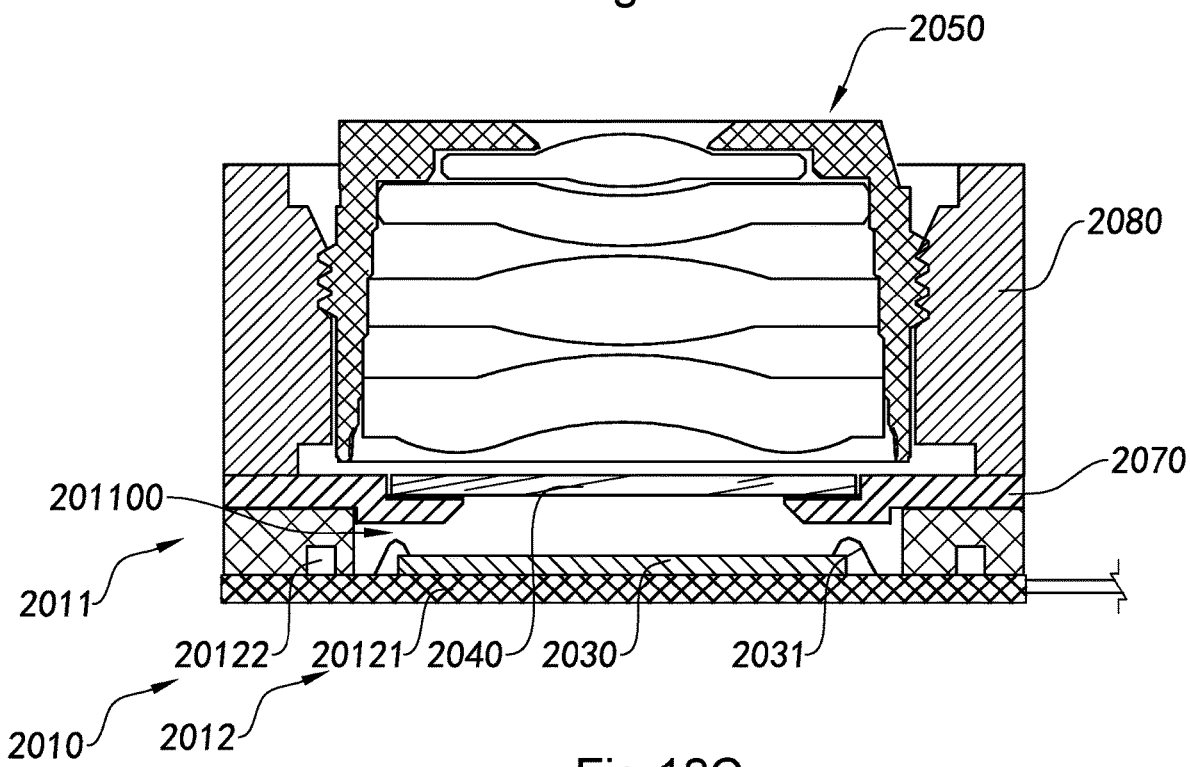
FIG. 18C illustrates a molding process based camera module according to another implementation of the above fifth preferred embodiment of the present invention.

FIG. 18C refers to the camera module according to another implementation of the above fifth preferred embodiment of the present invention, wherein the camera module can be a fixed focus module (FFM). In this camera module, the lens 2050 is mounted on a lens frame 2080, the lens frame 2080 is mounted on a support 2070, and the support 2070 is mounted on the top side of the packaging part 2011.

Figure 19:
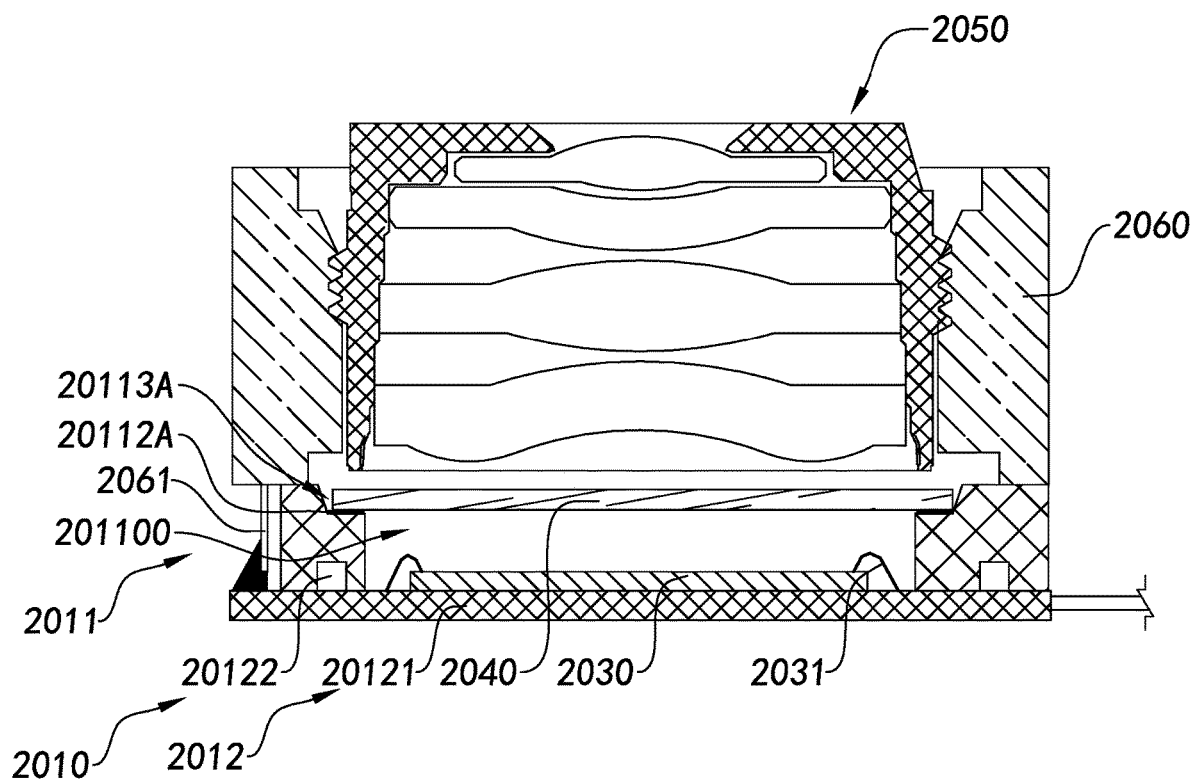
FIG. 19 is a sectional perspective view of a molding process based camera module according to a sixth preferred embodiment of the present invention.

What FIG. 19 illustrates is a camera module according to a sixth preferred embodiment of the present invention. Unlike the above preferred embodiment, the packaging part 2011 has a mounting groove 20113A arranged thereon, wherein the mounting groove 20113A is communicated with the through hole 201100, so as to provide sufficient installation space for the filter 2040. That is to say, the top surface 20112 of the packaging part 2011 is a step shaped structure, rather than being integrally extended. The steps of the top surface 20112 can be utilized for installing the filter 2040, the lens 2050, and the motor 2060.

Further, the height of the mounting groove 20113A is greater than the thickness of the filter 2040, such that when the filter 2040 is mounted in the mounting groove 20113A, the filter 2040 will not protrude from the top of the packaging part 2011.

Particularly, according to this embodiment of the present invention, the filter 2040 is square shaped, wherein the shape of the mounting groove 20113A matches with the shape of the filter 2040. In other words, the mounting groove 20113A is square-ring shaped and is communicated with the through hole 201100.

It is worth mentioning that, according to this embodiment of the present invention, the mounting groove 20113A can be utilized for mounting the filter 2040, while according to other embodiment of the present invention, the mounting groove 20113A can be utilized for mounting other parts, such as the motor 2060 or the lens 2050 of the camera module. Those skilled in the art should understand that the use of the mounting groove 20113 shall not limit the present invention.

It is worth mentioning that, according to this embodiment of the present invention, the zoom lens module is given as an example in the drawings for illustration, while according to other embodiments, the camera module may be a fixed focus module. Those skilled in the art should understand that the type of the camera module shall not limit the present invention.

Figure 20:
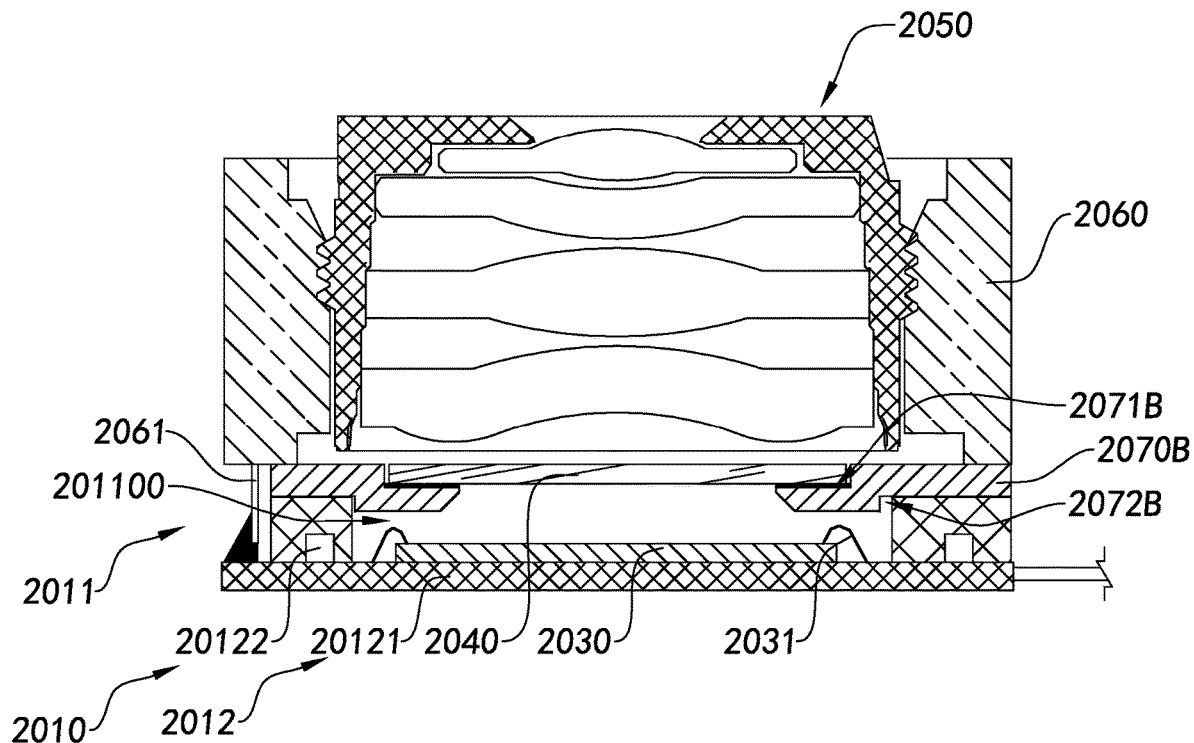
FIG. 20 is a sectional perspective view of a molding process based camera module according to a seventh preferred embodiment of the present invention.

FIG. 20 is a sectional perspective view of a molding process based camera module according to a seventh preferred embodiment of the present invention. Unlike the above preferred embodiment, the camera module comprises a support 2070B, wherein the support 2070B is adaptable for mounting the filter 2040. The support 2070B is mounted on the packaging part 2011, wherein filter 2040 is mounted on the packaging part 2011, wherein the motor 2060 or the lens 2050 is mounted on the support 2070B.

According to this embodiment of the present invention, the support 2070B has a first support groove 2071B and a second support groove 2072B, wherein the first support groove 2071B is for mounting the filter 2040, such that the surface of the filter 2040 will not protrude from the top of the support 2070B. The second support groove 2072B is for being mounted on the packaging part 2011, such that the packaging part 2011 can be extended upward from the support 2070 and the position of the filter 2040 is relatively low, so as to reduce the back focal length of the camera module.

In other words, the support 2070B is extended into the through hole 201100 and extended downward, so as to keep the filter 2040 supported above the photosensitive chip 2030. By utilizing the space in the through hole 201100, the filter 2040 can be stably mounted and the filter 2040 will not occupy external space.

It is worth mentioning that the distance that the support 2070B extends inward is out of the photosensitive area of the photosensitive chip 2030. Namely, the support 2070B will not cover the photosensitive area of the photosensitive chip 2030, so as not to influence the photosensitive process of the photosensitive chip 2030. The dimensions of the support 2070B can be designed based on actual needs.

According to this embodiment and corresponded figures of the present invention, a zoom lens module is utilized as an example for illustration, wherein the lens 2050 is mounted on the motor 2060 and the motor 2060 is mounted on the support 2070B. In other words, the support 2070 provides installation sites for the filter 2040 and the motor 2060. According to some other embodiments of the present invention, the camera module may also be a fixed focus module. The lens 2050 is mounted on the support 2070B.

Namely, the support 2070B provides installation sites for the filter 2040 and the lens 2050. Those skilled in the art should understand that the specific structure of the support 2070B and the type of the camera module shall not limit the present invention.

Figure 21:
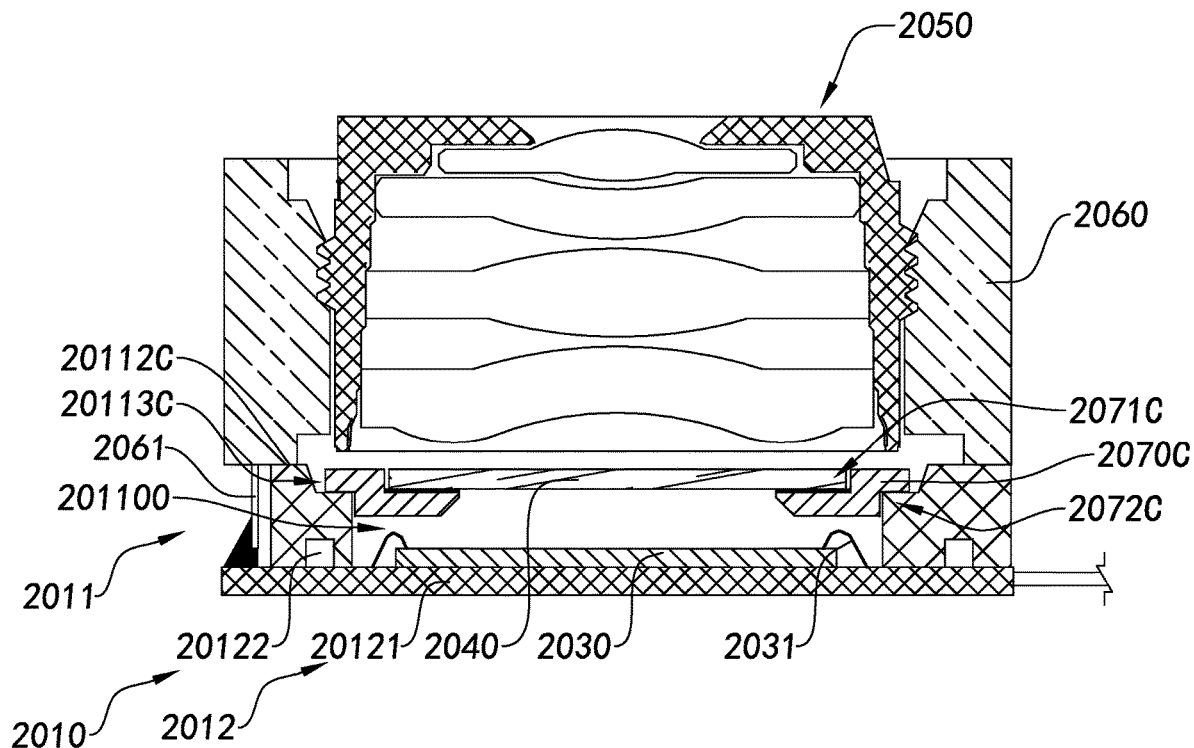
FIG. 21 is a sectional perspective view of a molding process based camera module according to a eighth preferred embodiment of the present invention.

FIG. 21 is a sectional perspective view of a molding process based camera module according to a eighth preferred embodiment of the present invention. Unlike the above preferred embodiment, the packaging part 2011 has a mounting groove 20113C arranged thereon, wherein the mounting groove 20113C is communicated with the through hole 201100. In other words, the top surface 20112 of the packaging part 2011 is in a step shaped structure, rather than being integrally extended.

The camera module comprises a support 2070C, wherein the support 2070C is adaptable for the installation of the filter 2040. The support 2070C is mounted on the packaging part 2011, wherein filter 2040 is mounted on the packaging part 2011, wherein the motor 2060 or the lens 2050 is mounted on the packaging part 2011.

Further, the support 2070C is mounted on the mounting groove 20113C of the packaging part 2011, wherein the height of the mounting groove 20113C is greater than the mounting height of the support 2070C, such that the support 2070C will not protrude from the end of the packaging part 2011. Namely, the support 2070C can be provided in the inside of the packaging part 2011.

According to this embodiment of the present invention, the support 2070C has a first support groove 2071C and a second support groove 2072C, wherein the first support groove 2071C is for mounting the filter 2040, such that the surface of the filter 2040 will not protrude from the top of the support 2070C. The second support groove 2072C is for being mounted on the packaging part 2011, such that the packaging part 2011 can be extended upward from the support 2070C and the position of the filter 2040 is relatively low, so as to reduce the back focal length of the camera module. It is understandable that, according to other alternative mode, the support 2070C may also have no second support groove 2072C mentioned above that the smooth and even bottom surface of the support 72C is directly attached on the packaging part 2011.

In other words, the support 2070C is extended into the through hole 201100 and extended downward, so as to keep the filter 2040 supported above the photosensitive chip 2030. By utilizing the space in the through hole 201100, the filter 2040 can be stably mounted and the filter 2040 will not occupy external space. Further, the support 2070 is located on the outer side of the photosensitive area of the photosensitive chip 2030, so as not to block the path of photoreception of the photosensitive chip.

It is worth mentioning that the distance that the support 2070C extends inward is out of the photosensitive area of the photosensitive chip 2030. Namely, the support 2070C will not cover the photosensitive chip 2030, so as not to influence the photosensitive process of the photosensitive chip 2030. The dimensions of the support 2070C can be designed based on actual needs.

Unlike the above third preferred embodiment, the second support groove 2072C matches with the mounting groove 20113C of the packaging part to form a matched buckle structure, such that the support 2070C can be stably mounted on the mounting groove 20113C. Comparing with the third preferred embodiment, the distance between the filter 2040 and the photosensitive chip 2030 is shorter in this embodiment, so as to provide a camera module with shorter back focal length.

According to this embodiment and corresponded figures of the present invention, a zoom lens module is utilized as an example for illustration, wherein the lens 2050 is mounted on the motor 2060 and the motor 2060 is mounted on the support 2070C. In other words, the support 2070C provides installation sites for the filter 2040 and the motor 2060. According to some other embodiments of the present invention, the camera module may also be a fixed focus module. The lens 2050 is mounted on the support 2070C. Namely, the support 2070C provides installation sites for the filter 2040 and the lens 2050. Those skilled in the art should understand that the specific structure of the support 2070 and the type of the camera module shall not limit the present invention.

Figure 22:
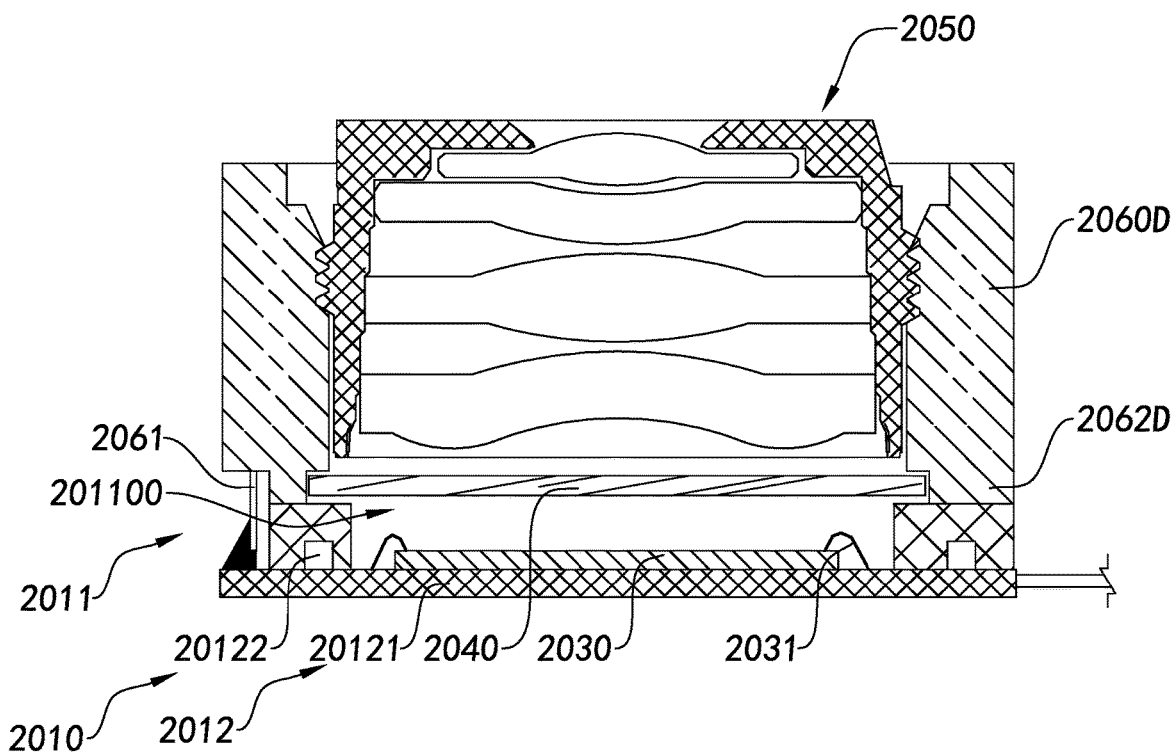
FIG. 22 is a sectional perspective view of a molding process based camera module according to a ninth preferred embodiment of the present invention.

FIG. 22 is a sectional perspective view of a molding process based camera module according to a ninth preferred embodiment of the present invention. Unlike the above preferred embodiment, the filter 2040 is mounted on a motor 2060D and the motor 2060D is mounted on the packaging part 2011, such that it does not require additional component in mounting the filter 2040.

The motor 2060D comprises a lower end 2062D, wherein the lower end 2062D is adaptable for being mounted on the filter 2040. In other words, the lens 2050 is mounted on the upper end of the motor 2060D, while the filter 2040 is mounted on the lower end 2062D of the motor 2060D below the lens 2050.

According to this embodiment of the present invention, the filter 2040 is mounted on the motor 2060D, such that it does not require additional component in mounting the filter 2040. Besides, the motor 2060D is directly mounted on the packaging part 2011. A smooth and even installation condition is provided for the motor 2060D.

Figure 23:
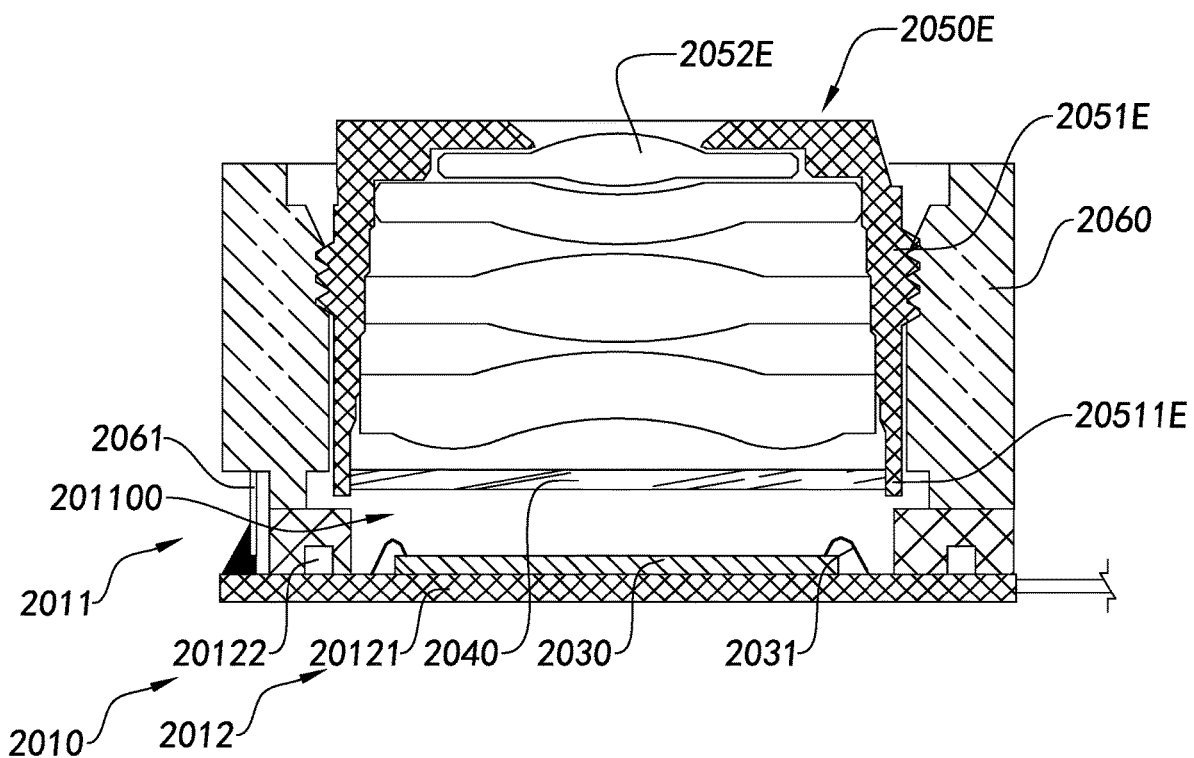
FIG. 23 is a sectional perspective view of a molding process based camera module according to a 10th preferred embodiment of the present invention.

FIG. 23 is a sectional perspective view of a molding process based camera module according to a 10th preferred embodiment of the present invention. Unlike the above preferred embodiment, the lens 2050E comprises a lens cone 2051E and at least an optic 2052E arranged in the lens cone 2051E.

According to this embodiment of the present invention, the filter 2040 is mounted in the lens cone 2051E below all the optic 2052E, such that it does not require additional component in mounting the filter 2040.

More specifically, the lens cone 2051E comprises a bottom 20511E, adaptable for the installation of the filter 2040. The shape of the base of the lens cone 2051E matches the shape of the filter 2040. In other words, the base is in a hollow square shape, so as for the filter 2040 to be accommodated and mounted therein. The upper part of the lens cone 2051E is utilized for mounting the optic 2052E, which shape matches therewith, while the lower part of the lens cone 2051E is utilized for mounting the filter 2040, which shape matches therewith as well. Therefore, overall the upper part of the lens cone 2051E is in a round tubular column shape, while the inside of the lower part thereof is square shaped. Besides, the tubular part and the square part are integrally connected.

The motor 2060 is mounted on the packaging part 2011 and the filter 2040 is mounted on the lens cone 2051E, such that it does not require additional component in mounting the filter 2040.

Figure 24:
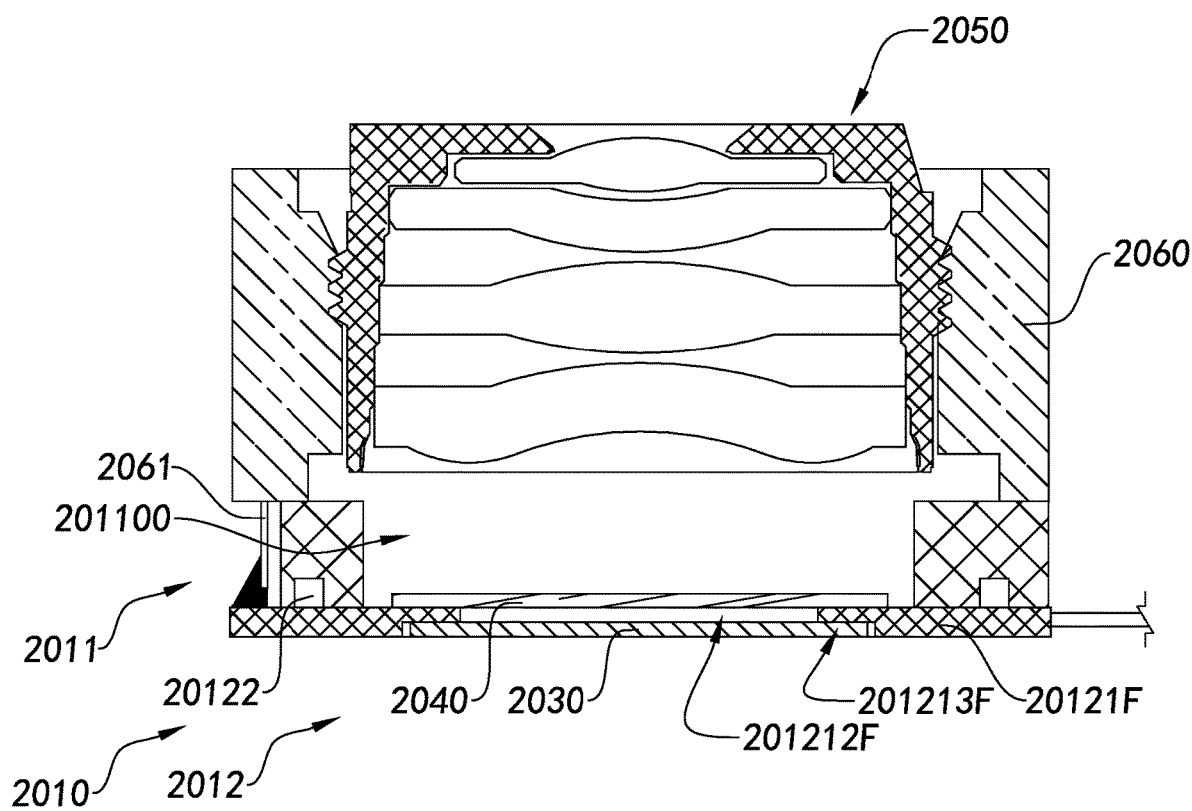
FIG. 24 is a sectional perspective view of a molding process based camera module according to a 11th preferred embodiment of the present invention.

FIG. 24 is a sectional perspective view of a molding process based camera module according to an 11th preferred embodiment of the present invention. Unlike the above preferred embodiment, the circuit unit 2010 comprises a main circuit board 20121F, wherein the main circuit board 20121F has a passage 201212F, wherein the lower part of the passage 201212F is adaptable for mounting the photosensitive chip 2030. The passage communicates the upper and lower sides of the main circuit board 20121F, so that when the photosensitive chip 2030 is installed on the main circuit board 20121F from the back of the main circuit board 20121F and with the photosensitive area facing up, the photosensitive area of the photosensitive chip 2030 can still receive incoming light from the lens 2050.

Further, the main circuit board 20121F has an outer groove 201213F, communicating with the corresponding passage to provide installation site for the photosensitive chip 2030. Particularly, as the photosensitive chip 2030 being installed in the outer groove 201213F, the outer surface of the photosensitive chip 2030 is consistent with the outer surface of the main circuit board 20121F, which are on the same surface, so as to ensure evenness of the surface of the circuit unit 2010.

In this embodiment of the present invention, the passage is step shape, which makes it easy for the installation of the photosensitive chip 2030 and provides a stable installation site for the photosensitive chip 2030, which also makes the photosensitive area thereof present in the inner space.

It is worth mentioning that this embodiment of the present invention provides a kind of chip installation way that differs from convention, which is the flip chip (FC) method. The photosensitive chip 2030 is installed on the main circuit board 20121F from the reverse direction of the main circuit board 20121F, which is different from the above embodiment that requires installation on the main circuit board 20121F from the front side of the main circuit board 20121F, which means from the upper side of the main circuit board 20121F with the photosensitive area of the photosensitive chip 2030 upwardly. This kind of structure and way of installation allows the photosensitive chip 2030 and the packaging part 2011 to be relatively independent. Installation of the photosensitive chip 2030 will not be affected by the packaging part 2011. Molding of the packaging part 2011 also makes less impact to the photosensitive chip 2030. Besides, the photosensitive chip 2030 is embedded in the outer side of the main circuit board 20121F without protruding to the inner side of the main circuit board 20121F, so as to leave a larger space in the inner side of the main circuit board 20121F, so that the height of the packaging part 2011 will not be limited by the height of the photosensitive chip 2030, which allows the packaging part 2011 to achieve a smaller height.

It is worth mentioning that according to this embodiment of the present invention, the filter 2040 is mounted on the upper end of the passage. Namely, the filter 2040 is covered on the passage of the main circuit board 20121F and it does not have to mount the filter 2040 on the packaging part 2011, such that the back focal length of the camera module can be decreased and, therefore, the height of the camera module can be decreased. Particularly, the filter 2040 can be embodied as a IR-Cut Filter (IRCF). In other words, the filter 2040 is mounted on the main circuit board 20121F directly, rather than relying on any extra components, such as the support.

Figure 25A:
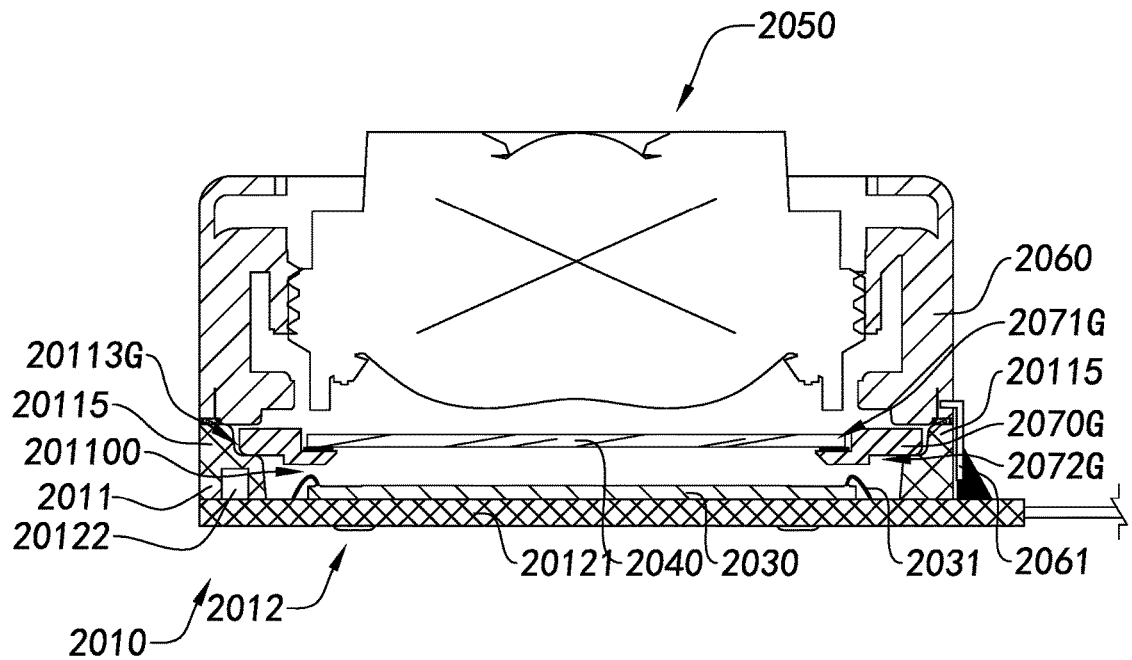
FIGS. 25A and 25B are sectional views in different angle illustrating the molding process based camera module according to a 12th preferred embodiment of the present invention.
Figure 25B:
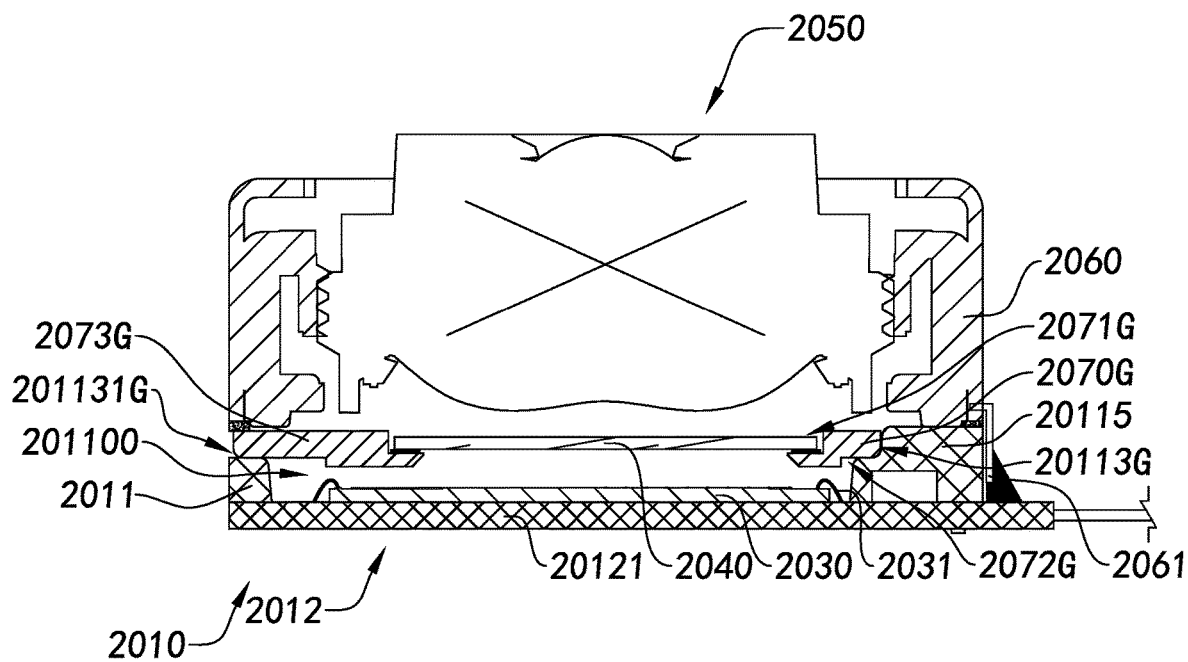
Figure 26:
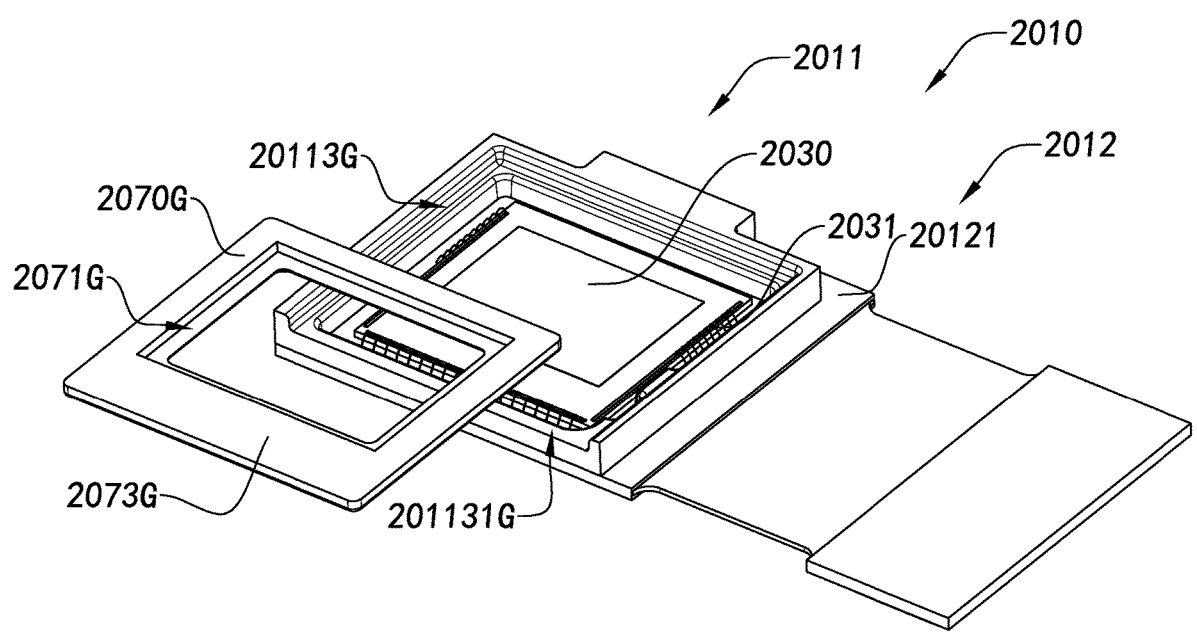
FIG. 26 is a perspective view of a molding process based camera module according to a 12th preferred embodiment of the present invention.

FIGS. 25A-26 illustrate a molding process based camera module according to a 12th preferred embodiment of the present invention. Unlike the above preferred embodiment, the packaging part 2011 has a mounting groove 20113G arranged thereon, wherein the mounting groove 20113G is communicated with the through hole 201100. In other words, the top surface 20112G of the packaging part 2011 is in a step shaped structure, rather than being integrally extended.

Further, the camera module comprises a support 2070G, wherein the support 2070G is adaptable for the installation of the filter 2040. The support 2070G is mounted on the packaging part 2011, wherein filter 2040 is mounted on the support 2070G, wherein the motor 2060 or the lens 2050 is mounted on the packaging part 2011. For instance, the support 2070G can be affixedly mounted on the packaging part 2011 through gluing.

Further, the packaging part 2011 comprises protruding steps 20115G on at least two sides of the top side thereof, while there is no protruding step 20115G on at least one side thereof, so as to for the mounting groove 20113G there. In other words, according to this embodiment, the lateral section of the mounting groove 20113G is not a closed structure, but having a gap 201131G on at least one side. In order for the stability, it may provide at least two symmetrical protruding steps 20115G, which, namely, forms two symmetrical mounting grooves 20113. For example, the quantity of the protruding step 20115G provided can be one, two, three or four. When two protruding steps 20115G are provided, they can optionally be arranged on two sides that are symmetrical and, therefore, form the gaps 201131G respectively on the other two symmetrical sides. When three protruding steps 20115G are provided, they can optionally be arranged on any three sides and, therefore, form one gap 201131G. When four protruding steps 20115G are provided, there will be no gap 201131G formed, which means that the protruding step 20115G forms the mounting groove 20113G in a closed and sealed manner. According to different embodiment, the support 2070G may match with the protruding steps 20115 of various structures and the mounting groove 201131G formed thereby. When the support 2070G is mounted on the mounting groove 20113G, the gap 201131G will be filled out, so as to create a closed internal environment for the photosensitive chip 2030. In other words, the support 2070G can be extended to the gap 201131G.

It is worth mentioning that the shape of the protruding step 20115G can be in a regular linear structure or an irregular curvy structure. Correspondingly, the sectional structure of the support 2070G can be in a regular structure or an irregular curvy structure.

Further, the support 2070G comprises at least an extending rim 2073G corresponding to the gap 201131G of the mounting groove 20113G. Particularly, the quantity and position of the extending rim 2073G correspond to the quantity and position of the gap 201131G. Certainly, when there are four the protruding step 20115G, it will form a closed structure. As result, it will be unnecessary to provide any the extending rim 2073G. Every side of the support 2070 corresponds to the mounting groove 20113G. Certainly, according to another embodiment of the present invention, the packaging part 2011 may not provide the protruding step 20115G. In other words, the packaging part 2011 forms a platform structure and the support 2070 is mounted on the platform structure. Correspondingly, the support 2070G will comprise four extending rims 2073G, respectively adapted for lapping on the rims of the packaging part 2011 respectively. The width of each extending rim can be determined based on the width of the packaging part 2011, instead of being limited in a single width. In other words, the support may have wider extending rims 2073G or narrower extending rims 2073G.

The support 2070G is mounted on the mounting groove 20113G of the packaging part 2011, wherein the height of the mounting groove 20113G is greater than the mounting height of the support 2070G, such that the support 2070G will not protrude from the top of the packaging part 2011. For example, the height of the mounting groove 20113G is greater than the height of the support 2070G for 0.05 mm, such that when the motor 2060 is mounted on the packaging part 2011, the bottom of the motor 2060 will not directly contact the support 2070G and the lens being mounted in the motor 2060 will not contact the support 2070G as well. It is worth mentioning that, according to this embodiment of the present invention, for the example of a zoom lens camera module, the motor is mounted on the packaging part 2011. Nevertheless, according to another embodiment of the present invention, the camera module can also be a fixed focus module that the lens 2050 is mounted on the packaging part 2011. Particularly, the support 2070G and the optic and the lens cone of the lens 2050 will not contact one another directly.

It is understandable that when the size of the photosensitive chip 2030 is bigger and the wall thickness of the packaging part 2011 is smaller, the above arrangement and design can also allow the packaging part 2011 to provide space for mounting the support 2070G, so as for mounting the filter. Referring to FIGS. 11A-12, the packaging part 2011 may have the protruding steps 20115 formed on three sides of the top thereof, while the side without protruding step 20115 can directly be utilized for supporting the support 2070G. Referring to the sectional view of FIG. 25A, it can be seen that there are protruding steps 20115 on the left and right sides, wherein the inner side thereof is for mounting the support 2070G. Referring to another section view illustrated in FIG. 25B, the top surface of the left packaging part 2011 directly supports the support 2070G, while the inner side of the right protruding step 20115 is for stopping and limiting the support 2070G.

Besides, in this embodiment, the top surface of the protruding step 20115 may be higher than the top surface of the support 2070G, such that when the motor 2060 is attached on the protruding step 20115, because the packaging part 2011 is integrally formed and the motor 2060 only contacts the protruding step 20115 of the packaging part 2011, the tilt of the motor 2060 can be decreased.

It is worth mentioning that the circuit element 20122 may not be arranged on the main circuit board 20121 evenly. Therefore, the reserved position for the packaging part 2011 on the main circuit board 20121 may not be regular and symmetrical. For example, it may leave a broader space in the side of the circuit element 20122 and leave a narrower space in the side that has no circuit element 20122. The issue in this case is that it becomes hard to provide the mounting groove on the narrower of the packaging part. However, in this embodiment of the present invention, the mounting groove 20113G is U-shaped, such that the mounting groove 20113G is communicated to the outside in the narrower side of the packaging part 2011 and the mounting groove 20113G is only communicated to the through hole 201100, rather than the outside, in the broader side of the packaging part 2011, which eventually comes out with a U-shaped mounting groove 20113G. The support 2070G is mounted on the mounting groove 20113G and will obtain stable support from both the broader or narrower areas of the packaging part 2011, such that the filter 2040 can be stably mounted. In other words, the extending rim 2073G of the support 2070G fills the opening of the U-shaped structure, so as to close the mounting groove 20113G. In addition, the heights of the top sides of the packaging part 2011 are consistent, so as for the motor 60 or the lens 50 to be mounted.

It is worth mentioning that, according to an embodiment of the present invention, the height of the mounting groove 20113G is higher than the height of the support 2070G, so when the support 2070G is mounted on the mounting groove 20113G, there will be a gap between the support 2070G and the side of the motor 2060 in the area of the opening of the U-shape structure of the mounting groove 20113G. Therefore, it utilizes a sealer to seal the gap in the camera module, so as to isolate the photosensitive chip 2030 from the outside. Particularly, according to an embodiment, the sealer is a colloid. In other words, after the camera module is assembled, the support 2070G mounted on the packaging part 2011 will be sealed with the colloid.

According to this embodiment of the present invention, the support 2070G has a first support groove 2071G and a second support groove 2072G, wherein the first support groove 2071G is for mounting the filter 2040, such that the surface of the filter 2040 will not protrude from the top of the support 2070G. The second support groove 2072G is for being mounted on the packaging part 2011, such that the packaging part 2011 can be extended upward from the support 2070G and the position of the filter 2040 is relatively low, so as to reduce the back focal length of the camera module.

The shapes of the first support groove 2071G and the filter 2040 match with each other, while the shapes of the second support groove 2072 and the mounting groove 20113 of the packaging part 2011 match with each other.

In other words, the support 2070G is extended into the through hole 201100 and extended downward, so as to keep the filter 2040 supported above the photosensitive chip 2030. By utilizing the space in the through hole 201100, the filter 2040 can be stably mounted and the filter 2040 will not occupy external space.

It is worth mentioning that the distance that the support 2070G extends inward is out of the photosensitive area of the photosensitive chip 2030. Namely, the support 2070G will not cover the photosensitive chip 2030, so as not to influence the photosensitive process of the photosensitive chip 2030. The dimensions of the support 2070G can be designed based on actual needs.

Unlike the above seventh preferred embodiment, the second support groove 2072G matches with the mounting groove 20113G of the packaging part 2011 to form a matched buckle structure, such that the support 2070G can be stably mounted on the mounting groove 20113G. Comparing with the third preferred embodiment, the distance between the filter 2040 and the photosensitive chip 2030 is shorter in this embodiment, so as to provide a camera module with shorter back focal length.

According to this embodiment and corresponded figures of the present invention, a zoom lens module is utilized as an example for illustration, wherein the lens 2050 is mounted on the motor 2060 and the motor 2060 is mounted on the support 2070G. In other words, the support 2070C provides installation sites for the filter 2040 and the motor 2060. According to some other embodiments of the present invention, the camera module may also be a fixed focus module. The lens 2050 is mounted on the support 2070G. Namely, the support 2070G provides installation sites for the filter 2040 and the lens 2050. Those skilled in the art should understand that the specific structure of the support 2070G and the type of the camera module shall not limit the present invention.

It is worth mentioning that, based on various needs, the support 2070G may have different structures, such as the support 1070, the support 2070, the support 3070G, and the support 3070H according to the above embodiments, so as for mounting different components, such as the filter 2040, the motor 2060, the lens 2050, and etc. According to this embodiment of the present invention, the filter 2040 is mounted on the support 2070G, the support 2070G is mounted on the packaging part 2011, and the lens 2050 is mounted on the motor 2060. The bottom of the motor 2060 is partially supported by the packaging part 2011, while another part thereof is positioned above the support 2070G, which, for instance, can be lapped on the support 2070G to make a zoom lens module. According to another embodiment of the present invention, the bottom part of the lens 2050 is supported on the packaging part 2011, while another part thereof is supported by the upper part of the support 2070G, so as to form a fixed focus module. According to another embodiment of the present invention, the filter 2040 is mounted on the support 2070, the support 2070 is mounted on the packaging part 2011, and the lens is mounted on the motor 2060. The motor 2060 is fully supported and installed in the packaging part 2011 without relying on any support from the support 2070. That is to say, the support is completely located at the inside of the packaging part 2011. According to another embodiment of the present invention, the lens 2050 is completely supported by the packaging part 2011, so as to form a fixed focus module. According to another embodiment of the present invention, the motor 2060 or the lens 2050 are completely supported on the support 2070. In other words, the support 2070 is arranged between the packaging part 2011 and the motor 2060 or the lens 2050. According to another embodiment of the present invention, the filter 2040 is not mounted on the support, but on the photosensitive chip 2030 or on the main circuit board 20121.

Those skilled in the art should understand that the structural features of the packaging part 2011 and the support 2070G illustrated in this embodiment of the present invention may also be freely utilized in other embodiments of the present invention, wherein the present invention shall not be limited hereto.

Figure 27:
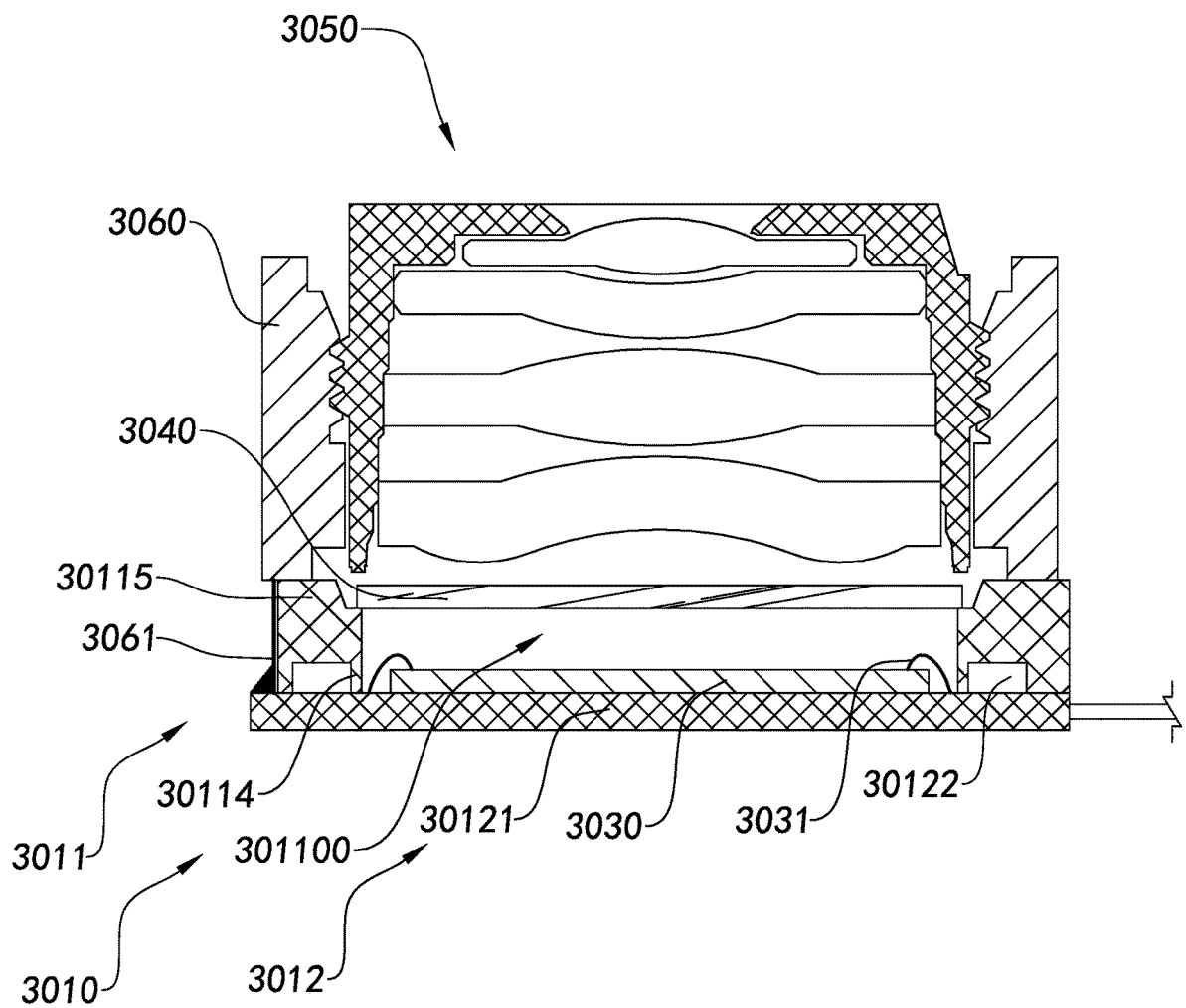
FIG. 27 is a sectional perspective view of an integral packaging process based camera module according to a 13th preferred embodiment of the present invention.
Figure 28:
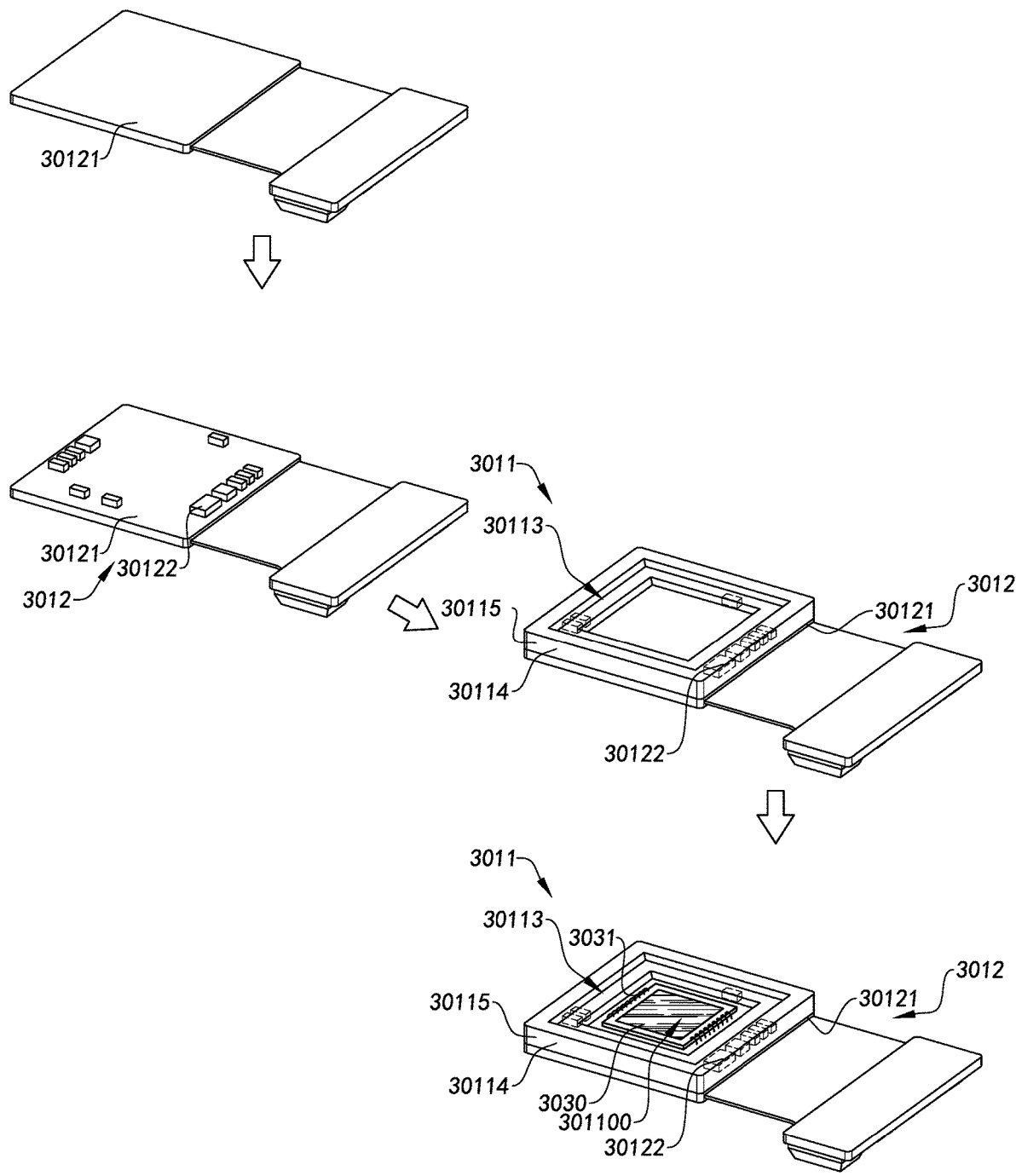
FIG. 28 is a perspective view illustrating the manufacturing process of the integral base component according to a 13th preferred embodiment of the present invention.
Figure 29:
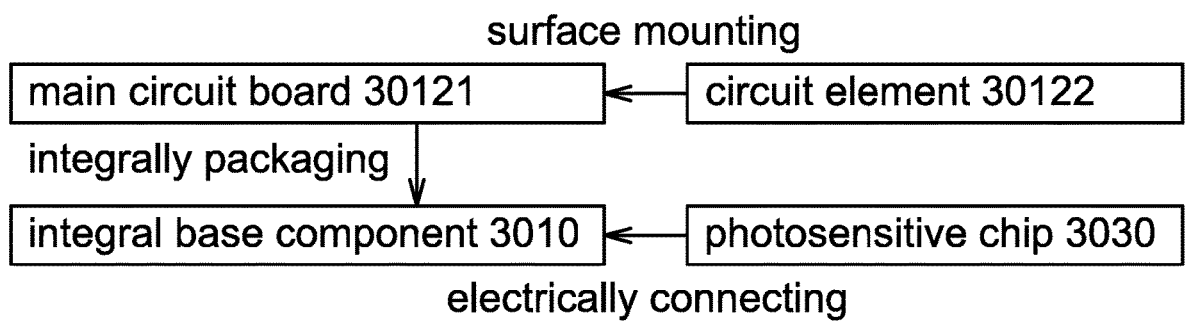
FIG. 29 is a block diagram illustrating the manufacturing method of the integral base component according to a 13th preferred embodiment of the present invention.

According to the above embodiment and drawing, the zoom lens module is given as an example for illustrating the notions of the present invention, while according to other embodiments, the camera module may also be a fixed focus module. Those skilled in the art should understand that the type of the camera module shall not limit the present invention. What FIGS. 27-29 illustrate is an integral packaging process based camera module according to a 13th preferred embodiment of the present invention. The camera module can be utilized on various electronic devices, to support photographic activities for the electronic devices. For example, the camera module can be utilized to take photo or video of an object or character. Preferably, the camera module can be utilized on various electronic devices, for example but not limited to cellphone or tablet computer, and etc.

Referring to FIGS. 27-29, the camera module includes an integral base component 3010, a photosensitive chip 3030, and a lens 3050.

Further, the photosensitive chip 3030 is mounted on the integral base component 3010. The lens 3050 is provided above the integral base component 3010 and the lens 3050 is positioned in the path of photoreception of the photosensitive chip 3030. The integral base component 3010 can be coupled with the electronic device, so as to be utilized with the electronic device. Those skilled in the art should understand that the lens 3050 and the photosensitive chip 3030 can coordinate with each other to take image. Specifically, after the light reflected from the shooting subject, such as an object or person, passes through the lens 3050, it will be received by the photosensitive chip 3030 for photoelectric conversion. In other words, the photosensitive chip 3030 can convert optical signal into electrical signal and the electrical signal can be transmitted to the electronic device, so as to generate image corresponding to the shooting subject on the electronic device through the integral base component 3010.

The integral base component 3010 includes a base part 3011 and a circuit board part 3012, wherein the base part 3011 is integrally packagingly connected with the circuit board part 3012, such as being moldingly connected with the circuit board part 3012. More specifically, the base part 3011 is moldingly connected with the circuit board part 3012 through molding on board (MOB) technology. In other words, the base part 3011 is directly connected with the circuit board part 3012 rather than being connected through anything, such as glue and etc., therebetween. Therefore, the connection between the base part 3011 and the circuit board part 3012 will be more reliable.

The circuit board part 3012 comprises a main circuit board 30121, wherein the base part 3011 is integrally connected with the main circuit board 30121. The base part 3011 forms a through hole 301100 to make the base part 3011 surround in the outer side of the photosensitive chip 3030 and provide a light path for the lens 3050 and the photosensitive chip 3030. The photosensitive chip 3030 is arranged on the main circuit board 30121 at the position corresponding to the through hole 301100.

The circuit board part 3012 comprises a connecting circuit and at least a circuit element 30122, wherein the connecting circuit is preinstalled in the main circuit board, wherein the circuit element 30122 is electrically connected to the connecting circuit for the process of photosensitive work of the photosensitive chip 3030. The circuit element 30122 can be, for example but not limited to, a resistor, a capacitor, a diode, a triode, a potentiometer, an electric relay, driver, processor, memory, and etc.

It is worth mentioning that the base part 3011 can wrap and cover the circuit element 30122 in the inside thereof, so as to keep the circuit element 30122 from being directly exposed in the space, more specifically, from being exposed in the enclosed environment that communicates with the photosensitive chip 3030. It is not like the arrangement of the circuit component in the conventional camera module, such as having the resistance-capacitance components protrude from the circuit board, such that it can prevent dust and sundries from staying on the circuit element 30122 or polluting the photosensitive chip 3030. In this embodiment of the present invention, the circuit element 30122 is protruded from the main circuit board 30121 in the exemplar, while in other embodiment of the present invention, the circuit element 30122 is embedded in the main circuit board 30121 without protruding from the main circuit board 30121. Hence, those skilled in the art should understand that the structure, type, and mounting position of the circuit element 30122 shall not be limits of the present invention. It is understandable that, in conventional camera module, circuit component protrudes from the circuit board and the base can only be installed on the outer side of the circuit element 30122, so both the circuit component and the base require certain spaces. As a result, it will demand more on the lateral dimensions of the circuit board. For the integral packaging process based camera module of the present invention, the base part 3011 is integrally packaged on the main circuit board 30121 and wraps and covers the circuit element 30122, such that the spaces of the base part 3011 and the circuit element 30122 are overlapped, which provides extra space for arranging the base part 3011 inward and reduces the demand of extending the main circuit board 30121 outward. Therefore, the lateral dimensions of the camera module can be decreased, so as to satisfy more compact devices.

It is worth mentioning that the way that the base part 3011 wraps and covers the circuit element 30122 has an advantage in protecting the circuit element 30122 from being polluted or bumped accidentally, which is also advantageous for the corresponding camera module. However, those skilled in the art should understand that the base part 3011 shall not be limited in wrapping or covering the circuit element 30122. In other words, in other embodiments of the present invention, the base part 3011 can be directly molded on the main circuit board 30121 that has no protruding circuit element 122, or be molded at different positions including the outer side and the periphery of the circuit element 30122.

According to this embodiment of the present invention, the base part 3011 protrudingly surrounds around the outer side of the photosensitive chip 3030. Particularly, the base part 3011 is integrally closingly connected, so as to have a nice sealing quality, so that when the lens 3050 is installed along the path of photoreception of the photosensitive chip 3030, the photosensitive chip 3030 will be sealed in the inside, thereby forming a corresponding sealed inner space.

Specifically, when manufacturing the integral base component 3010, one may utilize a conventional circuit board to be the main circuit board 30121 and then conduct molding on the surface of the main circuit board 30121. For instance, according to an embodiment, it may utilize an injection molding machine to integrally package (e.g. moldingly package) the circuit board that has been processed through SMT, through insert molding technology, so as to form the base part 3011. Alternatively, it may utilize the mold pressing technology that is commonly seen in semiconductor packaging to form the base part 3011. Further, the photosensitive chips 3030 are respectively attached on the main circuit board 30121. Then the photosensitive chips 3030 are respectively electrically connected with the main circuit board 30121, through, for example, wire bonding. The main circuit board 30121 can alternatively be, for example but not limited to, a rigid-flex board, a ceramic substrate (without flexible board), or a rigid PCB (without flexible board). The way to form the base part 3011 can possibly be, for example but not limited to, injection moulding technique or mold pressing technique. Possible materials of the base part 3011 are, for example but not limited to, nylon, LCP (Liquid Crystal Polymer), or PP (Polypropylene) for injection moulding, and epoxy resin for mold pressing. Those skilled in the art should understand that the above possible manufacturing methods and optional materials are just to give examples to illustrate implementations of the present invention, rather than confine of the present invention.

In some other embodiments of the present invention, the process to manufacture the integral base component 3010 may also include: conducting SMT to the main circuit board 30121, attaching the photosensitive chip 3030 on the main circuit board 30121, electrically connecting the photosensitive chip 3030 to the main circuit board 30121, for example, by wire bonding, integrally packaging the main circuit board 30121, for example, through molding packaging that forms the base part 3011 through insert molding or through mold pressing, which is a common technology in semiconductor packaging. Those skilled in the art should understand that the specific manufacturing order of the integral base component 3010 shall not limit the present invention.

The camera module further comprises a filter 3040, arranged on the base part 3011, so as to provide a stable and smooth installation condition for the filter 3040.

More specifically, according to an embodiment of the present invention, the filter 3040 is embodied as a Infra-Red Cut Filter (IR-Cut Filter, IRCF), wherein the IR-Cut Filter is an optical filter made by alternately plating a high refractive index optical film on an optical substrate with precision optics coating technology, which has high transparency for visible light (400-630 nm) and blockage for near-infrared (700-1100 nm). It can prevent the infrared light from influencing the imaging of the photosensitive chip 3030, such as CCD, CMOS, and etc. By putting in the IR-Cut Filter 3040 into the imaging system of the camera module to block part of the infrared light that influence the imaging quality of the imaging system, the image formed by the camera module can achieve a better feeling for human eye.

It is worth mentioning that the photosensitive chip 3030, such as CCD, CMOS, and etc., senses light differently from human eye. Human eye can only see visible light within the wave band of 380-780 nm, while photosensitive chip 3030 can sense a broader wave band, which includes infrared light and ultraviolet light. Especially, it is very sensitive to infrared light. Therefore, it is necessary to control the infrared light in the camera module, while remains high transparency to visible light, so as to make the sensing of the photosensitive chip 3030 closer to human eye and make the shot image of the camera module conform to the sensing of human eye. Hence, the IR-Cut Filter 3040 is indispensable for the camera module.

Particularly, according to this embodiment of the present invention, the filter 3040 can be selected from the group consisting of: wafer level IR-Cut Filter, narrow-band filter, blue glass IRCF. Those skilled in the art should understand that the type of the filter 3040 shall not limit the present invention.

In a camera module assembled with conventional COB technology, the filter is usually mounted on the plastic base that is commonly glued on the circuit board. Although the plastic base and its corresponding installation mode are not likely to cause deviation or tilt, the evenness and smoothness of the surface of the plastic frame are poor, which cannot provide an ideal installation condition for the filter 3040. According to this preferred embodiment of the present invention, the filter 3040 is mounted on the base part 3011 through molding process, so as to achieve a great evenness and smoothness of the surface to provide an ideal installation condition for the filter 3040. Besides, the integral molding mode can also avoid deviation or tilt of the base part 3011, which reduces the accumulated tolerance of the installation of the filter 3040.

It is also worth mentioning that the shape of the base part 3011 can be determined based on the needs. For instance, it is extended inward at the position of the circuit element 30122, so as to form a protruding portion to increase the corresponding width of the base part 3011, wherein the base part 3011 extends consistently at the place without the circuit element 30122, so as to form a more regular shape with a smaller width. Those skilled in the art should understand that the specific shape of the base part 3011 shall not limit the present invention.

Further, the base part 3011 comprises a wrapping section 30114 and a filter mounting section 30115 moldingly and integrally connected with the wrapping section 30114. The wrapping section 30114 is moldingly connected with the main circuit board 30121 for wrapping and covering the circuit element 30122. The filter mounting section 30115 is for mounting the filter 3040.

In other words, when the integral base component 3010 is utilized in the assembling of the camera module, the filter 3040 of the camera module will be mounted on the mounting section 30115, such that the filter 3040 will be in the path of photoreception of the corresponding photosensitive chip 3030 and will not require extra mounting frame of the filter 3040. In other words, the base part 3011 can serve as a conventional lens holder here, but, based on the advantages of integral packaging technology, the top of the filter mounting section 30115 can also have a great evenness through molding technology, so that the filter 3040 can be mounted evenly, which is an advantage over conventional camera module.

Further, the filter mounting section 30115 forms a mounting groove 30113, wherein the mounting groove 30113 is communicated with the through hole 301100, so as to provide sufficient installation space for the filter 3040, so as to avoid the filter 3040 from protruding from the top surface of the filter mounting section 30115. In other words, the mounting groove 30113 is provided on the upper end of the base part 3011, so as for stably mounting the filter 3040 on the base part 3011 without protruding from the top of the base part 3011.

It is worth mentioning that, according to this embodiment of the present invention, the mounting groove 30113 can be utilized for mounting the filter 3040, while according to other embodiment of the present invention, the mounting groove 30113 can be utilized for mounting other parts, such as the motor or the lens of the camera module. Those skilled in the art should understand that the use of the mounting groove 30113 shall not limit the present invention.

In other words, the base part 3011 has the mounting groove 30113, wherein the mounting groove 30113 is communicated with the through hole 301100, so as to provide sufficient installation space for the filter 3040. That is to say, the top surface 30112 of the base part 3011 is a step shaped structure, rather than being integrally extended. The steps of the top surface 30112 can be utilized for installing the filter 3040, the lens 3050, and the motor 3060.

Further, the height of the mounting groove 30113 is greater than the thickness of the filter 3040, such that when the filter 3040 is mounted in the mounting groove 30113, the filter 3040 will not protrude from the top of the base part 3011.

Particularly, according to this embodiment of the present invention, the filter 3040 is square shaped, wherein the shape of the mounting groove 30113 matches with the shape of the filter 3040. In other words, the lateral section of the mounting groove 30113 is square-ring shaped and the mounting groove 30113 is communicated with the through hole 301100.

It is worth mentioning that, according to this embodiment of the present invention, the mounting groove 30113 can be utilized for mounting the filter 3040, while according to other embodiment of the present invention, the mounting groove 30113 can be utilized for mounting other parts, such as the motor 3060 or the lens 3050 of the camera module. Those skilled in the art should understand that the use of the mounting groove 30113 shall not limit the present invention.

According to this embodiment of the present invention, the camera module comprises a motor 3060, such as a voice coil motor and etc. The lens 3050 is mounted on the motor 3060, such that the lens 3050 can be driven by the motor 3060 to move, so as for adjusting the focal length of the camera module. That is to say, the camera module is a zoom lens module or an automatic focus module (AFM). The motor 3060 is electrically connected with the main circuit board 30121 through at least a motor pin 3061.

It is worth mentioning that, according to this embodiment of the present invention, the zoom lens module is given as an example in the drawings for illustration, while according to other embodiments, the camera module may be a fixed focus module. Those skilled in the art should understand that the type of the camera module shall not limit the present invention.

The motor 3060 is mounted on the base part 3011 of the integral base component 3010. Further, the motor 3060 is mounted on the top surface 30112 of the base part 3011. Namely, the filter 3040 and the motor 3060 coordinately occupy the top surface 30112 of the base part 3011. The motor 3060 is electrically connected with the main circuit board 30121 through at least a motor pin 3061.

The lens 3050 is mounted in the motor 3060. The motor 3060 and the filter 3040 are mounted in the base part 3011. Therefore, the base part 3011 serves the function of the base of a conventional camera module to support and affix the motor 3060 and the filter 3040 with a different manufacturing and assembling mode from the conventional COB technology. The base of camera module of conventional COB technology is attached on the circuit board by means of gluing. However, the base part 3011 is attached on the main circuit board 30121 through molding that does not require the process of pasting and affixing. The molding method has better connection stability and controllability of technological process than the pasting and affixing and better evenness, which creates better installation condition for the motor 3060 and the filter 3040. Also, the glue space reserved for AA adjustment of the base part 3011 and the main circuit board 30121 will be gone, which saves the lead room for AA adjustment of conventional camera module, such that the thickness of the camera module can be reduced. Besides, the base part 3011 wraps and covers the circuit element 30122 to allow the space of the conventional base and the installation space of the circuit element 30122 to be spatially overlapped, rather than reserving a safe distance around the circuit components like conventional camera module. Therefore, the base part 3011 that also severs as a base can be provided in a smaller size, so as to allow further reduction to the thickness of the camera module. Besides, the base part 3011 substitutes the traditional base, which avoids tilt error caused in the affixing and assembling of base, and reduces accumulated tolerance of the assembling of the camera module.

It is also worth mentioning that the shape of the base part 3011 can be determined based on the needs. For instance, it is extended inward at the position of the circuit element 30122, so as to form a protruding portion to increase the corresponding width of the base part 3011, wherein the joint molding portion extends consistently at the place without the circuit element 30122, so as to form a more regular shape with a smaller width. Those skilled in the art should understand that the shape of the base part 3011 shall not limit the present invention.

According to this embodiment of the present invention, the photosensitive chip 3030 is electrically connected to the main circuit board 30121 through at least a connecting wire 3031, and electrically connected to the connecting circuit. The connecting wire 3031 can be implemented as, for example but not limited to, a gold wire, a copper wire, an aluminum wire, or a silver wire. Particularly, the photosensitive chip 3030 and the connecting wire 3031 can be connected to the main circuit board 30121 by conventional COB method, for example but not limited to, welding. In other words, the connection between the photosensitive chip 3030 and the main circuit board 30121 can completely use existing mature technique of connection to lower the cost of technology improvement, to make full use of conventional technique and equipment, and to avoid the waste of resources. Without doubt, those skilled in the art should be able to understand that the connection between the photosensitive chip 3030 and the main circuit board 30121 may also be implemented through any other way of connection that is able to achieve the object of the present invention, wherein the present invention is not confined in this regard.

It is worth mentioning that in this embodiment of the present invention, each the photosensitive chip 3030 is set on the upper surface of the main circuit board 30121, wherein the base part 3011 surrounds around the outer side of the photosensitive chip 3030. When manufacturing the integral base component 3010, there are various possible manufacturing orders, for example but not limited to that, in an implementation, the photosensitive chip 3030 can be firstly mounted on the main circuit board 30121, and then the base part 3011 is molded and formed in the outer side of the photosensitive chip 3030 on the main circuit board 30121 to wrap and cover and cover the circuit elements 30122 protruded from the main circuit board 30121 in the inside thereof. Besides in another implementation of the present invention, the main circuit board 30121 can be first molded to form the base part 3011 and to wrap and cover the circuit elements 30122 protruded from the main circuit board 30121 in the inside thereof. Then the photosensitive chip 3030 is installed on the main circuit board 30121 to be located in the inner side of the base part 3011.

Figure 30:
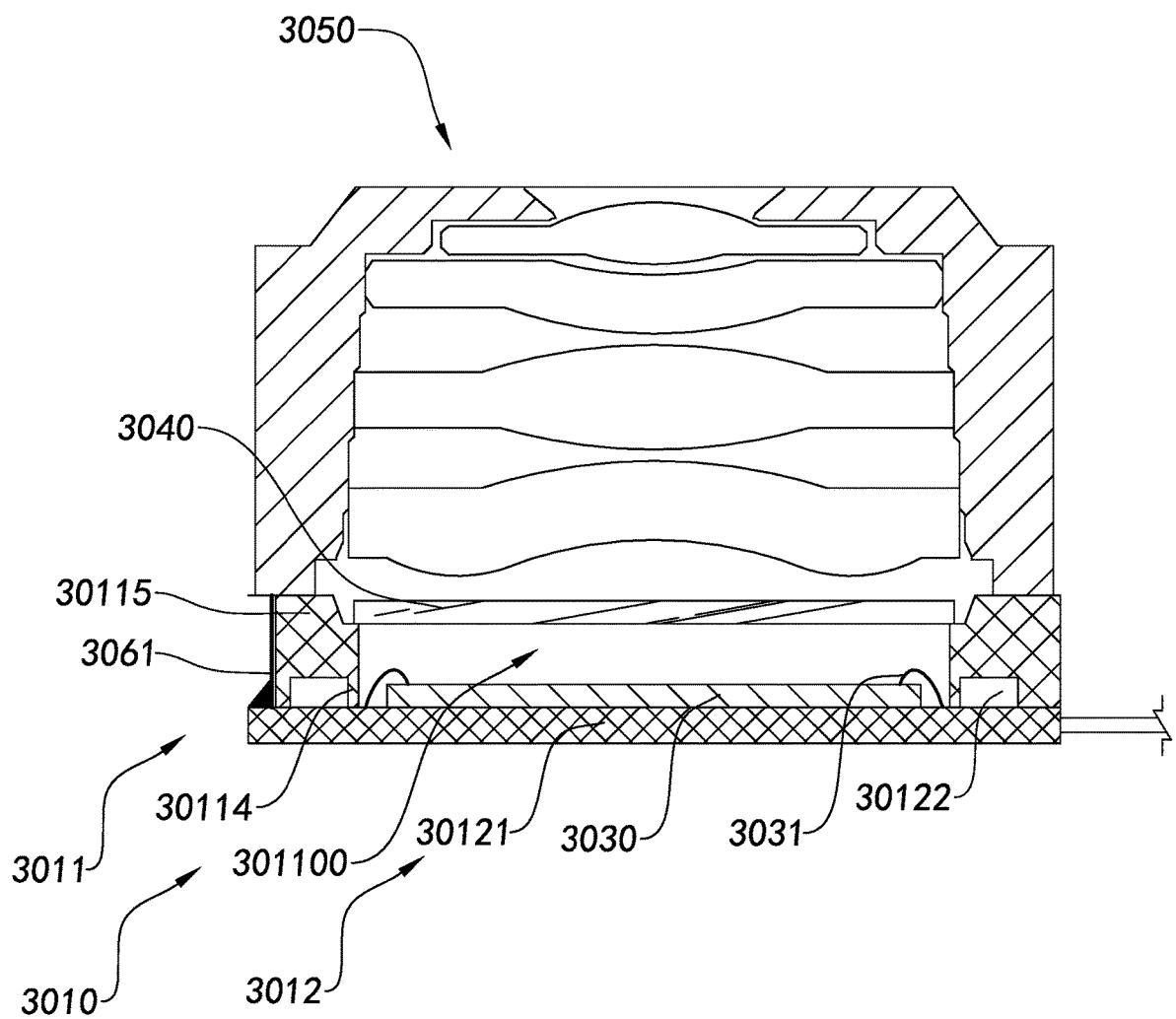
FIG. 30 illustrates an integral packaging process based camera module according to another implementation of the above 13th preferred embodiment of the present invention.

FIG. 30 refers to the camera module according to another implementation of the above 13th preferred embodiment of the present invention, wherein the camera module can be a fixed focus module (FFM). In this camera module, the lens 3050 is mounted on the top surface 30112 of the base part 3011, which indicates that the focal length of the camera module cannot be adjusted freely. The lens 3050 and the filter 3040 are arranged coordinately on the top surface 30112 of the base part 3011. The filter 3040 is mounted in the mounting groove 30113. Those skilled in the art should understand that the type of the camera module shall not limit the present invention.

It is worth mentioning that, according to this preferred embodiment of the present invention, the base part 3011 can be utilized for supporting and mounting the filter 3040 and the lens 3050, which can serve the functions of a conventional base. However, based on the advantages of molding, the base part 3011 can further have its evenness and consistency controlled through the mold, so as to provide a smooth and consistent mounting setting for the filter 3040 and the lens 3050 of the camera module, which can ensure the consistency among the optic axes of the lens 3050, the filter 3040, and the photosensitive chip 3030 much more easily than conventional camera module.

Figure 31A:
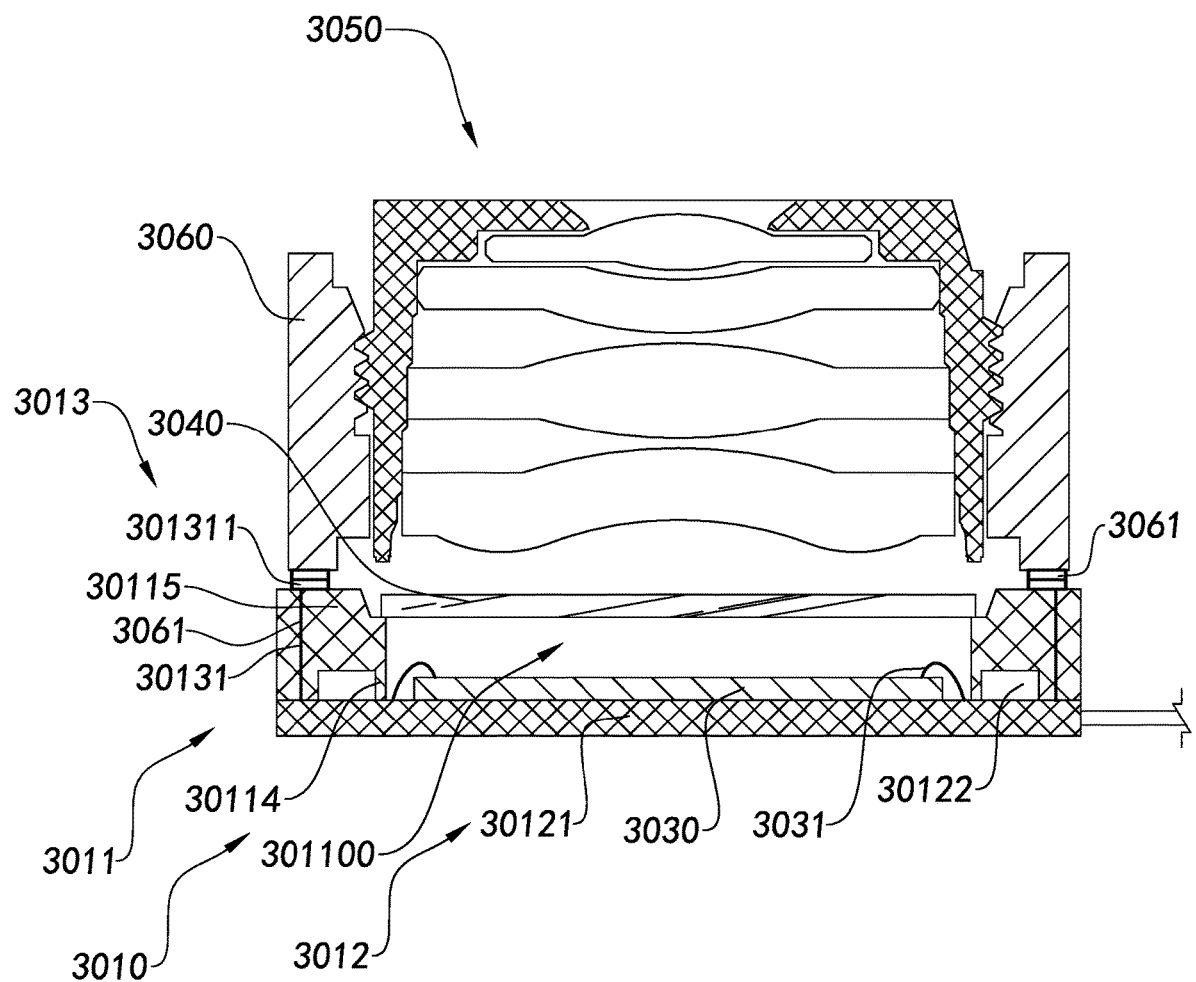
FIGS. 31A, 31B, 31C, and 31D illustrate different implementations of the integral packaging process based camera module and the motor connection member thereof according to a 14th preferred embodiment of the present invention.

Referring to FIG. 31A, according to a 14th preferred embodiment of the present invention, the integral base component 3010 of the camera module comprises a motor connection member 3013 for connecting the motor 3060 of the camera module. The motor 3060 has at least a motor pin 3061. The motor connection member 3013 comprises at least a lead wire 30131, adapted for electrically connecting the motor 3060 to the main circuit board 30121. Each the lead wire 30131 is electrically connected with the main circuit board 30121. Further, each the lead wire 30131 is electrically connected with the connecting circuit of the main circuit board 30121. The lead wire 30131 is arranged on the base part 3011 and extended to the top of the base part 3011. The lead wire 30131 comprises a motor connecting end 3013111311 revealed and exposed on the top of the base part 3011 for electrically connected with the motor pin 3061 of the motor 3060. It is worth mentioning that the lead wire 30131 can be embedded and provided when the base part 3011 is formed. In conventional connection mode, components like driving motor and others are connected to the circuit board through independent wires, which manufacturing processes are relatively complicated. Fortunately, the way provided by the present invention that the lead wire 30131 can be embedded during molding can substitute the conventional technology and processes like motor welding and etc., and make the circuit connection more stable. Particularly, according to an embodiment of the present invention, the lead wire 30131 is a wire, embedded in the base part 3011. For example, the motor pin 3061 may be connected with the motor connecting end 301311 through anisotropic conductive film or through welding and soldering.

It is worth mentioning that the embedding position of the lead wire 30131 and the revealing position of the motor connecting end 301311 of the lead wire 30131 on the base part 3011 can both be determined based on the needs. For example, according to an embodiment of the present invention, the motor connecting end 301311 of the lead wire 30131 can be arranged on the outer side of the base part 3011, which can be on the top surface of the base part 3011 or the top surface of the filter mounting section 30115. Nonetheless, according to another embodiment of the present invention, the motor connecting end 301311 can be arranged on the inner side of the base part 3011, which is on the bottom side of the mounting groove 30113 of the base part 3011. Hence, it can provide various installation sites for the motor 3060. In other words, when the motor 3060 needs to be mounted on the top of the base part, the motor connecting end 301311 can be provided on the top surface on the outer periphery of the base part, while when the motor 3060 needs to be mounted in the mounting groove 30113, the motor connecting end 301311 can be provided on the inner periphery of the base part 3011, which is the bottom of the mounting groove 30113.

In other words, in the manufacturing process of the integral base component 3010, the photosensitive chips 3030 can be attached on the main circuit board 30121 first. Then, the base part 3011 will be molded on the main circuit board 30121 through MOB technology. Besides, the lead wire 30131 will be embedded and provided during the molding and the lead wire 30131 will be electrically connected with the main circuit board 30121. The motor connecting end 301311 of the lead wire 30131 will be revealed and exposed on the top of the base part, so as for being connected with the motor pin 3061 of the motor 3060. For example, when the integral base component 3010 is utilized in the assembling of the camera module, the motor pins 3061 of the motor 3060 will be connected with the motor connecting end 301311 of the lead wire 30131 by soldering and welding, such that the motor 3060 can be electrically connected with the main circuit board 30121. It has to connect the motor 3060 with the main circuit board 30121 through independent wires. Therefore the length of the motor pins 3061 of the motor 3060 can be decreased.

Figure 31B:
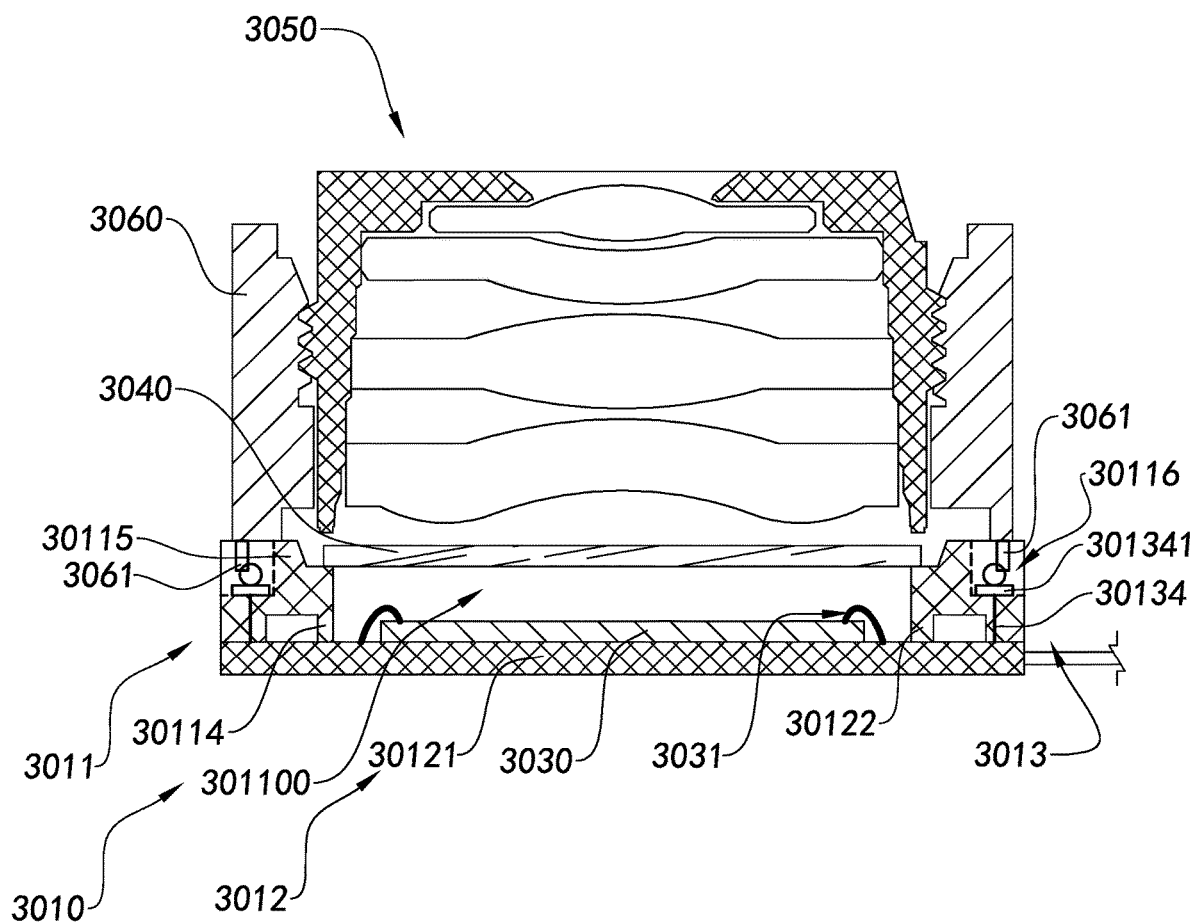

FIG. 31B illustrate an equivalent mode of the motor connection member according to the above preferred embodiment of the present invention. The motor connection member 3013 comprises a pin slot 30133 for accommodating the motor pin 3061 of the motor 3060 of the camera module. The pin slot 30133 is arranged on the upper end of the base part 3011. The motor connection member 3013 comprises at least a lead wire 30134 adapted for electrically connecting the motor 3060 to the main circuit board 30121. The lead wire 30134 is arranged on the base part 3011 and upward extended to the groove bottom wall of the pin slot 30133 of the base part 3011. The lead wire 30134 comprises a motor connecting end 301341 revealed and exposed on the groove bottom wall of the pin slot 30133 of the base part 3011 for electrically connected with the motor pin 3061 of the motor 3060. Particularly, according to an embodiment, the motor connecting end 301341 can be embodied as a bonding pad. The lead wire 30134 can be embodied as a wire, embedded in the base part 3011.

In other words, in the manufacturing process of the integral base component 3010, the photosensitive chip 3030 will be attached first. Then, the base part 3011 will be molded on the main circuit board 30121 through MOB technology, wherein the pin slot 30133 with a predetermined length will also be pre-arranged thereon. Besides, the lead wire 30134 will be embedded and provided during the molding and the lead wire 30134 will be electrically connected with the main circuit board 30121. The motor connecting end 3013111341 of the lead wire 30134 will be revealed and exposed on the groove bottom wall of the pin slot 30133 of the base part 3011, so as for being connected with the motor pin 3061 of the motor 3060. For example, when the integral base component 3010 is utilized in the assembling of the camera module, the motor pins 3061 of the motor 3060 will be inserted into the pin slots 30133 and connected with the motor connecting end 3013111341 of the lead wire 30134 by soldering and welding, such that the motor 3060 can be electrically connected with the main circuit board 30121. It has to connect the motor 3060 with the main circuit board 30121 through independent wires. Therefore the motor pins 3061 of the motor 3060 can be connected stably and external unnecessary contact of the motor pin 3061 can be avoided. Particularly, the lead wire 30134 can be embodied as a wire, embedded in the base part 3011.

Figure 31C:
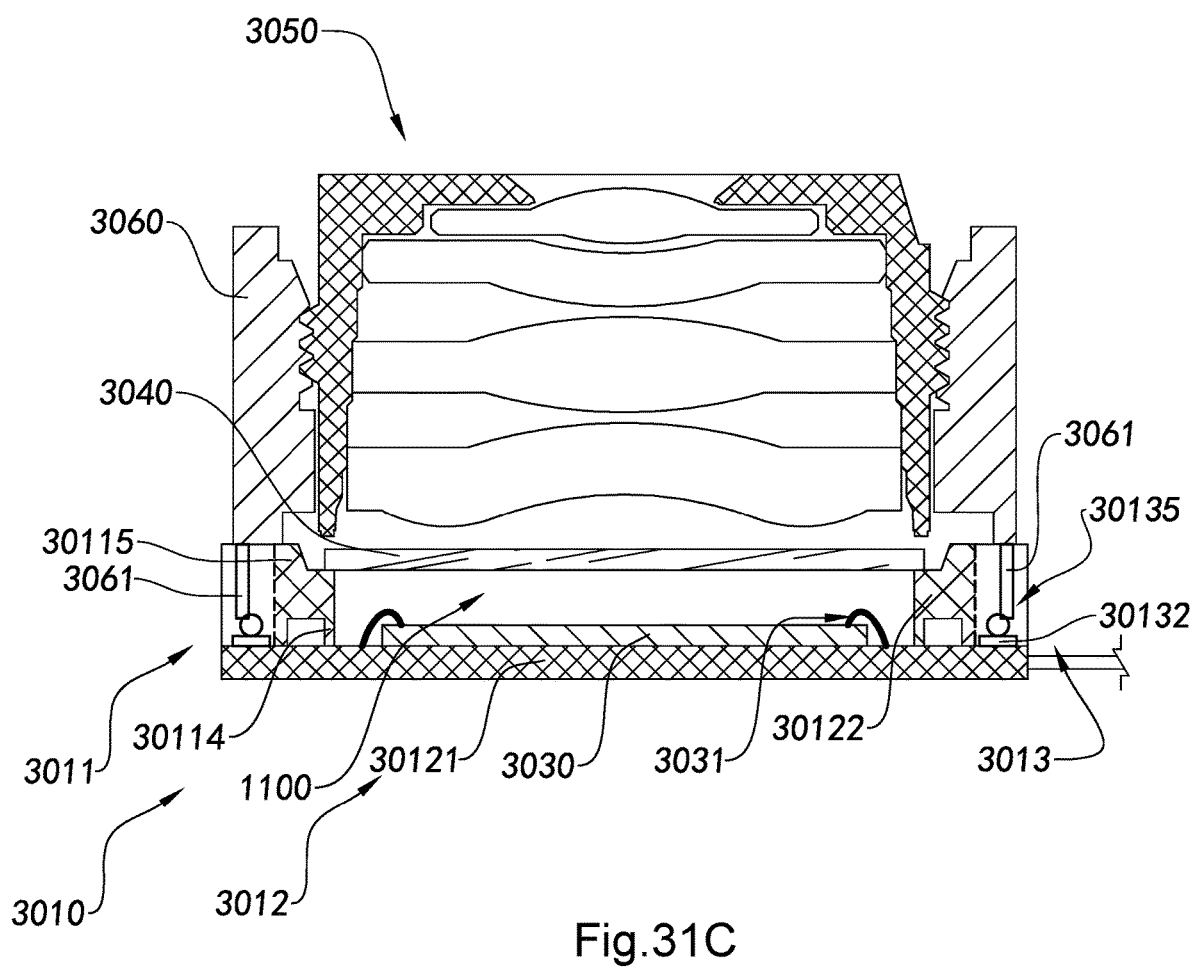

FIG. 31C illustrate an equivalent mode of the motor connection member according to the above preferred embodiment of the present invention. The motor connection member 3013 comprises a pin slot 30135 for accommodating the motor pin 3061 of the motor 3060 of the camera module. The pin slot 30135 is arranged on the base part 3011. The motor connection member 3013 comprises at least a circuit junction 30132 preset on the main circuit board 30121 and electrically connected with the connecting circuit in the main circuit board 122. Further, the pin slots 30135 are extended from the top of the base part 3011 to the main circuit board 30121 and have the circuit junctions 30132 revealed. According to an embodiment, the motor pin 3061 is adapted for being inserted into the pin slot 30135 and can be connected to the circuit junction 30132 through welding and soldering.

In other words, in the manufacturing process of the integral base component 3010, the circuit junctions 30132 are preset on the main circuit board 30121. Then, the photosensitive chip 123 will be attached. Next, the base part 3011 will be molded on the main circuit board 30121 through MOB technology, wherein the pin slot 30135 with a predetermined length will also be preset thereon. The circuit junction 30132 will be revealed and exposed in the pin slot 30135, so as for being connected with the motor pin 3061 of the motor 3060. For example, when the integral base component 3010 is utilized in the assembling of the camera module, the motor pins 3061 of the motor 3060 will be inserted into the pin slots 30135 and connected with the circuit junctions 30132 of the main circuit board 30121 by soldering and welding, such that the motor 3060 can be electrically connected with the main circuit board 30121 and the motor pins 3061 of the 3060 can be connected stably. It avoids external unnecessary contact of the motor pin 3061.

Figure 31D:
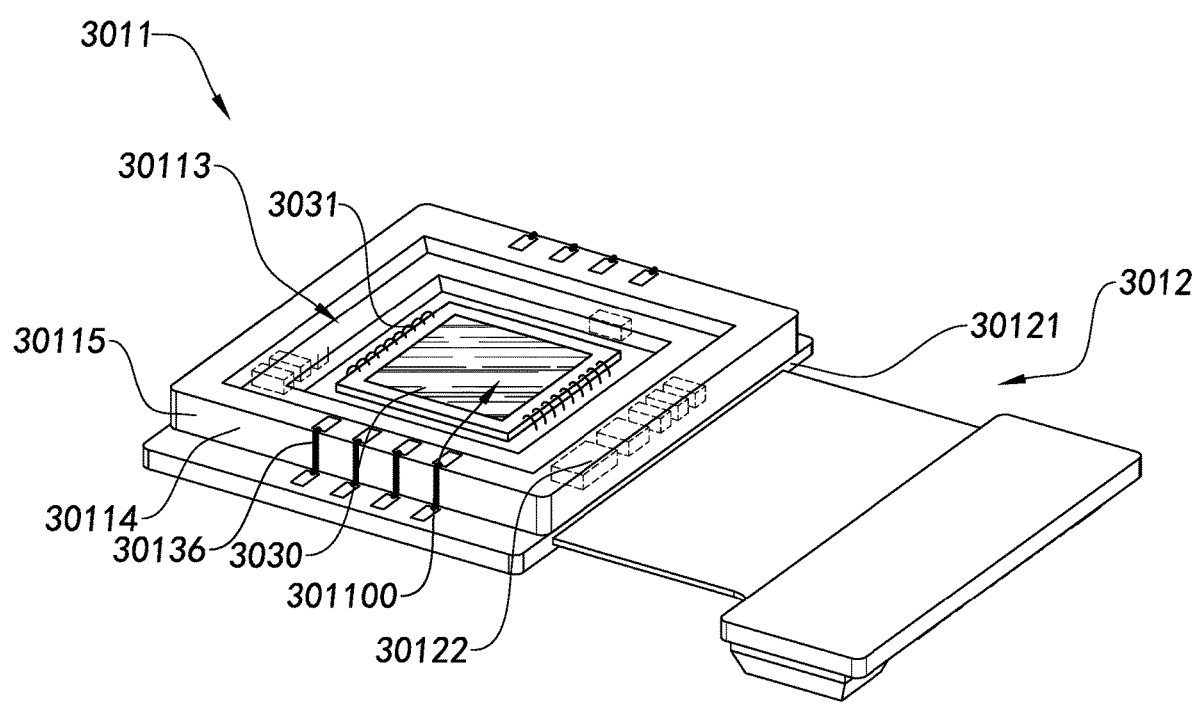

FIG. 31D illustrate an equivalent mode of the motor connection member according to the above preferred embodiment of the present invention. The motor connection member 3013 comprises an engraving circuit 30136 for electrically connecting the components, such as the connecting circuit on the main circuit board 30121, the photosensitive chip 3030, the motor, and etc. For example but not being limited, the engraving circuit 30136 can be disposed through laser direct structuring (LDS) when the base part 3011 is formed. In conventional connection mode, components like driving motor and others are connected to the circuit board through independent wires, which manufacturing processes are relatively complicated. Fortunately, the way provided by the present invention that the engraving circuit 30136 can be provided during molding can substitute the conventional technology and processes like motor welding and etc., and make the circuit connection more stable. More specifically, the process of disposing the engraving circuit 30136 may include providing engraving groove on the base part 3011 and disposing circuit in the engraving groove through electroplating.

According to another embodiment of the present invention, the ways of the motor 3060 of the camera module being connected with the integral base component 3010 may be selected and combined from the connection modes corresponding to the illustrations in FIGS. 6A-6D. One may determine a suitable mode to connect the motor 3060, such as utilizing the pin slot 30133 and the lead wire 30134, the pin slot 30135 and the circuit junction 30132, and etc. Besides, according to an embodiment of the present invention, referring to FIG. 2, the motor 3060 can also be connected to the integral base component 3010 through conventional means, such as soldering and welding and etc. Those skilled in the art should understand that the specific connection modes of the motor 3060 and the integral base component 3010 shall not limit the present invention.

Figure 32:
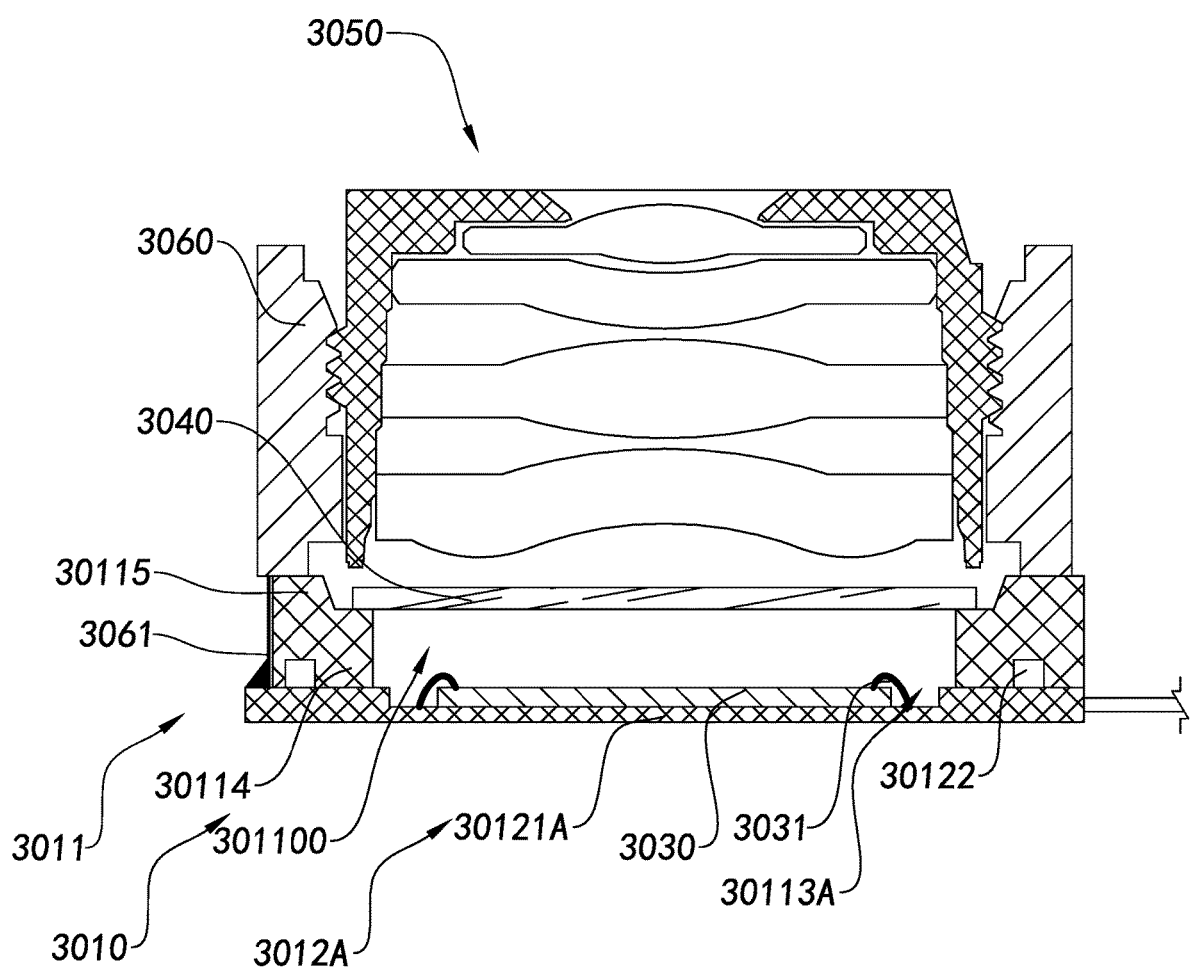
FIG. 32 is a sectional view of the integral packaging process based camera module and the integral base component thereof according to a 15th preferred embodiment of the present invention.

FIG. 32 illustrates the camera module and the integral base component thereof according to a 15th preferred embodiment of the present invention. Unlike the above preferred embodiments, the integral base component 3010 comprises a main circuit board 30121A. The main circuit board 30121A includes two inner grooves 301211A, wherein the photosensitive chips 3030 are arranged in the inside of the corresponding inner grooves 301211A respectively. Unlike the integral base component 3010 disclosed in the above embodiment, the photosensitive chip 3030 is arranged in the inside of the inner groove 301211A to be accommodated therein, so that the photosensitive chip 3030 will not significantly protrude from the upper surface of the main circuit board 30121A, which lower the height of the photosensitive chip 3030 relatively to the base part 3011, so as to reduce the height limit of the base part 3011 from the photosensitive chip 3030, and to provide potential of further decrease of the height. Besides, since the photosensitive chip 3030 is attached in the inner groove 301211A, the photosensitive chip 3030, and especially the connecting wire 3031, can be protected. It prevents external components from bumping and touching the photosensitive chip 3030 accidentally.

Further, the photosensitive chip 3030 is electrically connected to the main circuit board 30121 through the connecting wire 3031, and electrically connected to the connecting circuit. The lead wire can be implemented as, for example but not limited to, a gold wire, a copper wire, an aluminum wire, or a silver wire. In other words, the photosensitive chip 3030 and the connecting wire 3031 are both located in the inner groove 301211A of the main circuit board 30121A. According to an embodiment, the inner groove 301211A has to be arranged on the main circuit board 30121A first when manufacturing the integral base component 3010. In other words, the inner groove 301211A is made on a conventional main circuit board to be adaptable for accommodating and installing the photosensitive chip 3030.

Figure 33:
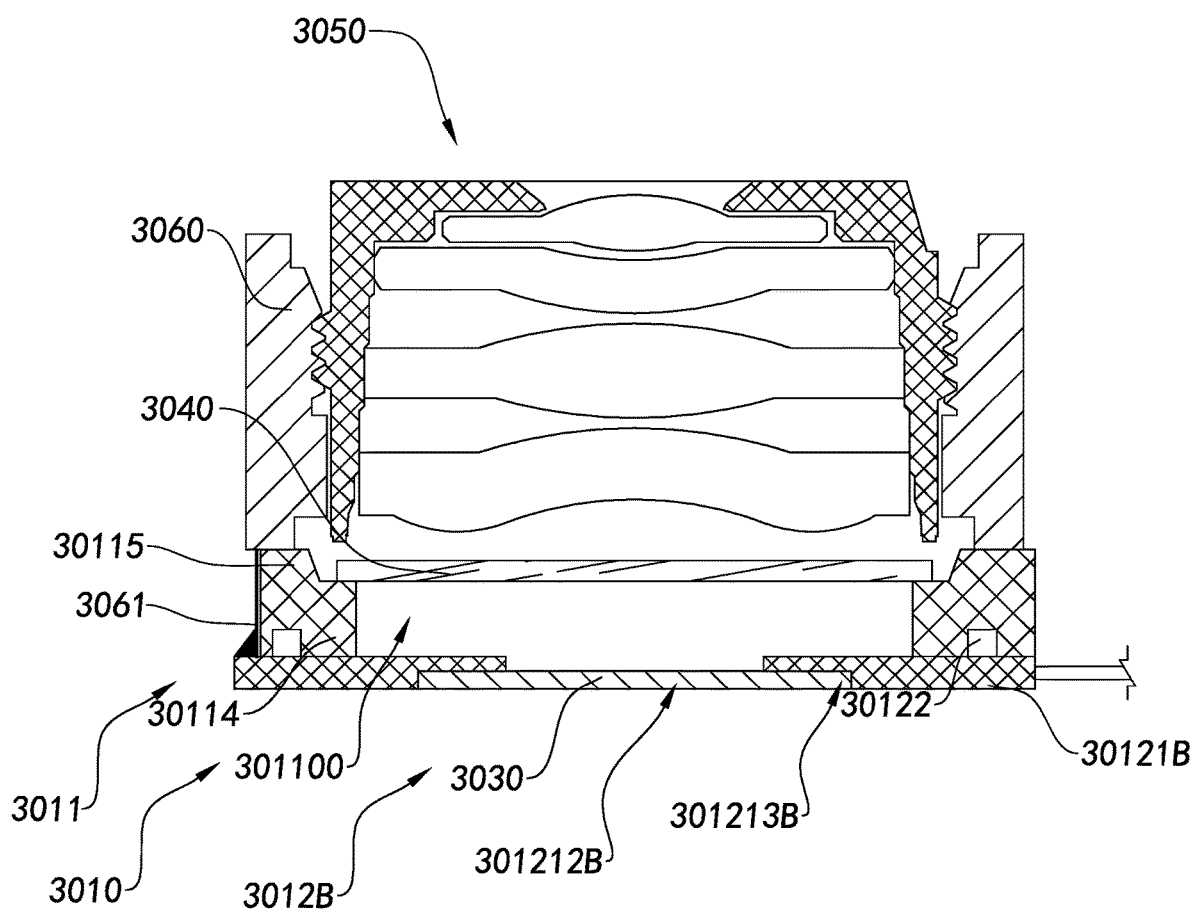
FIG. 33 is a sectional view of the integral packaging process based camera module and the integral base component thereof according to a 16th preferred embodiment of the present invention.

FIG. 33 is a sectional view of the camera module and the integral base component thereof according to a 16th preferred embodiment of the present invention.

Unlike the above preferred embodiment, the integral base component 3010 comprises a main circuit board 30121B, wherein the main circuit board 30121B has a passage 301212B, wherein the lower part of the passage 301212B is adaptable for mounting the photosensitive chip 3030. The passage 301212B communicates the upper and lower sides of the main circuit board 30121B, so that when the photosensitive chip 3030 is installed on the main circuit board 30121B from the back of the main circuit board 30121B and with the photosensitive area facing up, the photosensitive area of the photosensitive chip 3030 can still receive incoming light from the lens 3050.

Further, the main circuit board has an outer groove 301213B, communicating with the corresponding passage 301212B to provide installation site for the photosensitive chip 3030. Particularly, as the photosensitive chip 3030 being installed in the outer groove 301213B, the outer surface of the photosensitive chip 3030 is consistent with the surface of the main circuit board 30121B, which are on the same surface, so as to ensure evenness of the surface of the integral base component 3010.

That is to say, according to this embodiment of the present invention, the passage 301212B is step shape, which makes it easy for the installation of the photosensitive chip 3030 and provides a stable installation site for the photosensitive chip 3030, which also makes the photosensitive area thereof present in the inner space.

It is worth mentioning that this embodiment of the present invention provides a kind of chip installation way that differs from convention, which is the flip chip (FC) method. The photosensitive chip 3030 is installed on the main circuit board 30121B from the reverse direction of the main circuit board 30121B, which is different from the above embodiment that requires installation on the main circuit board 30121B from the front side of the main circuit board 30121B, which means from the upper side of the main circuit board 30121B with the photosensitive area of the photosensitive chip 3030 upwardly. This kind of structure and way of installation allows the photosensitive chip 3030 and the base part 3011 to be relatively independent. Installation of the photosensitive chip 3030 will not be affected by the base part 3011. Molding of the base part 3011 also makes less impact to the photosensitive chip 3030. Besides, the photosensitive chip 3030 is embedded in the outer side of the main circuit board 30121B without protruding to the inner side of the main circuit board 30121B, so as to leave a larger space in the inner side of the main circuit board 30121B, so that the height of the base part 3011 will not be limited by the height of the photosensitive chip 3030, which allows the base part 3011 to achieve a smaller height.

It is worth mentioning that according to other embodiment of the present invention, the filter 3040 is mounted on the upper end of the passage 301212B. Namely, it does not have to mount the filter 3040 on the base part 3011, such that the back focal length of the camera module can be decreased and, therefore, the height of the camera module can be decreased. Particularly, the filter 3040 can be embodied as a IR-Cut Filter (IRCF).

Figure 34:
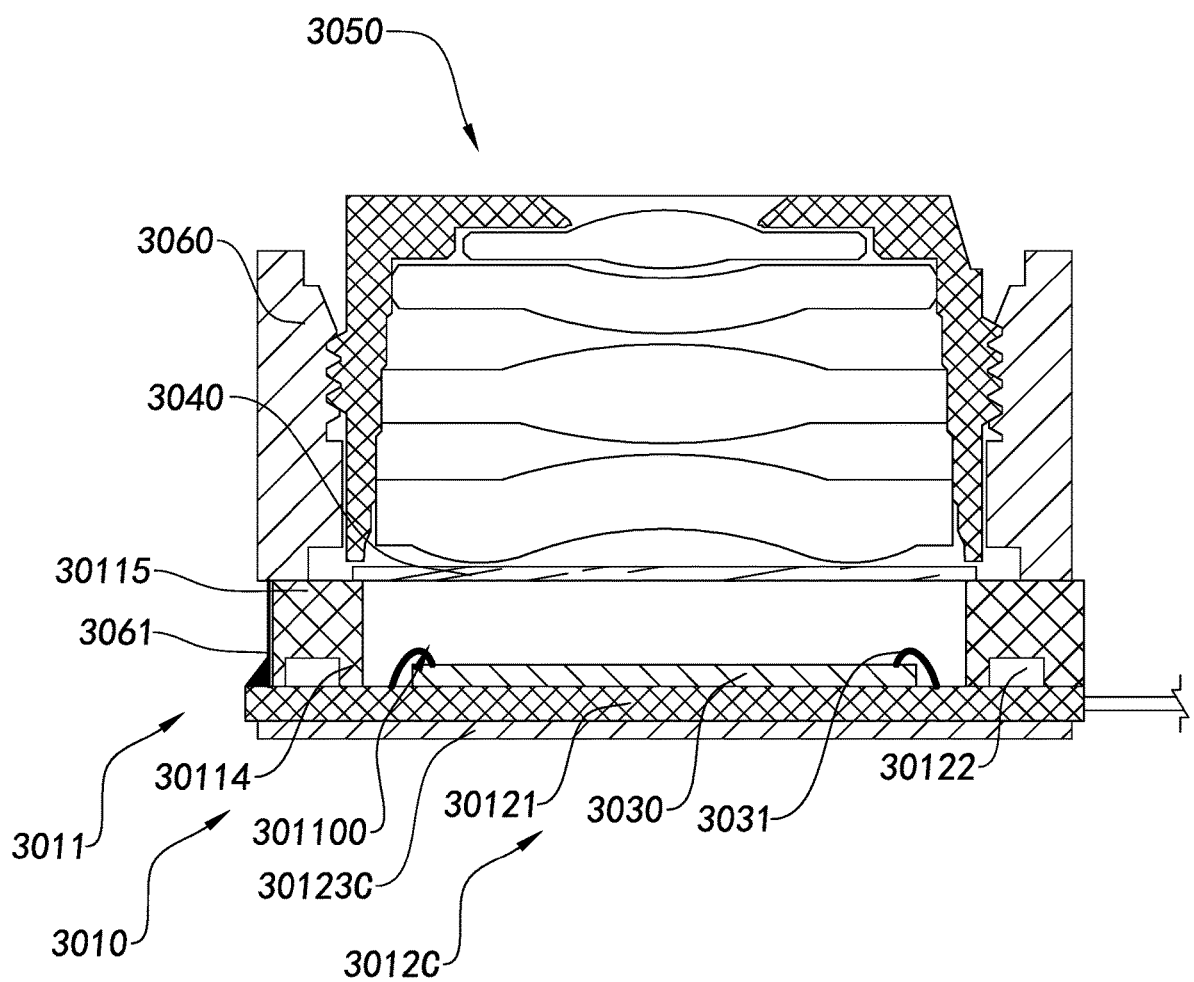
FIG. 34 is a sectional view of the integral packaging process based camera module and the integral base component thereof according to a 17th preferred embodiment of the present invention.

FIG. 34 is a sectional view of the camera module and the integral base component thereof according to a 17th preferred embodiment of the present invention.

The integral base component 3010 comprises a reinforced layer 30123C overlappingly connected with the bottom layer of the main circuit board 30121, so as to reinforce the structural strength of the main circuit board 30121. That is to say, the reinforced layer 30123C is attached on the bottom side of the main circuit board 30121 in the area corresponding to the area of the base part 3011 and the photosensitive chip 3030, so as to allow the main circuit board 30121 to stably and reliably support the base part 3011 and the photosensitive chip 3030.

Further, the reinforced layer 30123C is a metal plate, attached on the bottom of the main circuit board 30121, so as to reinforce the structural strength of the main circuit board 30121 and yet enhance the heat dispersion of the integral base component because it can effectively dissipate the heat generated by the photosensitive chip 3030.

It is worth mentioning that the main circuit board 30121 can be a FPC (flex print circuit) and being reinforced by the reinforced layer 30123C, such that the flexible and foldable FPC can also meet the loading requirement of the integral base component. In other words, there will be more options for the main circuit board 30121, such as PCB (printed circuit board), FPC, RG (rigid flex). The reinforced layer 30123B can increase the structural strength of the main circuit board 30121 and enhance the heat dispersion performance thereof, so as to allow the thickness of the main circuit board 30121 be reduced. Hence, the height of the integral base component can be further reduced, such that the height of the camera module assembled therewith can also be reduced.

Figure 35:
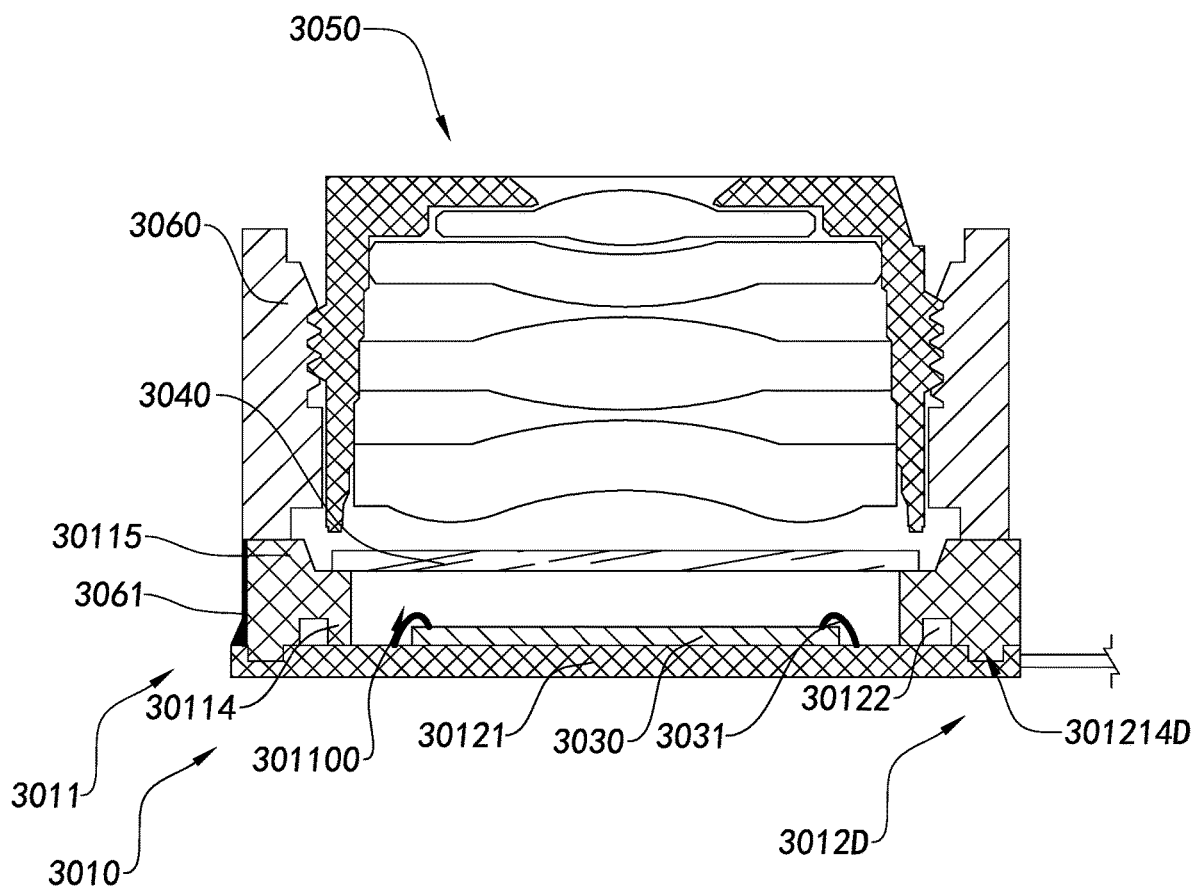
FIG. 35 is a sectional view of the integral packaging process based camera module and the integral base component thereof according to a 18th preferred embodiment of the present invention.

FIG. 35 is a sectional view of the camera module and the integral base component thereof according to a 18th preferred embodiment of the present invention.

Unlike the above preferred embodiment, the main circuit board 30121D has at least a reinforcing hold 301214D, wherein the base part 3011 is extended into the reinforcing hold 301214D, so as to reinforce the structural strength of the main circuit board 30121D.

The position of the reinforcing hold 301214D can be determined based on the needs and according to the demand on the structural strength of the circuit board. For example, it can provide a symmetrical structure. The structural strength of the main circuit board 30121D can be reinforced through providing the reinforcing hold 301214D. As a result, the thickness of the main circuit board 30121D can be reduced, such that the thickness of the camera module assembled therewith can be reduced, which enhances the heat dispersion of the integral base component.

It is worth mentioning that the reinforcing hold 301214D is in a groove shape, such that the molding material will not flow out from the reinforcing hold 301214D when manufacturing the integral base component.

Figure 36:
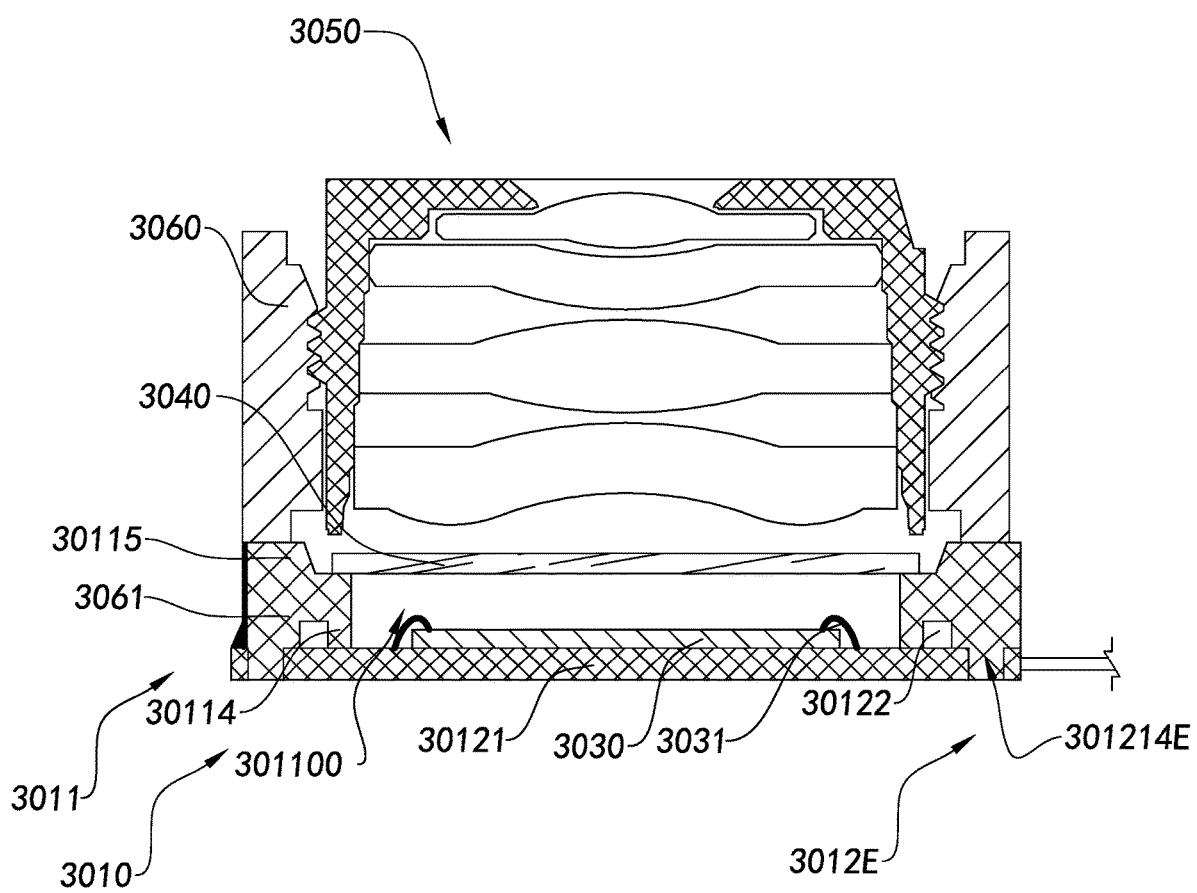
FIG. 36 is a sectional view of the integral packaging process based camera module and the integral base component thereof according to a 19th preferred embodiment of the present invention.

FIG. 36 is a sectional view of the camera module and the integral base component thereof according to a 19th preferred embodiment of the present invention.

Unlike the above preferred embodiment, the main circuit board 30121E has at least a reinforcing hold 301214E, wherein the base part 3011 is extended into the reinforcing hold 301214E, so as to reinforce the structural strength of the main circuit board 30121E.

The position of the reinforcing hold 301214E can be determined based on the needs and according to the demand on the structural strength of the circuit board. For example, it can provide a symmetrical structure. The structural strength of the main circuit board 30121E can be reinforced through providing the reinforcing hold 301214E. As a result, the thickness of the main circuit board 30121E can be reduced, such that the thickness of the camera module assembled therewith can be reduced, which enhances the heat dispersion of the integral base component.

It is worth mentioning that the reinforcing hold 301214E is a perforation, which passes through the main circuit board 30121E and communicates the two sides of the main circuit board 30121E. Hence, the molding material of the base part 3011 can fully bond with the main circuit board 30121E during the manufacturing of the integral base component, so as to form a more reliable compound material structure. In addition, contrasting to the groove shaped structure, it is easier to process and make the perforation.

Figure 37:
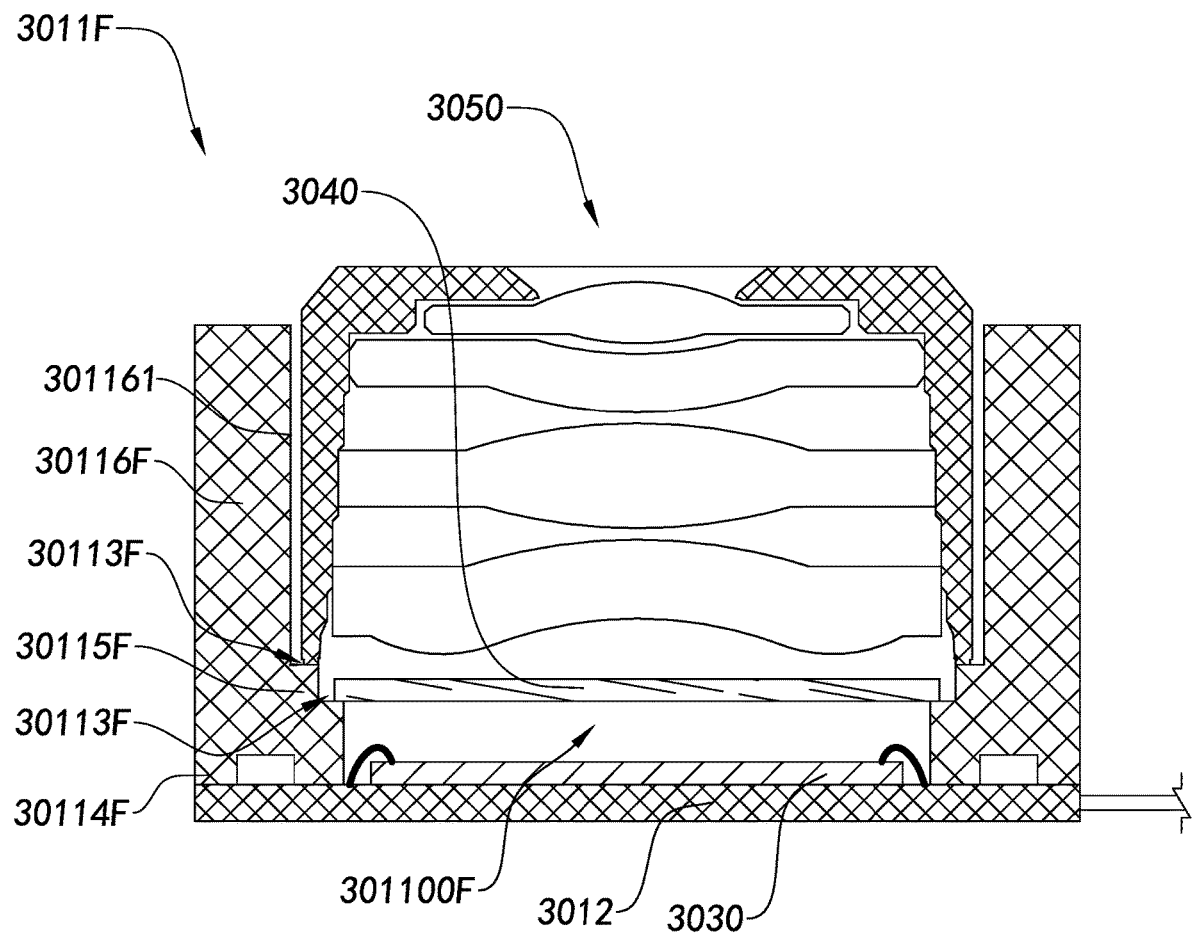
FIG. 37 is a sectional view of the integral packaging process based camera module and the integral base component thereof according to a 20th preferred embodiment of the present invention.

FIG. 37 is a sectional view of the camera module and the integral base component thereof according to a 20th preferred embodiment of the present invention.

Unlike the above preferred embodiment, the base part 3011F comprises a wrapping section 30114F, a filter mounting section 30115F, and a lens mounting section 30116F. The filter mounting section 30115F and the lens mounting section 30116F are successively moldingly and integrally connected to the wrapping section 30114F. The wrapping section 30114F is moldingly connected with the main circuit board 30121 for wrapping and covering the circuit element 30122 and the connecting wire 3031. The mounting section 30115F is for mounting the filter 3040. In other words, when the integral base component is utilized in the assembling of the camera module, the filter 3040 of the camera module will be mounted on the mounting section 30115F, such that the filter 3040 will be in the path of photoreception of the photosensitive chip 3030 and will not require extra mounting frame of the filter 3040. In other words, the base part 3011F can serve as a conventional frame here, but, based on the advantages of integral packaging technology, the top of the filter mounting section 30115F can also have a great evenness through molding technology, so that the filter 3040 can be mounted evenly, which is an advantage over conventional camera module. The lens mounting section 30116F is for mounting the lens 3050. In other words, when the integral base component is utilized in the assembling of the camera module, the lens 3050 will be mounted on the inner side of the lens mounting section 30116F of the base part 3011F, so as to provide a stable installation site for the lens 3050.

Further, the filter mounting section 30115F has a mounting groove 30113F, wherein the mounting groove 30113F is communicated with the corresponding through hole 301100F, so as to provide sufficient installation space for each the corresponding filter 3040, such that each the filter 3040 can be stably mounted. The lens mounting section 30116F has a lens mounting groove 301131F, wherein each the lens mounting groove 301131F is communicated with the corresponding through hole 301100F, so as to provide sufficient installation space for each the corresponding lens 3050 respectively.

In other words, the filter mounting section 30115F and the lens mounting section 30116F are integrally extended upward to form a step-shaped structure internally, so as to provide mounting positions for the filter 3040 and the lens 3050 respectively. Therefore, it does not require extra components in mounting the filter 3040 and the lens 3050. In other words, the base part 3011 has two mounting groove. One of the mounting groove 30113F is at a lower position, while the other mounting groove 30113F is at a higher position, such that a two-step step structure is formed. The lower mounting groove 30113F is for mounting the filter 3040, while the higher mounting groove 301113F is for mounting the lens 3050.

The lens mounting section 30116F has two lens inner walls 301161F. Each lens inner wall 301161F is in a closed ring shape and adapted for providing installation space for the lens 3050. It is worth mentioning that the surface of each lens inner wall 301161F of the lens mounting section 301162F is even and smooth, so as to be suitable for mounting the threadless lens 3050 to make a fixed focus module. Particularly, the lens 3050 can be affixedly on the lens mounting section 30116F through gluing.

Figure 38:
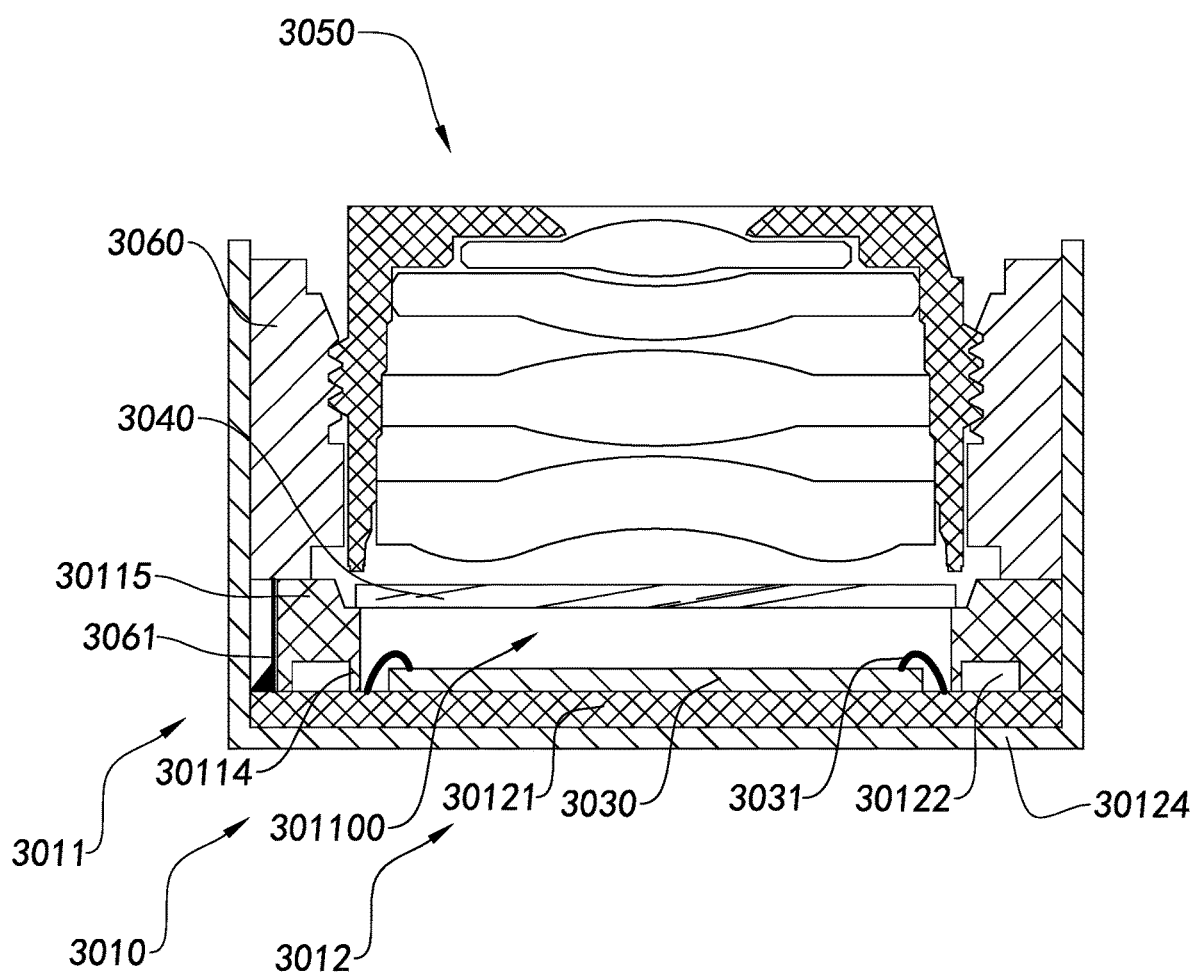
FIG. 38 is a sectional view of the integral packaging process based camera module and the integral base component thereof according to a 21st preferred embodiment of the present invention.

FIG. 38 illustrates the integral base component and the camera module according to a 21st preferred embodiment of the present invention. Unlike the above preferred embodiment, the integral base component 3010 comprises a shielding layer 30124, wrapping up the main circuit board 30121 and the base part 3011, so as to not only reinforce the structural strength of the main circuit board 30121, but also enhance the anti-electromagnetic interference ability of the integral base component 3010.

Figure 39:
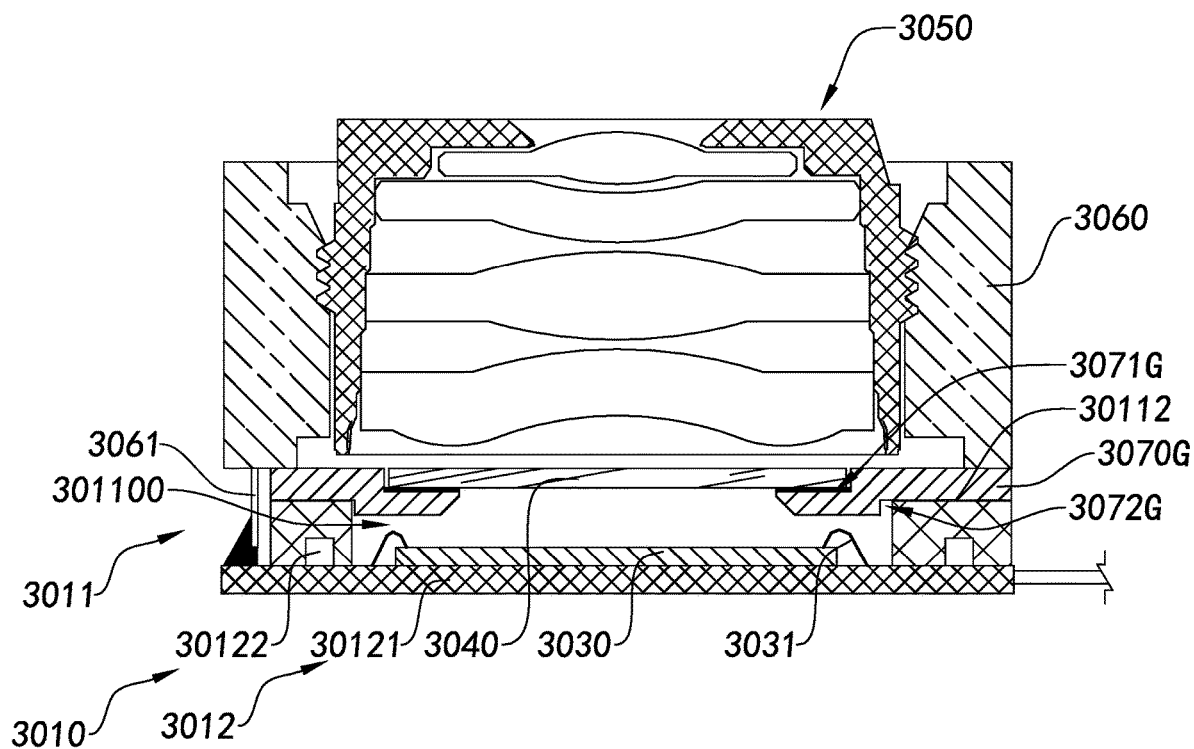
FIG. 39 is a sectional view of the integral packaging process based camera module and the integral base component thereof according to a 22nd preferred embodiment of the present invention.

FIG. 39 illustrates the camera module and the integral base component thereof according to a 22nd preferred embodiment of the present invention. Unlike the above preferred embodiment, the camera module comprises at least a support 3070G, adaptable for mounting each the filter 3040, each the lens 3050, and/or each the motor 3060. According to this embodiment of the present invention, the support is mounted on the base part 3011, wherein each of the filters 3040 is mounted on the support 3070, wherein each of the motors 3060 is mounted on the support 3070. The specific shape for the support 3070 can be determined based on the needs. For example, it may have protruding platforms for mounting the filters.

According to this embodiment of the present invention, the support 3070G has a first support groove 3071G and a second support groove 3072G, wherein the first support groove 3071G is for mounting the filter 3040, such that the surface of the filter 3040 will not protrude from the top of the support 3070. The second support groove 3072G is for being mounted on the base part 3011, such that the base part 3011 can be extended upward from the support 3070G and the position of the filter 3040 is relatively low, so as to reduce the back focal length of the camera module.

In other words, the support 3070G is extended into the through hole 301100 and extended downward, so as to keep the filter 3040 supported above the photosensitive chip 3030. By utilizing the space in the through hole 301100, the filter 3040 can be stably mounted and the filter 3040 will not occupy external space.

It is worth mentioning that the distance that the support 3070G extends inward is out of the photosensitive area of the photosensitive chip 3030. Namely, the support 3070G will not cover the photosensitive area of the photosensitive chip 3030, so as not to influence the photosensitive process of the photosensitive chip 3030. The dimensions of the support 3070G can be designed based on actual needs.

According to this embodiment and corresponded figures of the present invention, a zoom lens module is utilized as an example for illustration, wherein the lens 3050 is mounted on the motor 3060 and the motor 2060 is mounted on the support 3070G. In other words, the support 3070G provides installation sites for the filter 3040 and the motor 3060. According to some other embodiments of the present invention, the camera module may also be a fixed focus module. The lens 3050 is mounted on the support 3070G. Namely, the support 3070G provides installation sites for the filter 3040 and the lens 3050. Those skilled in the art should understand that the specific structure of the support 3070 and the type of the camera module shall not limit the present invention.

Figure 40:
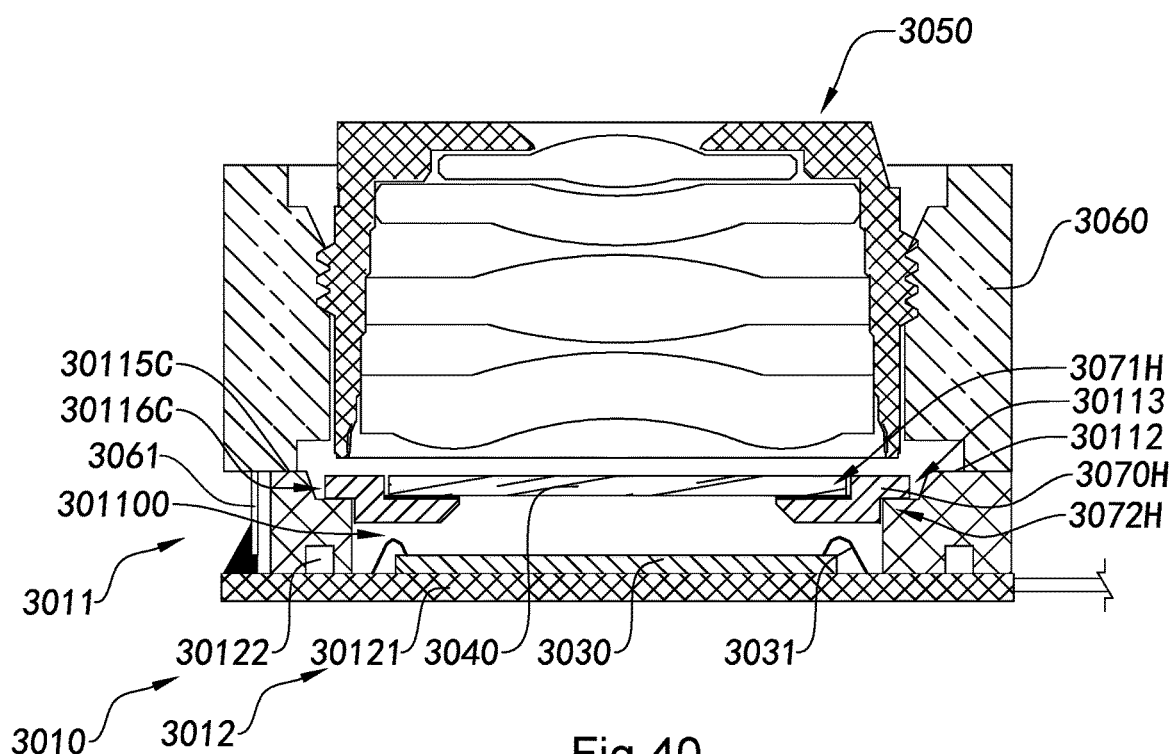
FIG. 40 illustrates an integral packaging process based camera module according to another implementation of the above 22nd preferred embodiment of the present invention.

FIG. 40 refers to the camera module according to another implementation of the above 22nd preferred embodiment of the present invention. Unlike the above preferred embodiment, the camera module comprises a support 3070H, wherein the support 3070H is adaptable for mounting the filter 3040. The support 3070H is mounted on the base part 3011, wherein filter 3040 is mounted on the base part 3011, wherein the motor 3060 or the lens 3050 is mounted on the base part 3011.

Further, the support 3070H is mounted on the mounting groove 30113 of the base part 3011, wherein the height of the mounting groove 30113 is greater than the mounting height of the support 3070H, such that the support 3070H will not protrude from the top of the base part 3011.

According to this embodiment of the present invention, the support 3070H has a first support groove 3071H and a second support groove 3072H, wherein the first support groove 3071H is for mounting the filter 3040, such that the surface of the filter 3040 will not protrude from the top of the support 3070H. The second support groove 3072H is for being mounted on the base part 3011, such that the base part 3011 can be extended upward from the support 3070H and the position of the filter 3040 is relatively low, so as to reduce the back focal length of the camera module.

In other words, the support 3070H is extended into the through hole 301100 and extended downward, so as to keep the filter 3040 supported above the photosensitive chip 3030. By utilizing the space in the through hole 301100, the filter 3040 can be stably mounted and the filter 3040 will not occupy external space.

It is worth mentioning that the distance that the support 3070H extends inward is out of the photosensitive area of the photosensitive chip 3030. Namely, the support 3070H will not cover the photosensitive chip 3030, so as not to influence the photosensitive process of the photosensitive chip 3030. The dimensions of the support 3070C can be designed based on actual needs.

Unlike the above preferred embodiment, the second support groove 3072H matches with the mounting groove 30113 of the packaging part to form a matched buckle structure, such that the support 3070H can be stably mounted on the mounting groove 30113. Comparing with the third preferred embodiment, the distance between the filter 3040 and the photosensitive chip 3030 is shorter in this embodiment, so as to provide a camera module with shorter back focal length.

According to this embodiment and corresponded figures of the present invention, a zoom lens module is utilized as an example for illustration, wherein the lens 3050 is mounted on the motor 3060 and the motor 2060 is mounted on the support 3070H. In other words, the support 3070H provides installation sites for the filter 3040 and the motor 3060. According to some other embodiments of the present invention, the camera module may also be a fixed focus module. The lens 3050 is mounted on the support 3070H. Namely, the support 3070H provides installation sites for the filter 3040 and the lens 3050. Those skilled in the art should understand that the specific structure of the support 3070H and the type of the camera module shall not limit the present invention.

Figure 41:
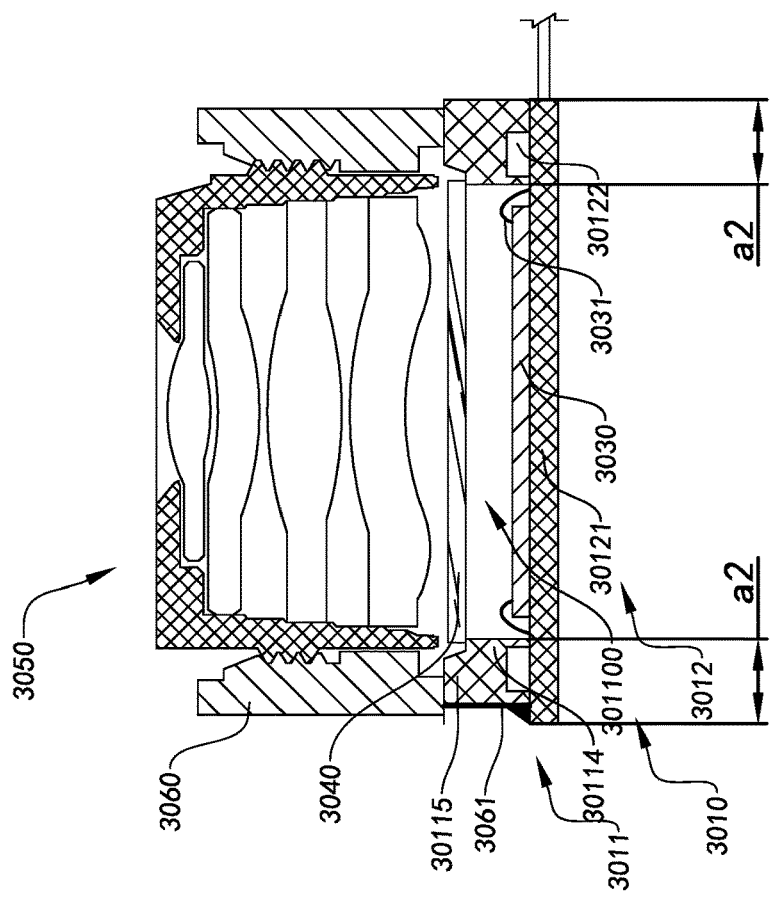
FIG. 41 a perspective view illustrating the comparison of the structural strengths of the conventional camera module and the integral packaging process based camera module according to the above preferred embodiment of the present invention.
Figure 41:
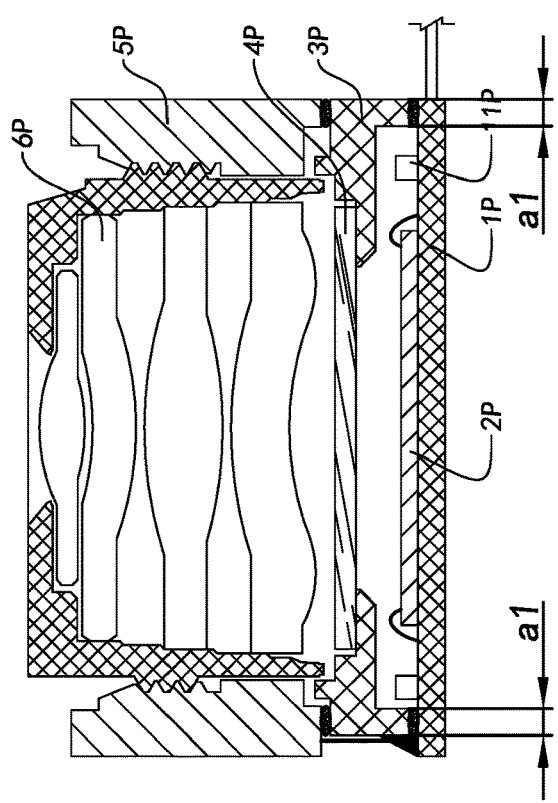
Figure 42:
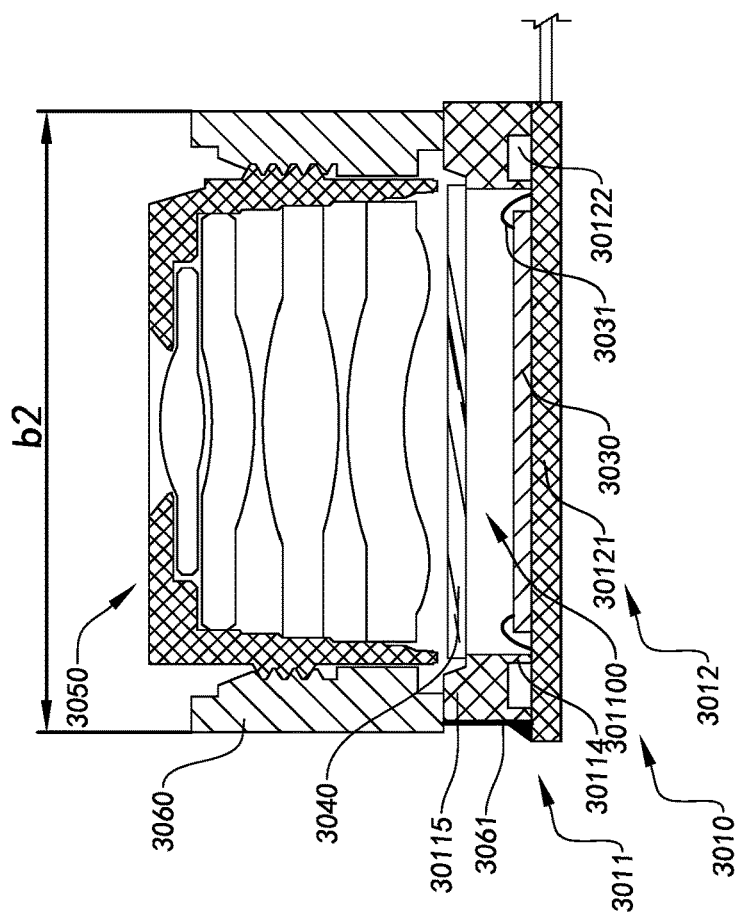
FIG. 42 is a perspective view illustrating the comparison of the lateral dimensions of the conventional camera module and the integral packaging process based camera module according to the above preferred embodiment of the present invention.
Figure 42:
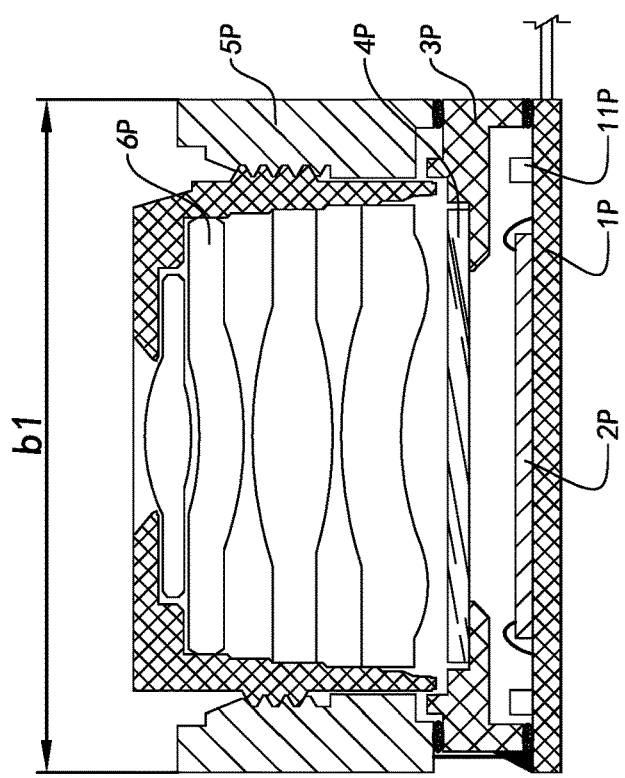

FIG. 41 a perspective view illustrating the comparison of the structural strengths of the conventional camera module and the integral packaging process based camera module according to the above preferred embodiment of the present invention. Referring to FIG. 42, the left is a conventional camera module, while the right is an integral packaging process based camera module according to the present invention. The "a1" refers to the thickness of the frame 3P of the conventional camera module, while the "a2" refers to the thickness of the base part 3011 of the camera module of the present invention.

The frame 3P of the conventional camera module is for mounting the filter 4P, the motor 5P or the lens 6P. Besides, the frame 3P is usually a plastic components made through injection molding. The frame 3P of the conventional camera module is usually mounted on the outer side of the circuit component 11P. Therefore, it can only reserve a limited installation space for the frame 3P if it does not increase the lateral dimensions of the main circuit board. Moreover, the thickness "a1" of the frame 3P is limited in a relatively small range, such as 0.3 mm. As a result, the area for the frame 3P and the circuit board 1P to be glued with each other is relatively small as well, rendering a relatively poor connection stability. In other words, the frame 3P can easily be separated from the circuit board 1P or have crack under a long-term use or stronger external impact.

Nevertheless, the base part 3011 of the integral packaging process based camera module according to a preferred embodiment of the present invention is integrally packaged on the main circuit board 30121, through, for example, molding and etc., to cover the circuit element 30122. Hence, the base part 3011 can have a larger mounting and installation space than the frame 3P. Furthermore, the base part 3011 is extended inward to the main circuit board 30121, so as not to expand the periphery dimensions of the main circuit board. According to this embodiment of the present invention, the base part 3011 may have a greater thickness "a2", such as 0.6 mm. The base part 3011 will have a better supporting stability. Besides, the base part 3011 can be firmly and reliably connected with the main circuit board 30121 through integrally packaging, so as to make the camera module more stable and reliable in use. In addition, the way that the base part 3011 being integrally packaged on the main circuit board 30121 reinforces the structural strength of the connecting area of the main circuit board 30121. The base part 3011 there serves to protect the main circuit board 30121.

Figure 43:
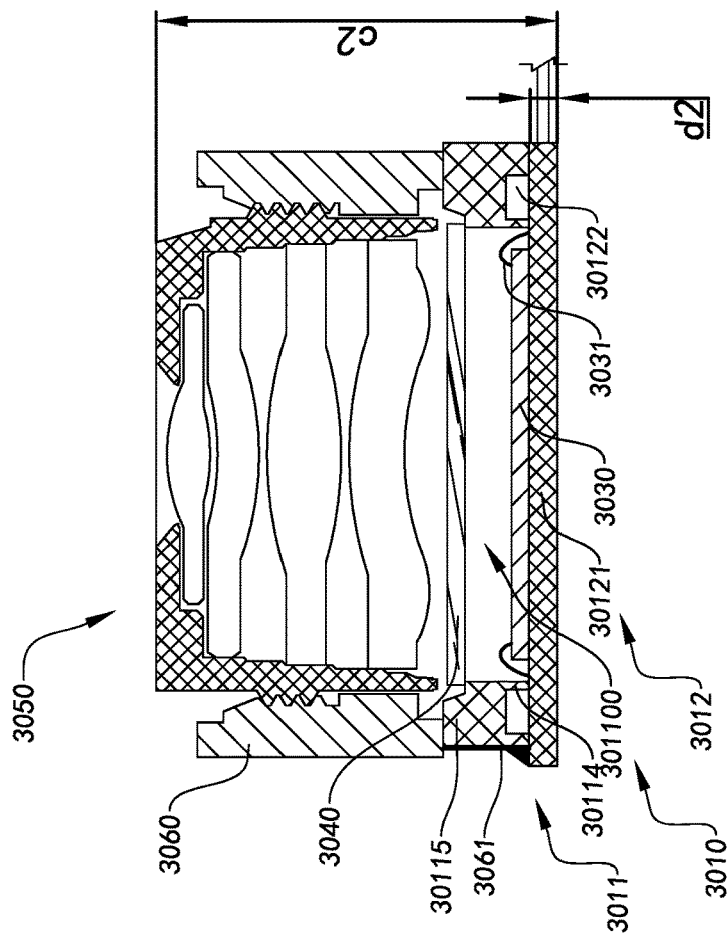
FIG. 43 is a perspective view illustrating the comparison of the heights of the conventional camera module and the integral packaging process based camera module according to the above preferred embodiment of the present invention.
Figure 43:
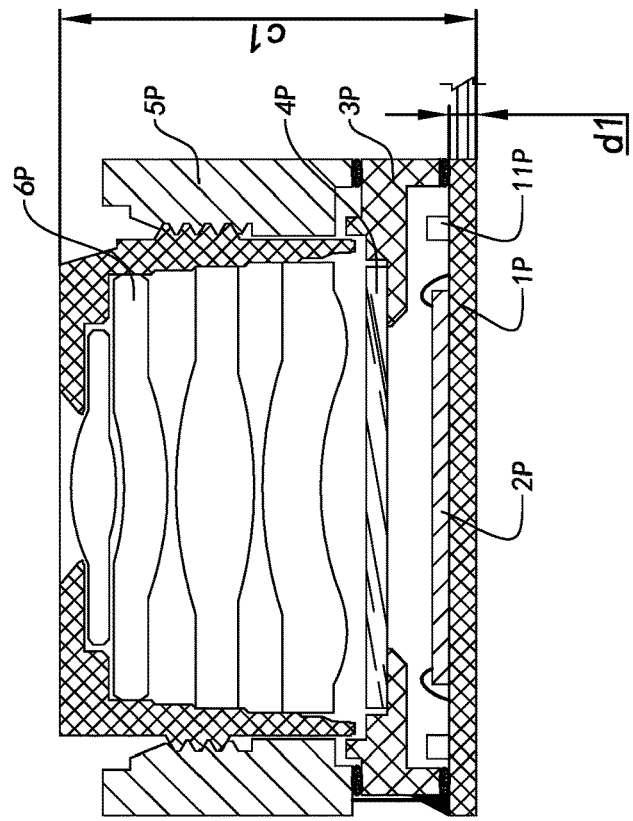

FIG. 42 is a perspective view illustrating the comparison of the lateral dimensions of the conventional camera module and the integral packaging process based camera module according to the above preferred embodiment of the present invention. Referring to FIG. 43, the left is a conventional camera module, while the right is an integral packaging process based camera module according to the present invention. The "b1" refers to the lateral dimensions of the section of the conventional camera module, while the "b2"

refers to the lateral dimensions of the section of the integral packaging process based camera module according to the present invention.

The frame 3P of the camera module based on conventional COB technology is mounted on the outer side of the circuit component 11P. The frame 3P and the circuit component 11P are mounting spatially independent to each other. Namely, they both have to occupy a certain space along. Moreover, in order to protect the circuit component 11P, it has to additionally reserve a certain safe distance, such as 0.35 mm, around the circuit component 11P. All these factors make the lateral dimensions "b1" of the camera module larger and curtail the potential of the lateral dimension reduction, rendering dissatisfaction with the demand for smaller camera module.

On the other hand, the base part 3011 of the integral packaging process based camera module according to the present invention is integrally packaged on the main circuit board 30121 to wrap and cover the circuit element 30122. Therefore, the base part 3011, on the basis of meeting the requirement of basic strength, only takes a smaller size, such as 0.15 mm, to wrap and cover the circuit element 30122. The base part 3011 and the circuit element 30122 are overlapped, which fully use the installation space. Accordingly, the lateral dimensions "b2" of the camera module can be reduced. Particularly, according to an embodiment of the present invention, the lateral dimension b2 of the integral packaging process based camera module can be shorter for 0.2 mm each side that the lateral dimension b1 of the conventional camera module.

Figure 44:
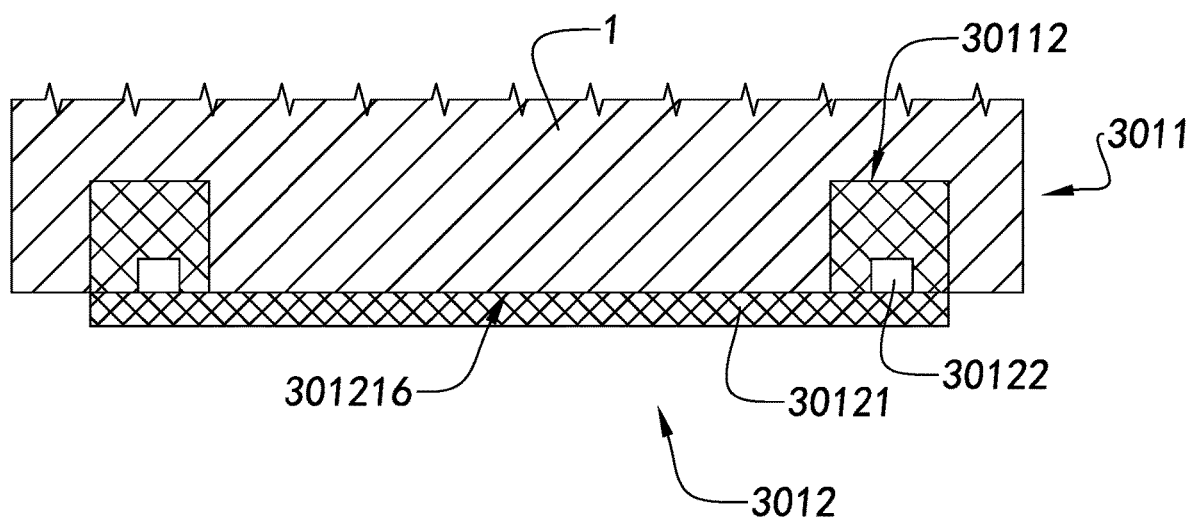
FIG. 44 illustrates the smoothness of the integral packaging process based camera module according to the above preferred embodiment of the present invention.

FIG. 43 is a perspective view illustrating the comparison of the heights of the conventional camera module and the integral packaging process based camera module according to the above preferred embodiment of the present invention. Referring to FIG. 44, the left is a conventional camera module, while the right is an integral packaging process based camera module according to the present invention. The "c1" refers to the height of the conventional camera module, while the "c2" refers to the height of the integral packaging process based camera module of the present invention. The "d1" refers to the thickness of the circuit board 1P of the conventional camera module, while the "d2" refers to the thickness of the main circuit board 30121 of the integral packaging process based camera module of the present invention. The frame 3P of the conventional camera module is glued on the circuit board 1P. Besides, in order to meet the demands of the AA adjustment, it has to utilize more glue, so the glue layer will be thicker. Moreover, it has to keep a installation distance above the circuit component 11P. As a result, the overall height of the camera module, "c1", will be greater. Besides, the frame 3P is located on the outer side of the circuit component 11P, which takes a longer lateral span length. Thus, the circuit board 1P must have higher strength to keep the shape of the camera module, rendering a greater thickness "d1" of the circuit board 1P, which causes a greater overall height "d1" of the camera module as well.

However, according to the integral packaging process based camera module of the present invention, the base part 3011 is integrally packaged on the main circuit board 30121, which does not require gluing space, AA adjustment space, and the safe distance for the circuit element 30122, so the height "c2" of the molding process based camera module can be decreased. In addition, the base part 3011 wrap and cover the circuit element 30122 that the base part 3011 can be extended inward so as to reduce the lateral span length of the base part 3011, which equals to reduce the deformation extent of the circuit board, so as to allow decreasing on the strength requirement to the main circuit board 30121. Also, the base part 3011 can reinforce the structural strength of the main circuit board 30121, so as to allow decreasing on the thickness "d2" of the main circuit board 30121. Hence, the overall height "c1" of the integral packaging process based camera module can further be reduced.

FIG. 44 illustrates the smoothness of the integral packaging process based camera module according to the above preferred embodiment of the present invention.

The frame 3P of conventional camera module is made by injection molding and assembled with the camera module by gluing. As a result, it is easier to have issues like tilt, bias, and etc., in the conventional camera module. The surface smoothness and evenness of the frame 3P is relatively poor, which cannot provide smooth and even installation condition for components, such as filter, motor, lens, and etc.

For the integral packaging process based camera module according to the present invention, the base part 3011 is connected with the main circuit board 30121 through integrally packaging, such as being moldingly connected with the main circuit board 30121. Further, in the manufacturing of the integral base component a molding mold 1 is utilized for forming the base part. The use of the molding mold 1 ensures the evenness and smoothness of the surface of the base part 3011 and keeps the surfaces of the top surface 30112 of the base part 3011 and the attaching area 301216 of the photosensitive chip consistent, so as to prepare a smooth and even installation condition for the filter 3040, the lens 3050 or the motor 3060 and to ensure that the optic axes of the photosensitive chip 3030, the filter 3040, the lens 3050, and the motor 3060 are consistent.

Figure 45:
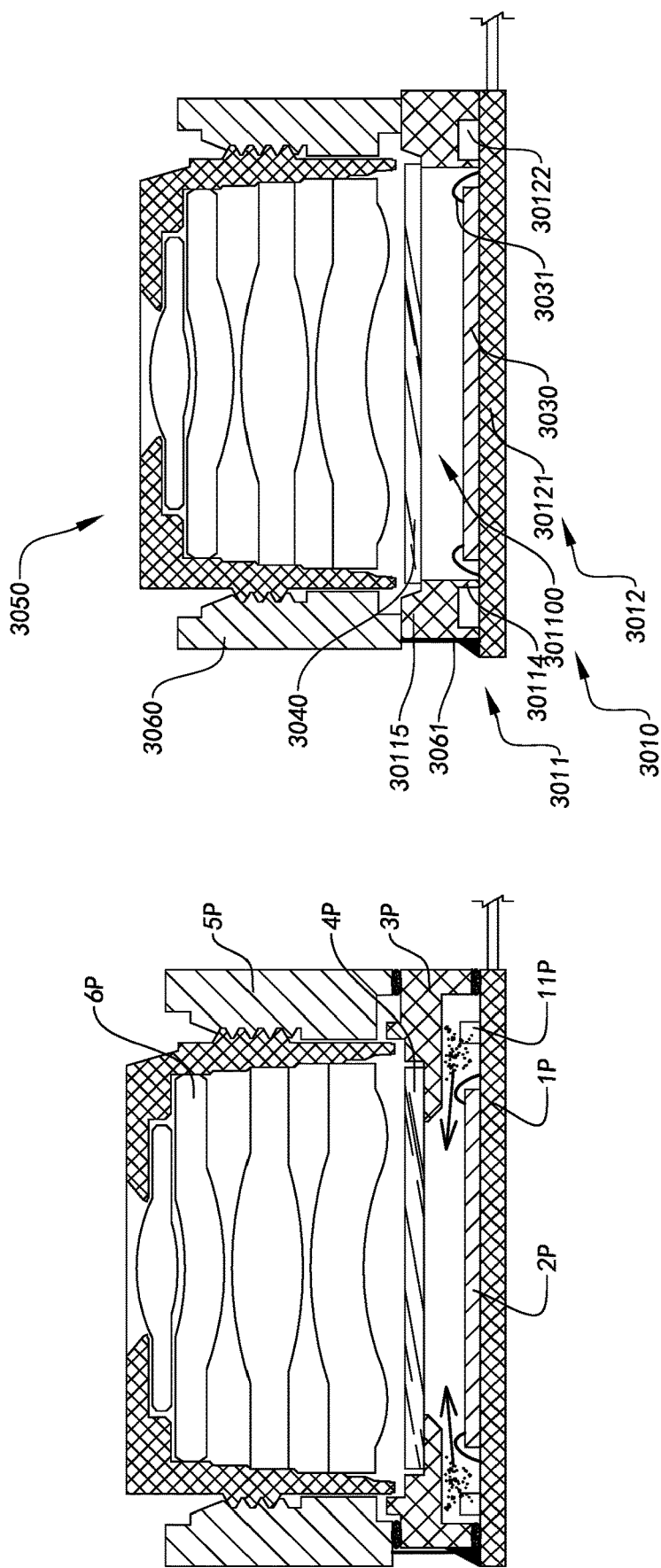
FIG. 45 is a perspective view illustrating the comparison of the imaging of the conventional camera module and the integral packaging process based camera module according to the above preferred embodiment of the present invention.

FIG. 45 is a perspective view illustrating the comparison of the imaging of the conventional camera module and the integral packaging process based camera module according to the above preferred embodiment of the present invention. Referring to FIG. 46, the left is a conventional camera module, while the right is an integral packaging process based camera module according to the present invention. The circuit component 11P of the conventional camera module is exposed in the enclosed environment intercommunicated with the photosensitive chip 2P. The circuit component 11P may have some dusts attached thereon during the assembling process. The dusts include solder resist fell when soldering and welding the motor, which can be remained on the surface of the circuit component 11P and difficult to be removed. After the camera module is packaged, the dusts can randomly move, if the dusts fall on the photosensitive chip, especially in the photosensitive area thereof, the camera module will have dark spots, which makes the imaging quality of the camera module worse.

Nevertheless, according to the integral packaging process based camera module of the present invention, the circuit element 30122 is wrapped and coverer by the base part, instead of exposed in the same environment to the photosensitive chip 3030. Therefore, even if the circuit element 11P carries residual dust, such as solder resist and etc., it will not fall on the photosensitive chip after the packaging of the camera module, such that the stability of the imaging quality of the camera module can be ensured and it will not generate dark spot after the packaging.

Figure 46A:
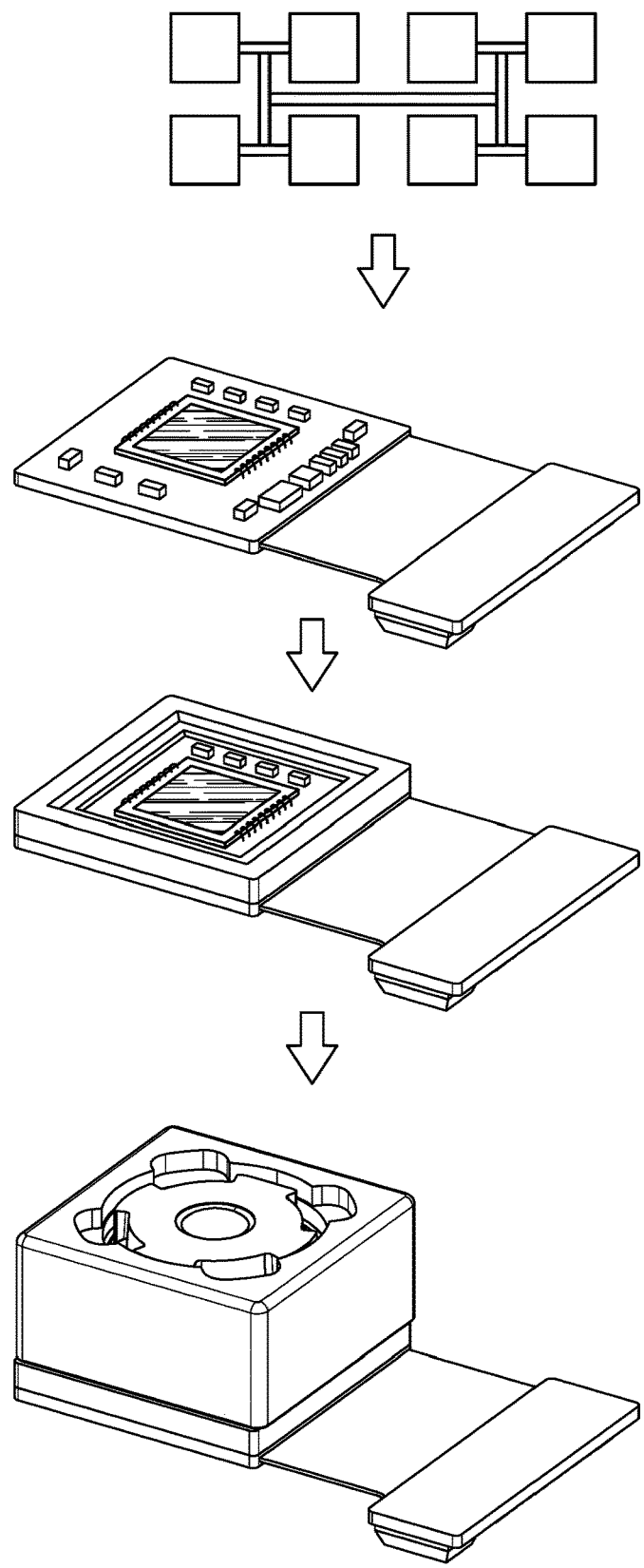
FIGS. 46A and 46B are perspective views illustrating the comparison of the manufacturing processes of the conventional camera module and the integral packaging process based camera module according to the above preferred embodiment of the present invention.
Figure 46B:
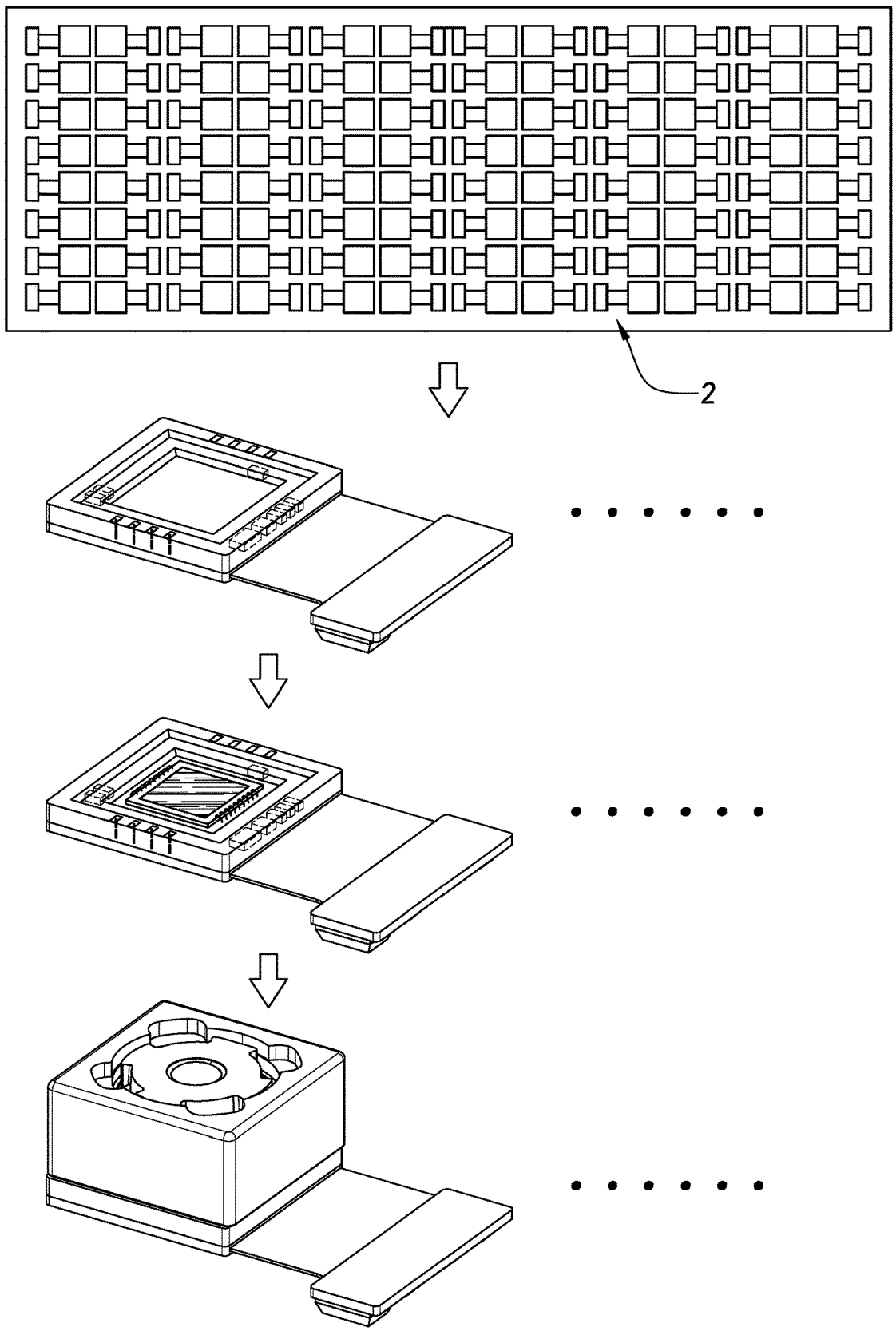

FIGS. 46A and 46B are perspective views illustrating the comparison of the manufacturing processes of the conventional camera module and the integral packaging process based camera module according to the above preferred embodiment of the present invention.

The assembling and manufacturing processes of the conventional camera module are usually like the following: making the frame 3P through injection molding, cutting the whole circuit board and gluing the frame 3P on a single piece of the circuit board 1P, attaching components like the chip on the circuit board 1P, mounting the filter 4P, the lens 6P or the motor 5P on the frame 3P to finish the assembling of the a fixed focus module or a zoom lens module. In this type of assembling and manufacturing processes, because the frame 3P is made through injection molding, it can only produce fewer pieces, such as 4-8 pieces, at a time. Then each piece of the frame 3P is respectively glued on a single piece of the circuit board 1P. As a result, the production efficiency of the camera module is poor and it is difficult to control the consistency among the modules.

On the other hand, the assembling and manufacturing processes of the integral packaging process based camera module according to the present invention usually comprises:

integrally forming a plurality of the base part 3011 on a makeup circuit board 2 at once through molding, dividing the makeup circuit board into a plurality of independent integral base component, attaching the photosensitive chips 3030 on the integral base components, and mounting the filter 3040, the lens 3050 or the motor 3060 on the base part to finish the assembling of the a fixed focus module or a zoom lens module.

This process is different from conventional assembling process. The makeup process greatly enhance the production efficiency of the camera module. Besides, it is much easier to guarantee the consistency among a plurality of modules. For instance, it can form 90 of the integral base components in one makeup process. Because the module of the present invention is integrally packagingly formed through packaging technology, the embodiments of the present invention utilize molding technology and process of the packaging technology as examples of the illustration. Hence, in order to disclose the content of the present invention more clearly, the molding technology and process will be briefed first. In addition, based on the difference of the equipment, molding technology usually includes injection molding and mold pressing. Injection molding further includes die-casting and mold-pressing injection molding. An injection molding machine is a major molding machine to utilize plastic forming mold to make plastic product of various shapes with thermoplastic or thermoset material. Injection molding is achieved through the injection molding machine and the mold. "Mold pressing" is a short for compression molding or compression moulding. A mold pressing material, such as plastic material or rubber, can be heated and pressed in a closed molding chamber to form the product. Although the present invention utilizes mold pressing of the molding technique as an example in the specification, person skilled in the art should be able to understand that the present invention shall not be limited in mold pressing technology only, but also include other molding technologies and processes. Therefore, the present invention shall not be limited here.

Figure 47:
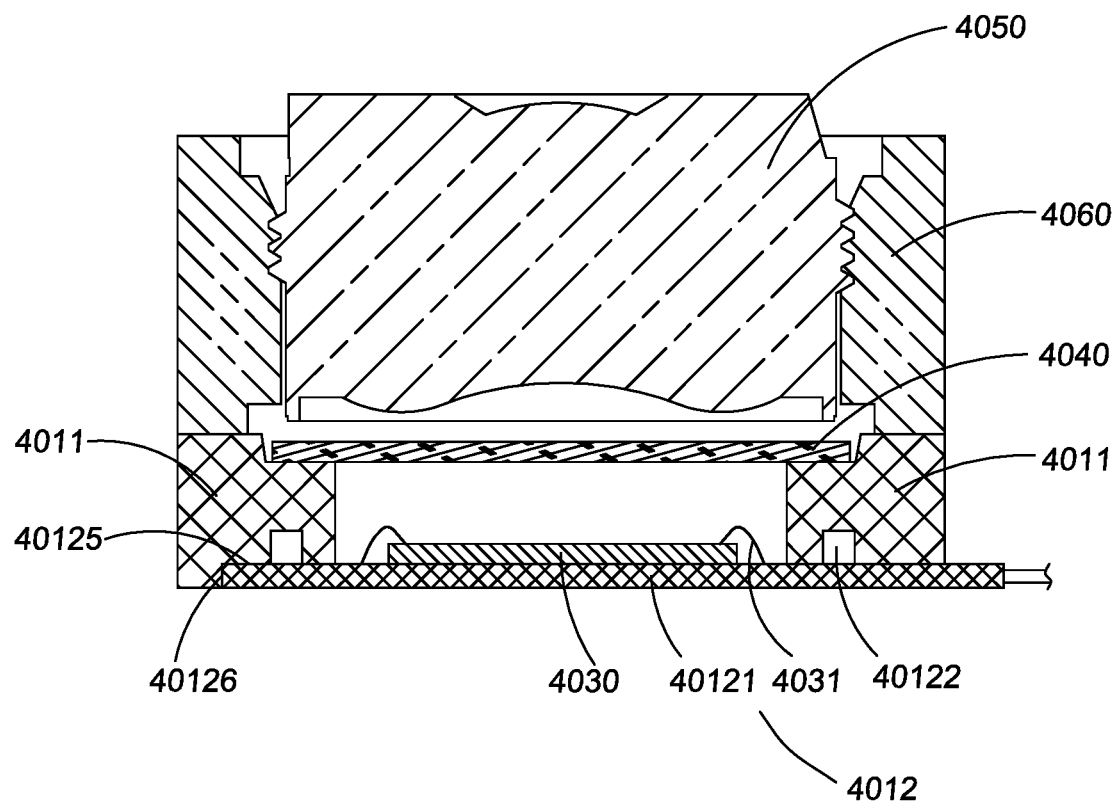
FIG. 47 is a side sectional perspective view of an integral packaging process based camera module according to a 23rd preferred embodiment of the present invention.

FIG. 47 illustrates an integral packaging process based camera module according to a 23rd preferred embodiment of the present invention, wherein MOB technology is utilized. The integral packaging process based camera module comprises a packaging photosensitive unit 4010, a filter 4040, a lens 4050, and a motor 4060. Person skilled in the art should be able to understand that according to another embodiment, such as for a fixed focus (FF) module, the motor 4060 is unnecessary or optional. Therefore, the present invention shall not be limited hereto. In other words, this preferred embodiment of the present invention utilizes an autofocus (AF) module as an example. The packaging photosensitive unit 4010 comprises a packaging part 4011 and a photosensitive unit 4012. The photosensitive unit 4012 further comprises a photosensitive chip 4030 and a circuit board 40121 comprising a set of electronic components 40122 (e.g. resistor, capacitor, actuator, and etc.; IC hereinafter) and a set of lead wires 4031 arranged thereon. The lead wire 4031 connects and communicates the photosensitive chip 4030 and the circuit board 40121. Indeed, the photosensitive chip 4030 and the circuit board 40121 may also be connected and communicated through other means. According to this preferred embodiment of the present invention, the lead wire 4031 can be embodied as a gold wire. The packaging part 4011 serves as the frame to bear the filter 4040. The packaging part 4011 may also have electrical specification, such as providing engraving circuit to electrically connect the motor 4060 and the photosensitive unit 4012, which can substitute conventional motor bonding wire and reduce conventional technology process. Certainly, the motor 4060 and the circuit board 40121 can also be connected through conventional motor weld leg. During the packaging process, the packaging part 4011 seals and packages the circuit board 40121. According to this preferred embodiment of the present invention, the packaging part 4011 seals and packages all the area on the circuit board 40121 except the contacting area of the photosensitive chip 4030 and the lead wire 4031. The packaging part 4011 not only seals and packages the top surface 401215 of the circuit board 40121, but also sealingly and packagingly wraps and covers at least one side 401216 of the circuit board 40121. It is understandable that the packaging part 4011 may also integrally package the electronic component 40122 in the packaging process. The motor 4060 is electrically connected with the circuit board 40121 through at least a motor pin.

Figure 49A:
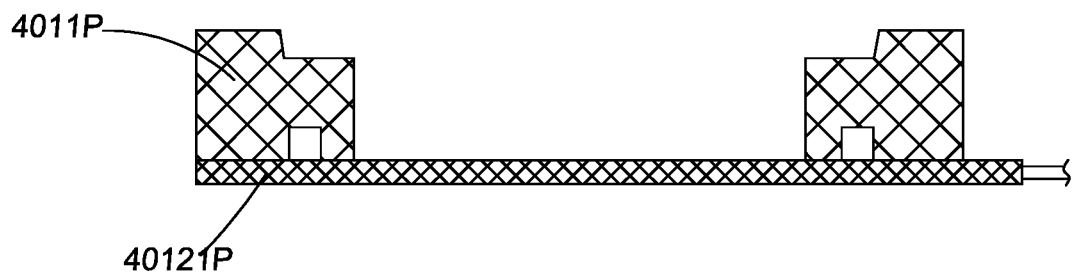
FIG. 49A is a perspective view illustrating a camera module formed through molding according to PRIOR ART.
Figure 49B:
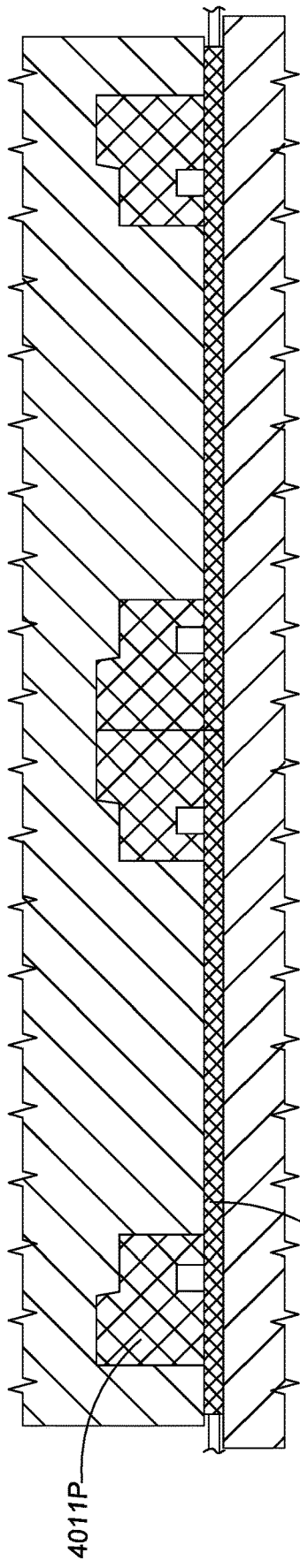
FIG. 49B is a perspective view illustrating a camera module formed through conventional molding according to PRIOR ART.
Figure 49C:
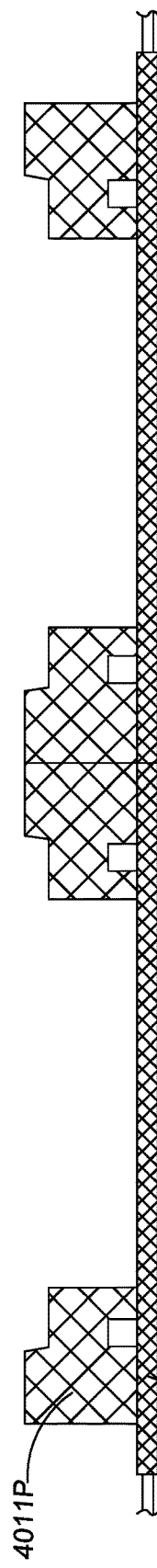
FIG. 49C is a perspective view illustrating a camera module formed through conventional molding according to PRIOR ART.
Figure 49D:
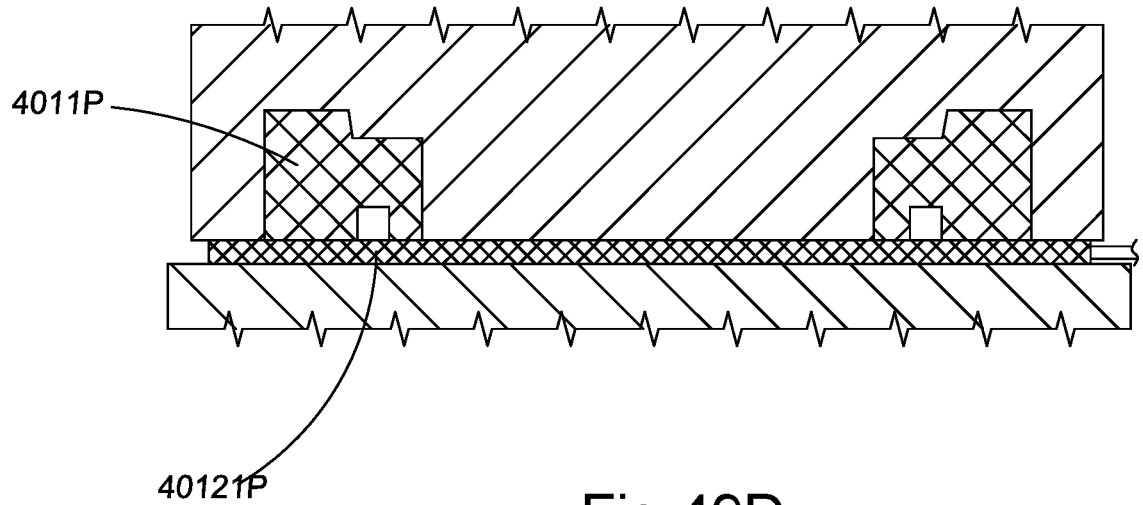
FIG. 49D is a perspective view illustrating a camera module formed through conventional molding according to PRIOR ART.
Figure 49E:
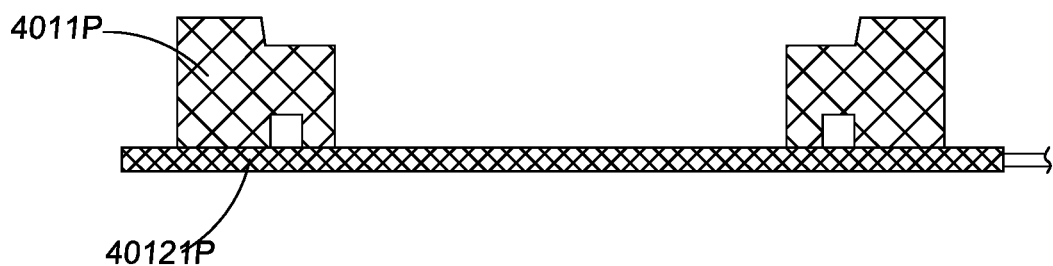
FIG. 49E is a perspective view illustrating a camera module formed through conventional molding according to PRIOR ART.
Figure 50:
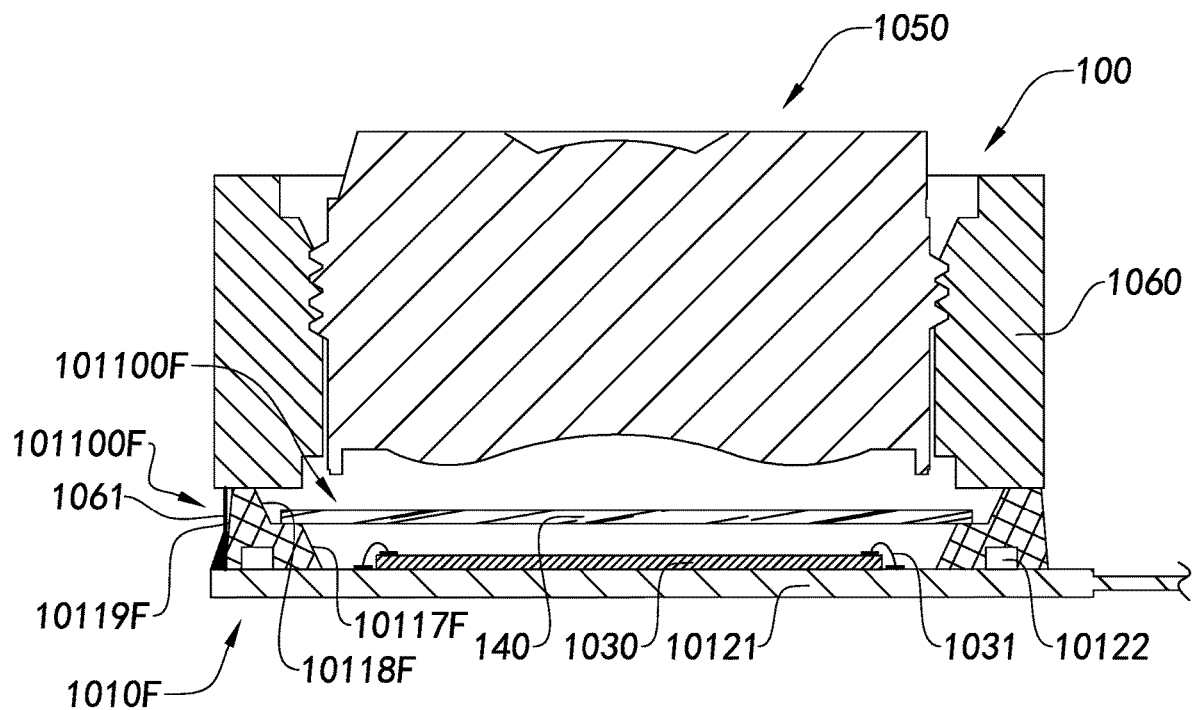
FIG. 50 is a sectional perspective view of a camera module according to a 25th preferred embodiment of the present invention.
Figure 51:
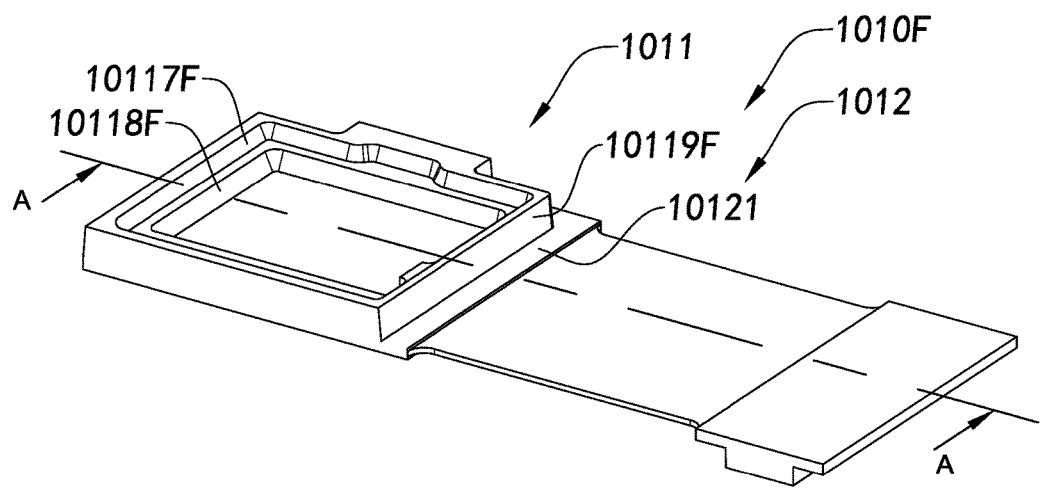
FIG. 51 is a perspective view of a molding circuit unit of the camera module according to a 25th preferred embodiment of the present invention.
Figure 52:
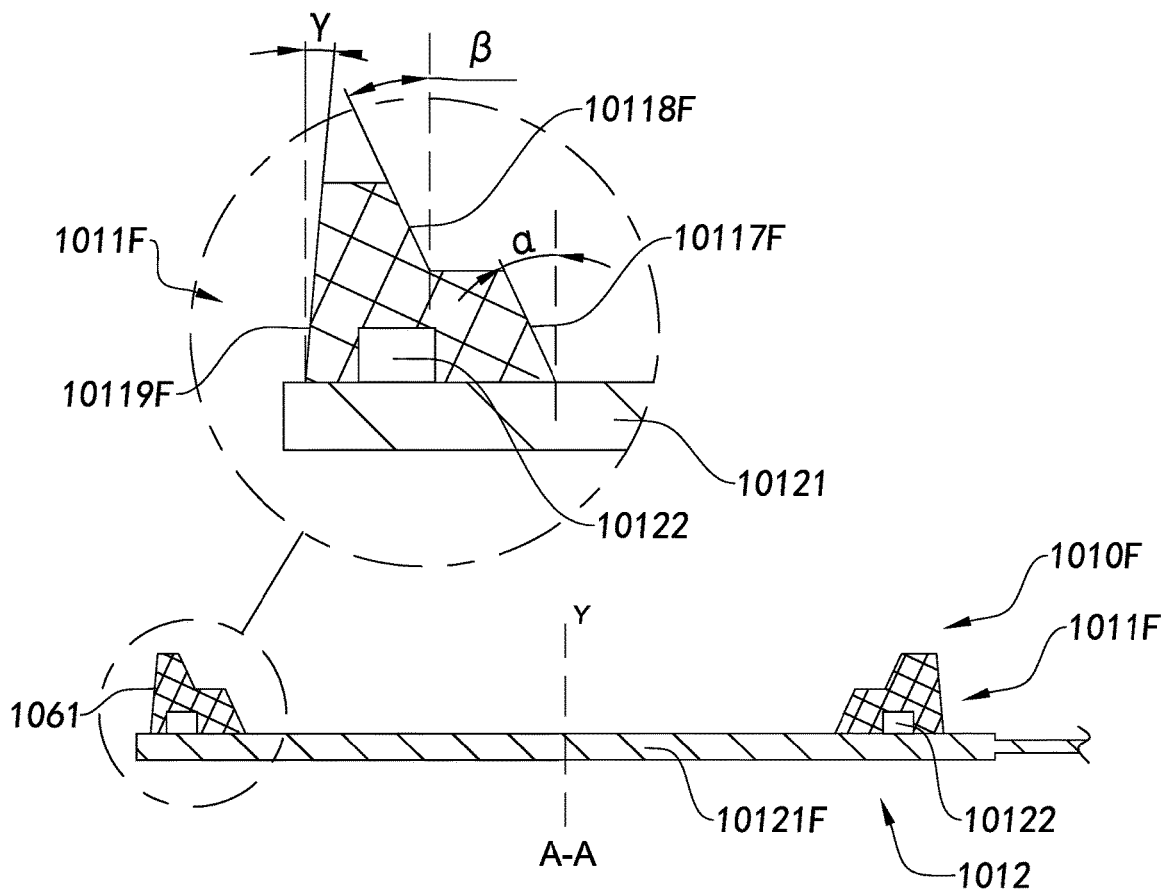
FIG. 52 illustrates the inclination of a molding circuit unit of the camera module according to a 25th preferred embodiment of the present invention.
Figure 53:
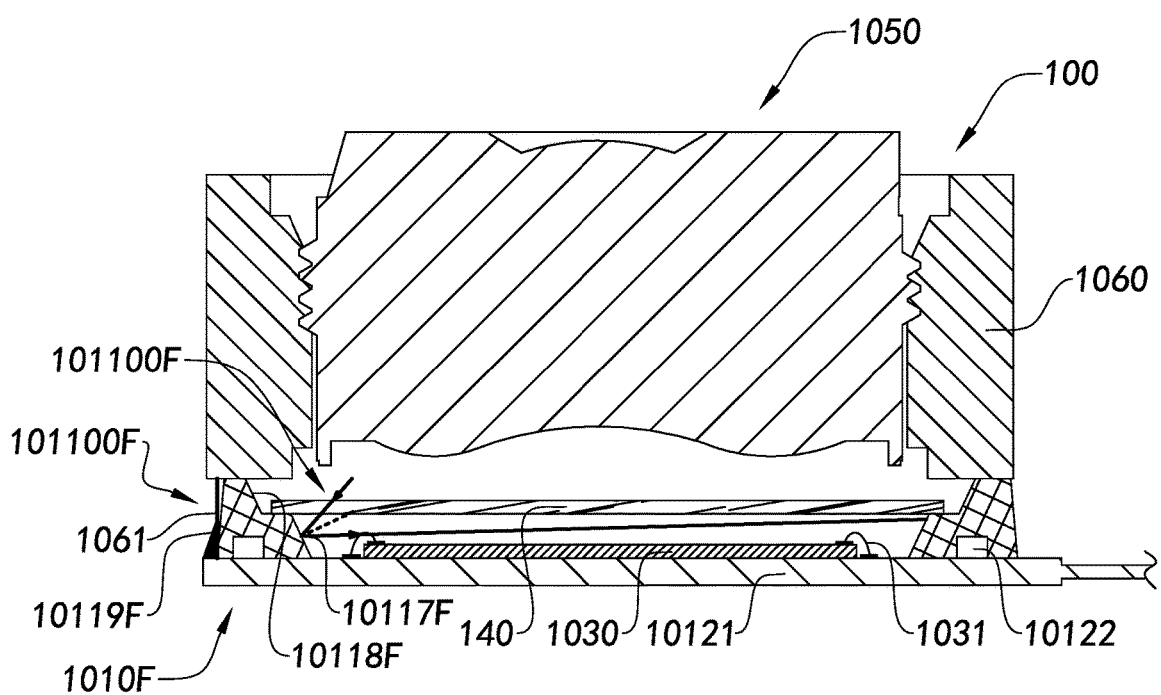
FIG. 53 is a perspective view of a camera module according to the above 25th preferred embodiment of the present invention.

FIGS. 49A-49E illustrate the molded module according to prior art. Referring to FIG. 50A, the left side of the packaging part 4011P is aligned with the circuit board 40121P. Such design is also common to prior art. Hence, in order to meat the above design requirements, referring to FIG. 49B, the module has to have the structure illustrated in the figure before the assembling. When molding, the circuit board 40121P has to be processed as FIG. 49B illustrated. That is to connect two or more pieces of the circuit board 40121P together for the molding process. Finally, the middle portion as FIG. 49B illustrated will be cut by machine. Therefore, it will require an extra cutting device. If the method illustrated in FIG. 49B is not used, considering that there must be a certain deviation in the alignment of the circuit board 40121P and the mold and the marginal of the circuit board 40121P is not likely to align with the packaging part 4011P, the design will usually be like what FIG. 49C illustrates. Referring to the figure, the circuit board 40121P has to protrude for a little for mold press fitting. The protruding length of the circuit board 40121P is usually 0.1 mm~1 mm.

Therefore, contrasting with the prior art, the shrinkage design of the circuit board 40121 of the integral packaging process based camera module of the present invention allows the side of the packaging part 4011 wraps and covers the side 401216 of the circuit board 40121, so as to reserve certain dislocation space for the circuit board 40121 and the side of the packaging part 4011. Hence, the circuit board 40121 will not protrude from the side after the molding process, which saves the cutting process and enhances the quality of the product.

It is worth mentioning that the packaging part 4011 can sealingly and packagingly wrap and cover the two sides of the circuit board 40121. According to this preferred embodiment of the present invention, it only seal and package the left side of the circuit board 40121, which is the side 401216 because the right side has other component, such as the flexible printed circuit connected therewith. Nonetheless, person skilled in the art should be able to understand that the packaging part 4011 is able to not only seal and package the side 401216 of the circuit board 40121, but also, sealingly and packagingly wrap and cover part or all of the areas of two sides of the circuit board laterally according to another embodiment. Therefore, the present invention shall not be limited here.

Figure 48:
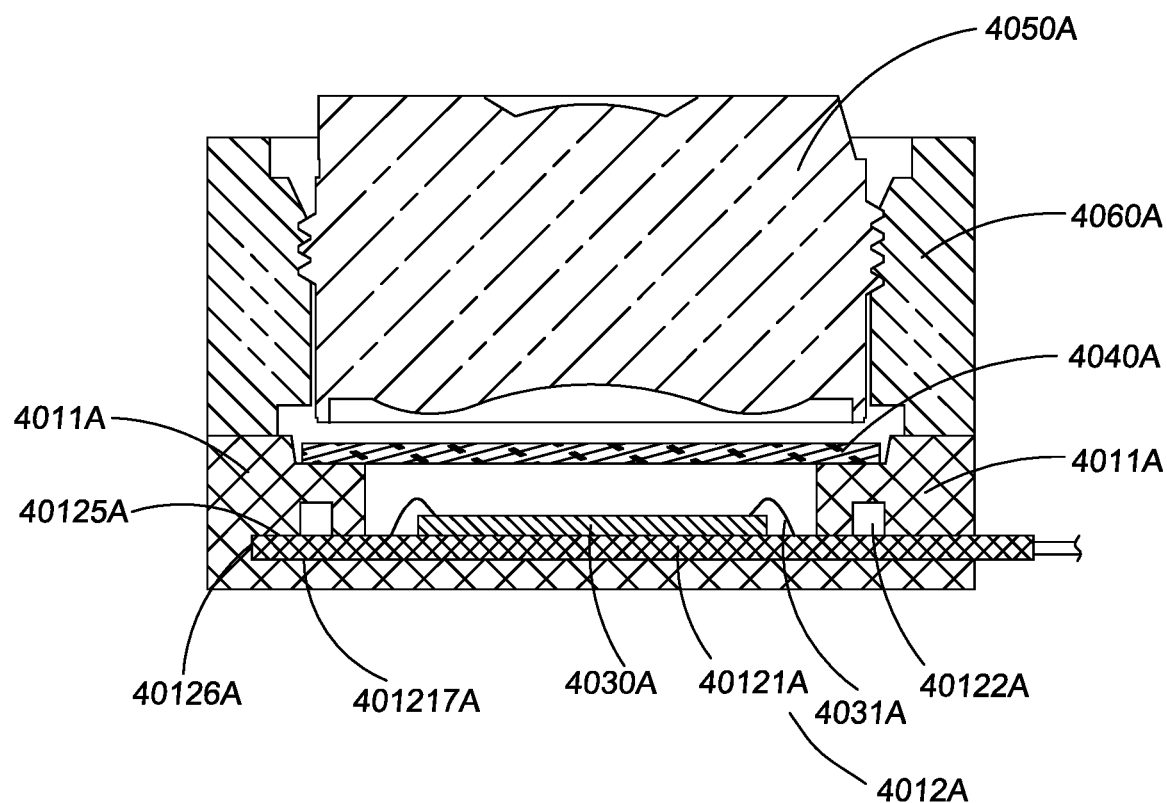
FIG. 48 is a side sectional perspective view of an integral packaging process based camera module according to a 24th preferred embodiment of the present invention.

FIG. 48 illustrates the integral packaging process based camera module according to a 24th preferred embodiment of the present invention. In order to ensure that the module can be installed and positioned easily after the molding process and to enhance the smoothness and evenness, it utilizes MOB technology as well. The integral packaging process based camera module comprises a packaging photosensitive unit 4010A, a filter 4040A, a lens 4050A, and a motor 4060A. Similarly, the example of an AF module disclosed the motor 4060A, but the other example of FF module do not require the motor 4060A. Therefore, the present invention shall not be limited here.

Specifically, the packaging photosensitive unit 4010A comprises a packaging part 4011A and a photosensitive unit 4012A. The photosensitive unit 4012A further comprises a photosensitive chip 4030A and a circuit board 40121A comprising a set of electronic components 40122A and a set of lead wires 4031A arranged thereon. The packaging part 4011A serves as the frame to bear the filter 4040A. The engraving circuit of the molding portion 11A is electrically connected with the motor 4060A and the photosensitive unit 4012A. Comparing with the above preferred embodiment of the present invention, the packaging part 4011A not only seals and packages the electronic component 40122A and the circuit board 40121A and sealingly and packagingly wraps and covers at least one side 401216A and the top side 1221A of the circuit board 40121A, but also moldingly seals and packages a bottom 401217A of the circuit board 40121A. It ensures the overall evenness and smoothness of the sides and bottom of the integral packaging process based camera module after the molding process, such that the installing and positioning on other tool can be easier.

It is worth mentioning that the packaging part 4011A may sealingly and packagingly wrap and cover all of the bottom 401217A of the circuit board 40121A in some cases. Nevertheless, according to another embodiment, based on different needs, it may only sealingly and packagingly wrap and cover part of the bottom 401217A of the circuit board 40121A. Therefore, the present invention shall not be limited here.

It is worth mentioning that, according to this preferred embodiment of the present invention, because the right side of the camera module as illustrated in the figure may still be connected with other element or be processed with other technology, the right side of the circuit board 40121A is not sealed and packaged. Nonetheless, according to another embodiment, the packaging part 4011A may sealingly and packagingly wrap and cover two or more sides of the circuit board 40121A at once and sealingly and packagingly wrap and cover all or part of the area of the bottom 401217A of the circuit board 40121A at the same time. Therefore, the present invention shall not be limited here.

FIGS. 50-55 and 58 illustrate a camera module according to a 25th preferred embodiment of the present invention. The camera module 100 can be utilized on various electronic devices 300, for example but not limited to smart phone, wearable device, computer, TV, vehicle, camera, monitoring device, and etc. The camera module can coordinate with the electronic device to capture and reappear the image of the target object.

The molded circuit unit 1010F of the camera module 100 can be manufactured and formed through a manufacturing equipment 200.

Unlike the above first preferred embodiment, the molding portion 1011F has a first inner side 10117F, a second inner side 10118F, and an outer side 10119F, wherein the first inner side 10117F and the second inner side 10118F are respectively closed to form the through hole 101100F, so as to provide a light path for the photosensitive chip. In other words, the molding portion 1011F utilizes the first inner side 10117F and the second inner side 10118F to form a optical window, so as to provide a window for light to enter for the photosensitive chip. The shape of the lower opening of the optical window is decided by the surrounded shape of the first inner side 10117F. The first inner side 10117F surrounds to form the lower end of the optical window or the through hole 101100F, while the second inner side 10118F surrounds to form the upper end of the optical window or the through hole 101100F.

The first inner side 10117F is extended upward in an inclining manner that the section thereof is a trapezoid that turns larger gradually in the bottom-up approach. Namely, the sections of the lower end of the through hole 101100F or optical window are trapezoids that turn larger gradually in the bottom-up approach. The inclination of the first inner side 10117F is defined as the first inclination $\alpha$. That is to say, the included angle between the first inner side 10117F and the Y-direction of the central optic axis of the molding camera module is the first inclination $\alpha$.

According to this embodiment, the first inner side 10117F surrounds and its inside diameter gradually increased in a bottom-up manner. Namely, the inside diameter of the lower end of the optical window is gradually increased in a bottom-up manner. Of course, according to another embodiment of the present invention, the first inner side 10117F may also surrounds to form a structure which section is trapezoid-shaped. Those skilled in the art should understand that the surrounding shape of the first inner side 10117F shall not limit the present invention. The surrounding shape of the first inner side 10117F can be determined according to the shapes of the lens 50, the photosensitive chip 30, and/or the filter 40. It is worth mentioning that the pyramid shape of the section is just a approximate structure. In the actual manufacturing process, the edges and corners of the pyramid are not straightly connected acute angles, but rounded angles.

According to this embodiment of the present invention, the first inclination $\alpha$ is greater than 0°, which means that the first inner side 10117F and the direction of the central optic axis Y are not parallel. Because the central optic axis Y is perpendicular to the main circuit board 10121, the first inner side 10117F and the main circuit board 10121 are not perpendicular to each other in the embodiment of the present invention. The arrangement of the first inclination $\alpha$ is helpful for the forming and manufacturing the molding portion 1011F. In order to provide a clearer illustration, this point will be combined and described in the subsequent manufacturing process.

It is worth mentioning that the arrangement of the first inclination $\alpha$, which is the inclinate arrangement of the first inner side 10117F, reduces the incident angle of the light reached the first inner side 10117F, such that, on the other hand, the reflex angle is reduced. Hence, the reflected light will be away from the photosensitive chip 30, such that the influence of the reflected stray light of the molding portion 1011F to the imaging quality of the camera module will be reduced. Besides, the through hole 101100F or the optical window is formed by the structure with gradually increased trapezoid sections, so as to increase the light flux and therefore enhance the imaging quality of the camera module.

Further, the second inner side 10118F surroundingly forms the upper end of the optical window or the through hole 101100F. In other words, the shape of the upper end of the optical window is determined by the surrounding shape of the second inner side 10118F. The second inner side 10118F is extended upward in an inclining manner that the section thereof is a trapezoid that turns larger gradually in the bottom-up approach. In other words, the sections of the upper end of the through hole 101100F or optical window are trapezoids that turn larger gradually in the bottom-up approach. The inclination of the second inner side 10118F is defined as the second inclination $\beta$. That is to say, the included angle between the second inner side 10118F and the Y-direction of the central optic axis of the molding camera module is the second inclination $\beta$.

According to this embodiment, the second inner side 10118F surrounds to form the headless pyramid structure, which diameter is gradually increased in a bottom-up manner. That is, the upper end of the optical window is a headless pyramid structure, which diameter is gradually increased in a bottom-up manner. Of course, according to another embodiment of the present invention, the second inner side 10118F may also surrounds to form a structure which section is trapezoid-shaped, such as headless coniform, quadrangular pyramid, and etc. Those skilled in the art should understand that the surrounding shape of the second inner side 10118F shall not limit the present invention. The surrounding shape of the second inner side 10118F can be determined according to the shapes of the lens, the photosensitive unit, and/or the filter.

According to an embodiment of the present invention, the second inclination $\beta$ is greater than 0°, which means that the second inner side 10118F and the direction of the central optic axis are not parallel. Because the optic axis is perpendicular to the main circuit board 10121, the second inner side 10118F and the main circuit board 10121 are not perpendicular to each other in the embodiment of the present invention. The arrangement of the second inclination $\beta$ is helpful for the forming and manufacturing the molding body. In order to provide a clearer illustration, this point will be combined and described in the subsequent manufacturing process.

Further, the molding body comprises a outer side 10119F, surrounding around the outer side of the optical window. The outer side 10119F is extended upward from the main circuit board 10121 in an inclining manner that the section thereof becomes a trapezoid that turns smaller gradually in the bottom-up approach. The inclination of the outer side 10119F is defined as the third inclination $\gamma$. That is to say, the included angle between the outer side 10119F and the Y-direction of the central optic axis of the molding camera module is the third inclination $\gamma$.

According to this embodiment of the present invention, the third inclination $\gamma$ is greater than 0°, which means that the outer side 10119F and the direction of the central optic axis are not parallel. Because the optic axis is perpendicular to the main circuit board 10121, the outer side 10119F and the main circuit board 10121 are not perpendicular to each other in the embodiment of the present invention. The arrangement of the third inclination $\gamma$ is helpful for the forming and manufacturing the molding body. In order to provide a clearer illustration, this point will be combined and described in the subsequent manufacturing process.

For example but not to be limited, the preferred range of the first inclination $\alpha$ is 3°~85°. The preferred range of the second inclination $\beta$ is 3°~45°. The preferred range of the third inclination $\gamma$ is 3°~45°.

In this embodiment of the present invention, the range of the first inclination $\alpha$ is 3°~45°, wherein in some embodiments, it may be 3°~15°, 15°~20°, 20°~30° or 45°~60°. The range of the second inclination $\beta$ is 3°~45°, wherein in some embodiments, it may be 3°~15°, 15°~30° or 30°~45°. The range of the third inclination $\gamma$ is 3°~45°, wherein in some embodiments, it may be 3°~15°, 15°~20° or 20°~30°.

It is worth mentioning that, according to this embodiment of the present invention, the first inner side 10117F, the first top side, the second inner side 10118F, the second top side, and the outer side 10119F form a two-step trapezoid step structure, for mounting different components respectively. Nevertheless, according to other embodiment of the present invention, it may have more or less steps. For instance, it may only have the first inner side 10117F, the second inner side 10118F, and the outer side 10119F to form a one-step step. Perhaps it may additionally has a top side and a inner side on top thereof, so as to form a three-step step. Hence, those skilled in the art should understand that the quantity of the inner side, the top side, and the outer side 10119F and the quantity of the step being formed shall not limit the present invention.

It is also worth mentioning that the first inner side 10117F, the first top side, the second inner side 10118F, the second top side, and the outer side 10119F are closed structure respectively, so as for the molding camera module to provide a sealed internal environment. When the lens 1050 or the motor 1060 and the lens 50 are mounted above the molded circuit unit, it makes a sealed internal environment for the photosensitive chip 1030, which is isolated from the interference of external light.

Figure 54A:
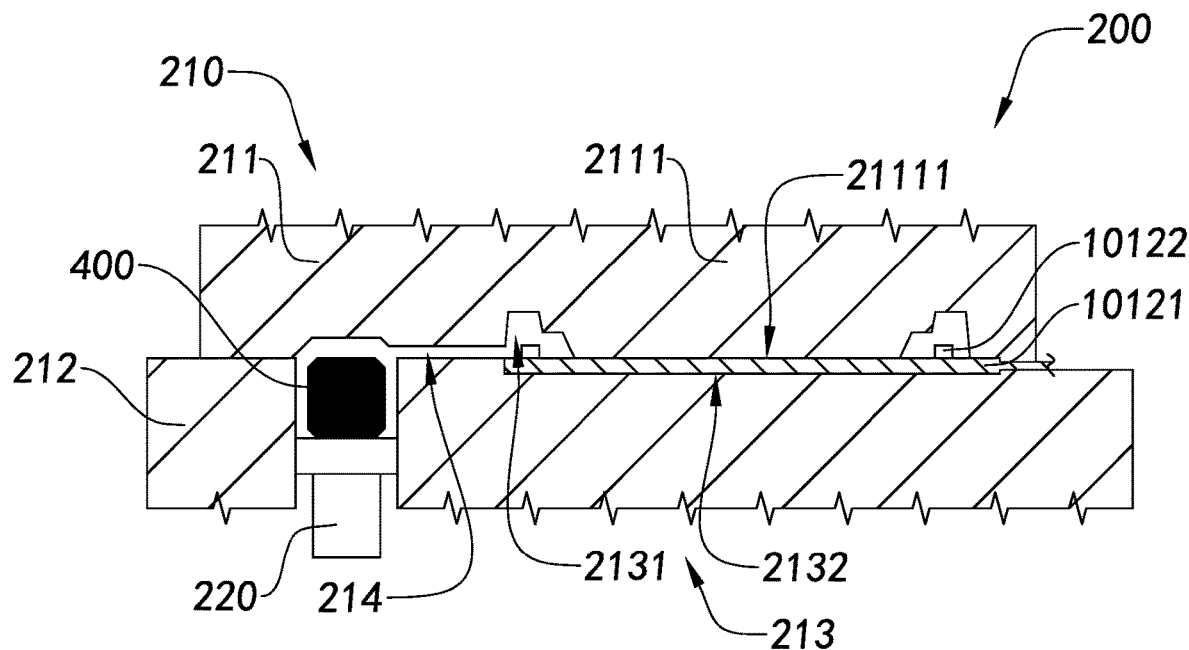
FIGS. 54A and 54B are perspective views illustrating the manufacturing process of a molded circuit unit according to the above 25th preferred embodiment of the present invention.
Figure 54B:
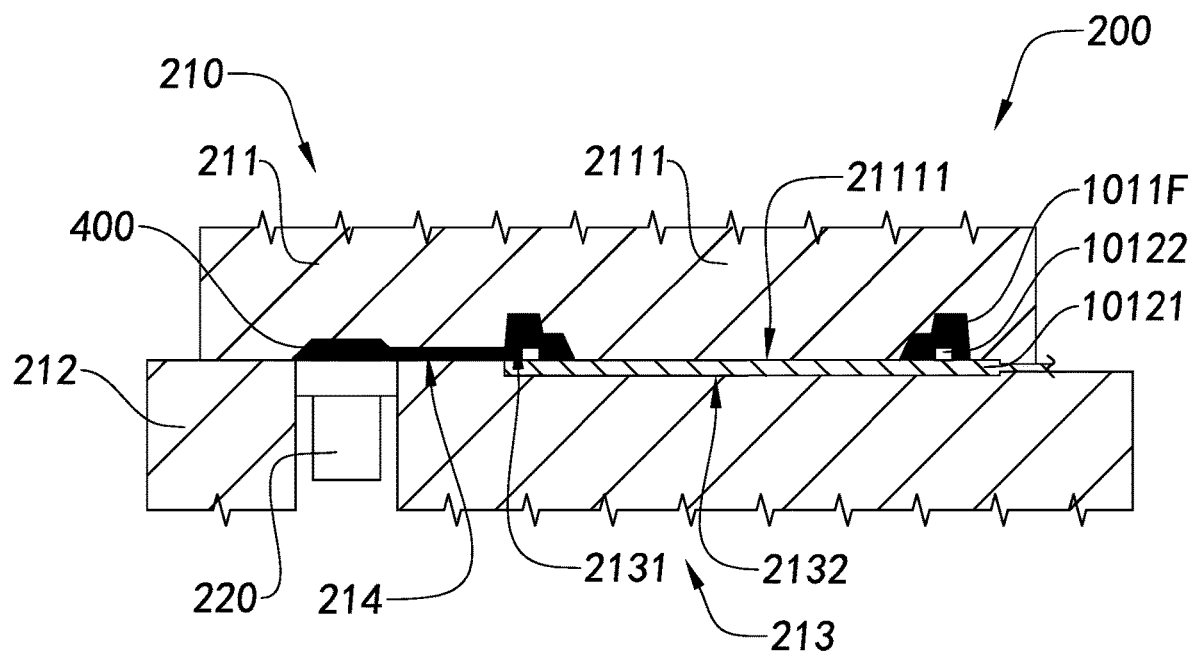

FIGS. 54A and 54B illustrate the manufacturing equipment and manufacturing process of the molded circuit unit of the molding camera module according to the above first preferred embodiment of the present invention. The manufacturing equipment 200 is for manufacturing the molded circuit unit 1010F. Further, it is to produce the molded circuit unit 1010F through molding.

The manufacturing equipment 200 of the molded circuit unit 1010F comprises a forming mold 210 and a feeding mechanism 220. The feeding mechanism 220 is for providing molding material 400 to the forming mold 210, so as to conduct the molding process through the forming mold 210. The molding material 400 can be selected from nylon, LCP (Liquid Crystal Polymer), PP (Polypropylene), epoxy resin, and etc.

The forming mold 210 comprises a first mold 211 and a second mold 212, wherein the first mold 211 and the second mold 212 can conduct mold opening and mold clamping. In other words, the forming mold 210 has two states: the opening state and the clamping state.

According to this embodiment, the forming mold 210 can utilized a mounting device to control the opening and clamping of the first mold 211 and the second mold 212. Referring to FIGS. 54A and 54B, when the forming mold 210 is in the clamping state, the first mold 211 and the second mold 212 form a forming chamber 213 and a feeding channel 214, wherein the feeding channel 214 communicates the forming chamber 213. The forming chamber 213 is for accommodating the circuit board part 1012F. The feeding channel 214 is for feeding and supplying the molding material 400 into the forming chamber 213, so as to conduct the molding process at the predetermined position and area on the circuit board part 1012F. In other words, the circuit board part 1012F is placed in the second mold 212 when the forming mold 210 is in the opening state. Then, the forming mold 210 is turned into the clamping state. Next, it utilizes the feeding mechanism to act on the molding material 400, such as through high pressure and etc., so as to supply and feed the molding material 400 into the forming chamber 213 via the feeding channel 214. By filling the molding material 400 into the remaining space of the forming chamber 213, the molding portion 1011F can be formed.

The first mold 211 comprises a optical window molding block 2111, which is for partitioning the molding material 400, such that the molding material 400 can form the hollow through hole 101100F or optical window along the optical window molding block 2111.

The first mold 211 comprises a plurality of forming sides, respectively provided at the position corresponding to the first inclination α, the second inclination β, and the third inclination γ for the molding portion 1011F, so as to respectively form the first inner side 10117F, the second inner side 10118F, and the outer side 10119F.

Further, the optical window molding block 2111 comprises a press fitting side 21111. During the moldingly forming process, the press fitting side 21111 press fits on the circuit board part 1012F, such that the molding material 400 will not be filled in the area corresponding to the press fitting side 21111 on the circuit board part 1012F, so as to form the optical window that communicates the circuit board part 1012F.

Further, the forming chamber 213 comprises a filling part 2131 and an accommodating part 2132. The filling part 2131 is for filling the molding material 400, while the accommodating part 2132 is for accommodating the main circuit board 10121. According to an embodiment of the present invention, the filling part 2131 is provided in the first mold 211, while the accommodating part 2132 is provided in the second mold 212 In other words, during the forming process, the main circuit board 10121 is placed in the accommodating part 2132 of the second mold 212 and the molding material 400 is filled into the space of the filling part 2131 encircled and created by the main circuit board 10121 and the first mold 211, so as to moldingly form the molding portion 1011F on the top side of the circuit board part 1012F.

It is worth mentioning that the circuit board part 1012F has the circuit element 10122F. In other words, when the main circuit board 10121 is placed in the accommodating part 2132 of the forming chamber 213, the circuit element 10122F will be accommodated in the filling part 2131. When the molding material 400 is filled into the filling part 2131 of the forming chamber 213, the circuit element 10122F will be wrapped and covered by the molding material 400.

Figure 55:
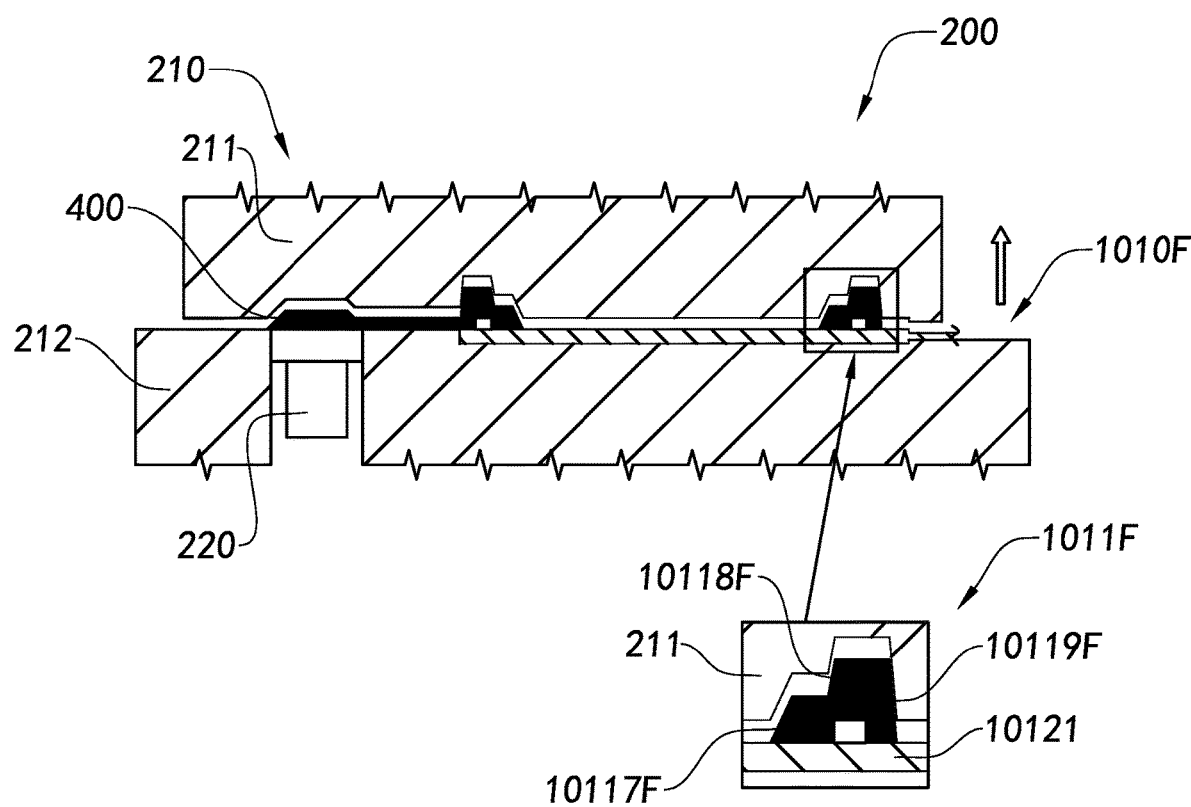
FIG. 55 a perspective view illustrating the demolding process of a molded circuit unit according to the above 25th preferred embodiment of the present invention.

It is understandable that the setting of the first inclination α, the second inclination β, and the third inclination γ reduces the friction between the molding portion 1011F and the first mold 211 when the first mold 211 and the second mold 212 are separating during the demolding process, such that the first mold 211 can withdraw from the molding portion 1011F more easily, which helps the molding portion 1011F to achieve a better forming condition. Referring to FIG. 55, more specifically, the optical window molding block 2111 and the molding portion 1011F will conduct a relative movement at the demolding instant and immediately create a gap therebetween during the demolding process. Therefore, the optical window molding block 2111 and the molding portion 1011F can then be smoothly separated because there will be no friction rendered by contact therebetween in the subsequent relative movement.

Figure 56:
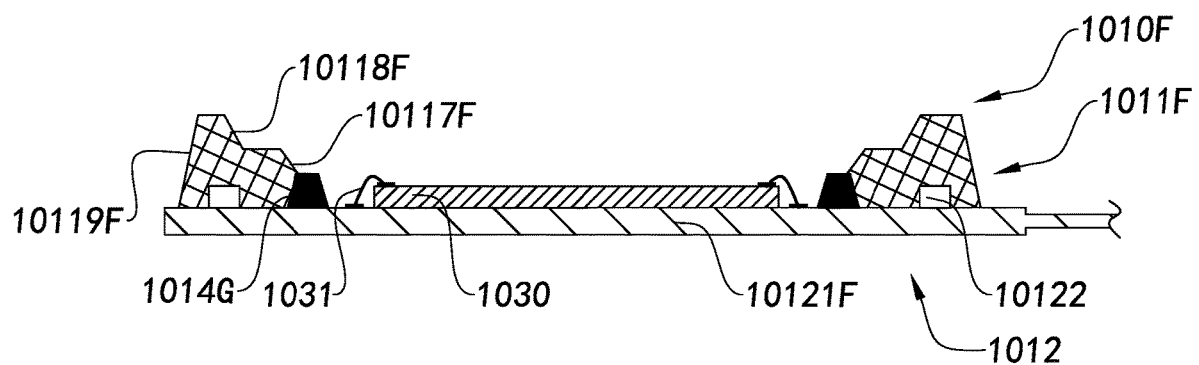
FIG. 56 illustrates an alternative mode of the molded circuit unit according to the above 25th preferred embodiment of the present invention.

Referring to FIG. 56, according to an alternative mode of the above 25th preferred embodiment of the present invention, the photosensitive chip 1030 can be connected with the main circuit board 10121F through the lead wire 1031 before the molding process. In addition, the main circuit board 10121F may comprise a ring-shaped barrier component 1014G attached or applied thereon, which has elasticity and is higher than the highest point of the lead wire 1031, so as to prevent the photosensitive chip 1030 and the lead wire 1031 of the main circuit board 10121F from being damaged by the optical window molding block 214 when the optical window molding block 2111 press fits on the barrier component 1014G during the molding process. According to an embodiment, the barrier component 1014G is square-ring shaped and is embodied as a step colloid. In other words, the barrier component is at least partially packaged by the molding portion, so as to partition between at least part of the molding portion 1011F and the main circuit board 10121F.

Figure 57:
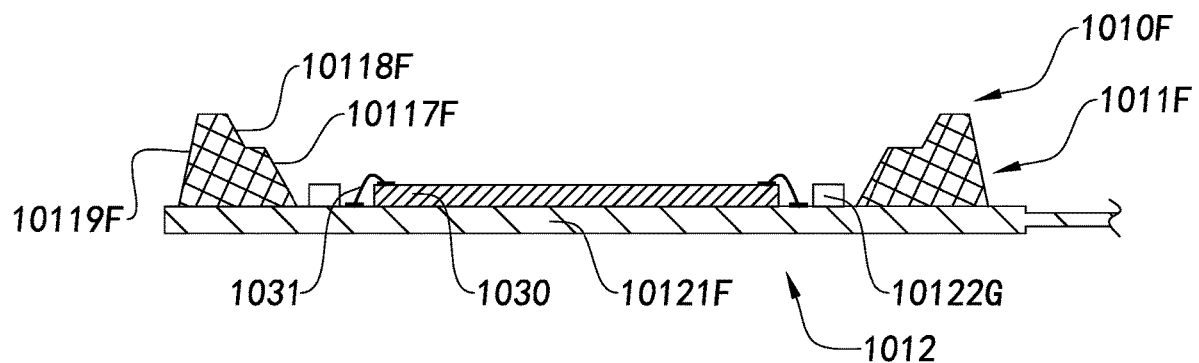
FIG. 57 illustrates another alternative mode of the molded circuit unit according to the above 25th preferred embodiment of the present invention.
Figure 58:
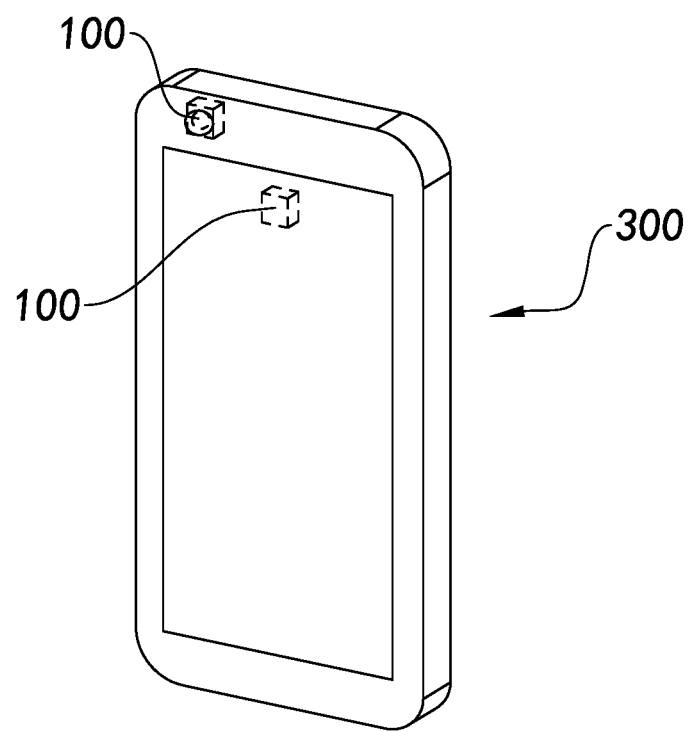
FIG. 58 is an application diagram of a camera module according to the above 25th preferred embodiment of the present invention.

FIG. 57 illustrates another implementation according to the above 25th preferred embodiment of the present invention. Unlike the above preferred embodiment, the circuit board part 1012F comprises at least a circuit element 10122G, arranged on the main circuit board 10121. The circuit element 10122G is protruded from the main circuit board 10121 and provided on the inner side of the molding portion 1011F. In other words, the circuit element 10122G is located in the through hole 101100F. That is to say, the circuit element 10122G is not molded by the molding portion 1011F. In the moldingly forming process, the optical window molding block of the forming mold has an inner groove, such that when it covers on the circuit element 10122G, it can form a molding portion 1011F that does not wrap and cover the circuit element 10122G. Certainly, according to another embodiment of the present invention, there may also be circuit element 10122F being molded. That is to say, part of the circuit element 10122F is molded, while the other part of the circuit element 10122G is not wrapped and covered.

Figure 59:
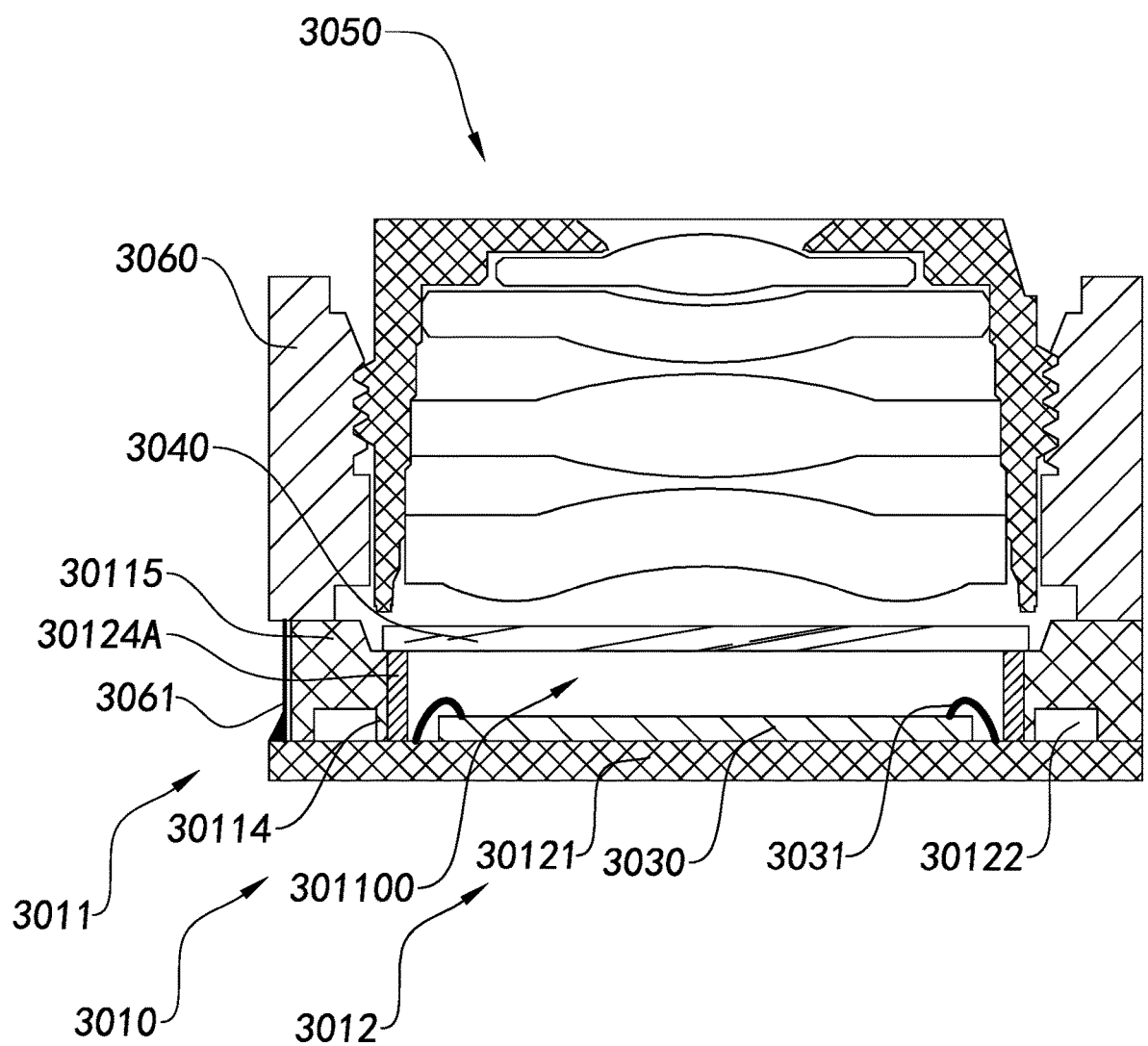
FIG. 59 refers to an alternative mode of the camera module according to the above 21st preferred embodiment of the present invention.

FIG. 59 illustrates an alternative mode of the integral base component and the camera module according to the above 21st preferred embodiment of the present invention. Unlike the above preferred embodiment, the integral base component 3010 comprises a shielding layer 30124A, surroundingly arranged on the inner side of the base part 3011, so as to not only reinforce the structural strength of the main circuit board 30121, but also enhance the anti-electromagnetic interference ability of the integral base component 3010. The shielding layer 30124A can be a metal net or metal plate.

Those skilled in the art should understand that the structures of the molding portion, the base part, and the packaging part according to different embodiments of the present invention can also be rearranged and combined with various structures and features of the camera module according to other embodiment thereof. The above preferred embodiments are examples for illustrating various implementations that the present invention may achieve, while the structures and features illustrated in different embodiments may also be rearranged and combined to construct new implementations. Hence, the present invention shall not be limited in the implementations illustrated in the drawings nor be limited in any embodiment itself.

Those skilled in the art shall understand that the above mentioned embodiments of the present invention in the descriptions and figures are to give examples, but to confine the present invention. Objectives of the present invention are completely and effectively implemented. Notions of the functions and structures of the present invention have been shown and described in the embodiments, whereas implementations of the present invention may have modifications or changes in any ways without going against the above notions.

One skilled in the art will understand that the embodiment of the present invention as shown in the drawings and described above is exemplary only and not intended to be limiting.

It will thus be seen that the objects of the present invention have been fully and effectively accomplished. The embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. A camera module, comprising
at least a lens;
at least a photosensitive chip;
at least a filter;
at least an integral base component;
at least a motor; and
at least a support,
wherein said integral base component comprises a base part and a circuit board part, wherein said base part is integrally packaged in said circuit board part, wherein said photosensitive chip is mounted on said circuit board part, wherein said base part has at least a through hole formed thereon to provide a light path for said photosensitive chip, wherein said lens is arranged along the light path of said photosensitive chip, wherein said support is mounted on said base part, wherein said filter is mounted on said support and along the light path of said photosensitive chip, wherein said base part has a flat extended top surface, wherein said lens is installed on said motor, and wherein said motor is installed on said top surface of said base part.

2. The camera module, as recited in claim 1, wherein said support has a first support groove arranged on the top side thereof and a second support groove arranged on the bottom side thereof, for coupling with the top of said base part, wherein said first support groove is communicated with said through hole, wherein said filter is mounted on said first support groove.

3. The camera module, as recited in claim 1, wherein said lens is, at least partially, mounted on said support.

4. A camera module, comprising:
at least a lens;
at least a photosensitive chip;
at least an integral base component, wherein said integral base component comprises a base part and a circuit board part, wherein said base part is molded on said circuit board part, wherein said base comprises at least a through hole formed thereon, for providing a light path for said photosensitive chip and said lens; and
at least a motor, wherein said base part has a flat extended top surface, wherein said lens is installed on said motor, and wherein said motor is installed on said top surface of said base part.

5. The camera module, as recited in claim 4, wherein said base part has a mounting groove arranged thereon, wherein said mounting groove is communicated with said through hole, wherein said base part comprises at least a protruding step, forming said mounting groove.

6. The camera module, as recited in claim 5, further comprising at least a filter, arranged in said mounting groove.

7. The camera module, as recited in claim 4 wherein said circuit board part comprises at least a side, wherein said base part wraps and covers the at least one said side of said circuit board part.

8. The camera module, as recited in claim 4, wherein said base part further wraps and covers the bottom of said circuit board part.

9. The camera module, as recited in claim 4, wherein said integral base component comprises at least a circuit element, wrapped and covered by said base part.

10. The camera module, as recited in claim 4, wherein said circuit board part has a reinforcing hold, wherein said base part extends into said reinforcing hold.

11. The camera module, as recited in claim 4, wherein said circuit board part comprises a reinforced layer, overlappingly arranged on the bottom of said circuit board part.

12. The camera module, as recited in claim 4, wherein said circuit board part comprises a shielding layer, wrapping and covering on the outside of said camera module.

13. The camera module, as recited in claim 4, wherein said circuit board part comprises a shielding layer, surroundingly provided on the inner side of said base part.

14. An integral base component, comprising:
a base part;
a circuit board part, wherein said base part is integrally packaged in said circuit board part, wherein a photosensitive chip of said camera module is adaptable for being mounted on said circuit board part, wherein said base part has at least a through hole formed thereon to provide a light path for said photosensitive chip, wherein said lens is arranged along the light path of said photosensitive chip; and
a motor connection member, preinstalled on said base part to allow said motor to be electrically connected with said circuit board part therethrough, wherein a motor of the camera module is adapted to be electrically connected with said circuit board part through said motor connection member.

15. The integral base component, as recited in claim 14, wherein said base part further wraps and covers the bottom of said circuit board part.

16. The integral base component, as recited in claim 14, wherein said integral base component comprises at least a circuit element, wrapped and covered by said base part.

17. The integral base component, as recited in claim 14, wherein said base part has at least a first inner side provided thereon surroundingly forming at least part of said through hole, wherein said first inner side extends upward from said circuit board part in an inclining manner.

18. The integral base component, as recited in claim 17, wherein said base part has a second inner side provided thereon foldingly extended from said first inner side, wherein said second inner side surroundingly forms the upper end of said through hole, wherein said second inner side extends upward in an inclining manner.

\* \* \* \* \*